(12) United States Patent
Nakagawa et al.

(10) Patent No.: US 9,939,729 B2
(45) Date of Patent: Apr. 10, 2018

(54) RESIST PATTERN-FORMING METHOD

(71) Applicant: JSR CORPORATION, Tokyo (JP)

(72) Inventors: Hisashi Nakagawa, Tokyo (JP);
Takehiko Naruoka, Tokyo (JP);
Tomoki Nagai, Tokyo (JP)

(73) Assignee: JSR CORPORATION, Tokyo (JP)

(*) Notice: Subject to any disclaimer, the term of this patent is extended or adjusted under 35 U.S.C. 154(b) by 0 days.

(21) Appl. No.: 15/259,160

(22) Filed: Sep. 8, 2016

(65) Prior Publication Data
US 2017/0075224 A1    Mar. 16, 2017

(30) Foreign Application Priority Data
Sep. 10, 2015    (JP) .................... 2015-178978

(51) Int. Cl.
| | | |
|---|---|---|
| G03F 7/20 | (2006.01) | |
| G03F 7/30 | (2006.01) | |
| G03F 7/40 | (2006.01) | |
| G03F 7/038 | (2006.01) | |
| G03F 7/004 | (2006.01) | |
| G03F 7/11 | (2006.01) | |
| C08F 220/28 | (2006.01) | |
| C08F 220/38 | (2006.01) | |
| C08F 220/18 | (2006.01) | |
| G03F 7/16 | (2006.01) | |
| G03F 7/32 | (2006.01) | |

(52) U.S. Cl.
CPC .......... G03F 7/203 (2013.01); C08F 220/18 (2013.01); C08F 220/28 (2013.01); C08F 220/38 (2013.01); G03F 7/0045 (2013.01); G03F 7/0382 (2013.01); G03F 7/11 (2013.01); G03F 7/162 (2013.01); G03F 7/2004 (2013.01); G03F 7/2037 (2013.01); G03F 7/322 (2013.01); G03F 7/325 (2013.01); C08F 2220/283 (2013.01); C08F 2220/382 (2013.01)

(58) Field of Classification Search
CPC ...... G03F 7/203; G03F 7/0045; G03F 7/0382; G03F 7/11; G03F 7/162; G03F 7/2037; G03F 7/322; G03F 7/325; G03F 7/2004; C08F 220/18; C08F 220/28; C08F 220/38
USPC ................ 430/296, 328, 330, 331, 394, 942
See application file for complete search history.

(56) References Cited

U.S. PATENT DOCUMENTS

| | | |
|---|---|---|
| 2006/0269879 A1 | 11/2006 | Elian et al. |
| 2016/0004160 A1 | 1/2016 | Tagawa et al. |
| 2016/0357103 A1 | 12/2016 | Nagahara et al. |

FOREIGN PATENT DOCUMENTS

| | | | |
|---|---|---|---|
| EP | 0 622 682 A1 | 11/1994 | |
| JP | H04-151156 A | 5/1992 | |
| JP | H04-162040 A | 6/1992 | |
| JP | H05-005995 A | 1/1993 | |
| JP | H05-197148 A | 8/1993 | |
| JP | H06-194834 A | 7/1994 | |
| JP | H08-146608 A | 6/1996 | |
| JP | H10-083079 A | 3/1998 | |
| JP | 2002-174894 A | 6/2002 | |
| JP | 2006-227632 A | 8/2006 | |
| JP | 2008-543033 A | 11/2008 | |
| JP | 2009-134088 A | 6/2009 | |
| JP | 2015-061831 A | 4/2015 | |
| JP | 2015-078366 A | 4/2015 | |
| JP | 2015-098471 A | 5/2015 | |
| JP | 2015-134904 A | 7/2015 | |
| JP | 2015-187252 A | 10/2015 | |
| WO | WO 2005/069076 A1 | 7/2005 | |
| WO | WO 2006/035790 A1 | 4/2006 | |
| WO | WO 2006/125509 A2 | 11/2006 | |
| WO | WO 2011/086389 A1 | 7/2011 | |
| WO | WO 2014/129556 A1 | 8/2014 | |
| WO | WO 2014/185065 A1 | 11/2014 | |
| WO | WO 2014/208076 A1 | 12/2014 | |
| WO | WO 2014/208102 A1 | 12/2014 | |

(Continued)

OTHER PUBLICATIONS

S. Tagawa et al., "Super High Sensitivity Enhancement by Photo-Sensitized Chemically Amplified Resist (PS-CAR) Process", Journal of Photopolymer Science and Technology, vol. 26, No. 6 (2013), pp. 825-830.

*Primary Examiner* — Christopher G Young
(74) *Attorney, Agent, or Firm* — Oblon, McClelland, Maier & Neustadt, L.L.P.

(57) ABSTRACT

A resist pattern-forming method comprises applying a chemically amplified resist material on a substrate to form a resist film on the substrate. The resist film is patternwise exposed to a radioactive ray having a wavelength of no greater than 250 nm. The resist film patternwise exposed is floodwise exposed to a radioactive ray having a wavelength of greater than 250 nm. The resist film floodwise exposed is baked and developed with a developer solution comprising an organic solvent. The chemically amplified resist material comprises a component that is capable of generating a radiation-sensitive sensitizer and an acid upon an exposure. The component comprises: a radiation-sensitive sensitizer generating agent, and at least one of a radiation-sensitive acid-and-sensitizer generating agent and a radiation-sensitive acid generating agent. The radiation-sensitive sensitizer generating agent comprises a compound represented by formula (B).

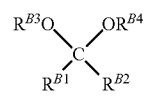

(B)

10 Claims, 1 Drawing Sheet

(56) References Cited

FOREIGN PATENT DOCUMENTS

| WO | WO 2014/208103 A1 | 12/2014 |
| WO | WO 2014/208104 A1 | 12/2014 |
| WO | WO 2015/019616 A1 | 2/2015 |
| WO | WO 2015/022779 A1 | 2/2015 |
| WO | WO 2015/049871 A1 | 4/2015 |
| WO | WO 2015/052914 A1 | 4/2015 |
| WO | WO 2015/125788 A | 8/2015 |

RESIST PATTERN-FORMING METHOD

CROSS-REFERENCE TO RELATED APPLICATIONS

The present application claims priority to Japanese Patent Application No. 2015-178978, filed Sep. 10, 2015, the contents of which are incorporated herein by reference in their entirety.

BACKGROUND OF THE INVENTION

Field of the Invention
The present invention relates to a resist pattern-forming method.
Discussion of the Background
EUV (extreme-ultraviolet) lithography attracts attention as one of element technologies for manufacture of the next generation of semiconductor devices. The EUV lithography is a pattern formation technology in which EUV light having a wavelength of 13.5 nm is utilized as an exposure light. It is demonstrated that the EUV lithography enables an extremely fine pattern (no greater than 20 nm, for example) to be formed in an exposure step of a manufacture process of the semiconductor devices.

However, since hitherto-developed EUV light sources have low power, the exposure treatment requires a long time period. Thus, the EUV lithography has a disadvantage of being inferior in practical use. To overcome this disadvantage, a technique for increasing the sensitivity of a resist material which is a photosensitive resin has been developed (see Japanese Unexamined Patent Application, Publication No. 2002-174894).

However, generally, the resist material is disadvantageous in that when the sensitivity to the EUV light is improved, the lithography performances thereof, such as nanoedge roughness, are likely to be deteriorated. This similarly applies to the case of the use of an electron beam and the like as an irradiating light.

SUMMARY OF THE INVENTION

According to one aspect of the present invention, a resist pattern-forming method comprises applying a chemically amplified resist material on a substrate to form a resist film on the substrate. The resist film is patternwise exposed to a radioactive ray having a wavelength of no greater than 250 nm. The resist film patternwise exposed is floodwise exposed to a radioactive ray having a wavelength of greater than 250 nm. The resist film floodwise exposed is baked. The resist film baked is developed with a developer solution comprising an organic solvent as a principal component. The chemically amplified resist material comprises a polymer component that is capable of being made insoluble in the developer solution by an action of an acid, and a component that is capable of generating a radiation-sensitive sensitizer and an acid upon an exposure. The component comprises: a radiation-sensitive sensitizer generating agent, and at least one of a radiation-sensitive acid-and-sensitizer generating agent and a radiation-sensitive acid generating agent. The radiation-sensitive acid-and-sensitizer generating agent is capable of generating, upon the exposure to the radioactive ray in the patternwise exposing of the resist film, an acid, and a radiation-sensitive sensitizer absorbing the radioactive ray in the floodwise exposing of the resist film, and substantially does not generate the acid and the radiation-sensitive sensitizer in the floodwise exposing of the resist film, in regions light-unexposed in the patternwise exposing of the resist film. The radiation-sensitive sensitizer generating agent is capable of generating, upon the exposure to the radioactive ray in the patternwise exposing of the resist film, a radiation-sensitive sensitizer absorbing the radioactive ray in the floodwise exposing of the resist film, and substantially does not generate the radiation-sensitive sensitizer in the floodwise exposing of the resist film, in regions light-unexposed in the patternwise exposing of the resist film. The radiation-sensitive acid generating agent is capable of generating an acid upon the exposure to the radioactive ray in the patternwise exposing of the resist film, and substantially does not generate the acid in the floodwise exposing of the resist film, in regions light-unexposed in the patternwise exposing of the resist film. The radiation-sensitive sensitizer generating agent comprises a compound represented by formula (B).

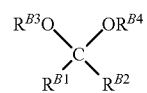

(B)

In the formula (B), $R^{B1}$ and $R^{B2}$ each independently represent a hydrogen atom, a phenyl group, a naphthyl group, an anthracenyl group, an alkoxy group having 1 to 5 carbon atoms, an alkylthio group having 1 to 5 carbon atoms, a phenoxy group, a naphthoxy group, an anthracenoxy group, an amino group, an amide group, a saturated or unsaturated linear, branched or cyclic hydrocarbon group having 1 to 30 carbon atoms, or a carbonyl group to which an alkyl group having 1 to 12 carbon atoms bonds, wherein a part or all of hydrogen atoms included in the phenyl group, the naphthyl group, the anthracenyl group, the alkoxy group, the alkylthio group, the phenoxy group, the naphthoxy group, the anthracenoxy group or the hydrocarbon group are unsubstituted or substituted, and wherein $R^{B1}$ and $R^{B2}$ optionally taken together represent a ring structure via a single bond or a double bond, or via a bond that includes —$CH_2$—, —O—, —S—, —$SO_2$—, —$SO_2NH$—, —C(=O)—, —C(=O)O—, —NHCO—, —NHC(=O)NH—, —$CHR^g$—, —$CR^g{}_2$—, —NH— or —$NR^g$— together with the carbon atom to which $R^{B1}$ and $R^{B2}$ bond, wherein $R^g$ represents an alky group having 1 to 5 carbon atoms; and $R^{B3}$ and $R^{B4}$ represent a substituted or unsubstituted phenyl group, a halogen atom, or a saturated or unsaturated linear, branched or cyclic hydrocarbon group having 1 to 30 carbon atoms, or, optionally, at least two of carbon atoms included in the phenyl group or the hydrocarbon group bond with each other to form a ring structure together with —O—C—O— to which $R^{B3}$ and $R^{B4}$ bond.

DESCRIPTION OF THE EMBODIMENTS

Figure 1:
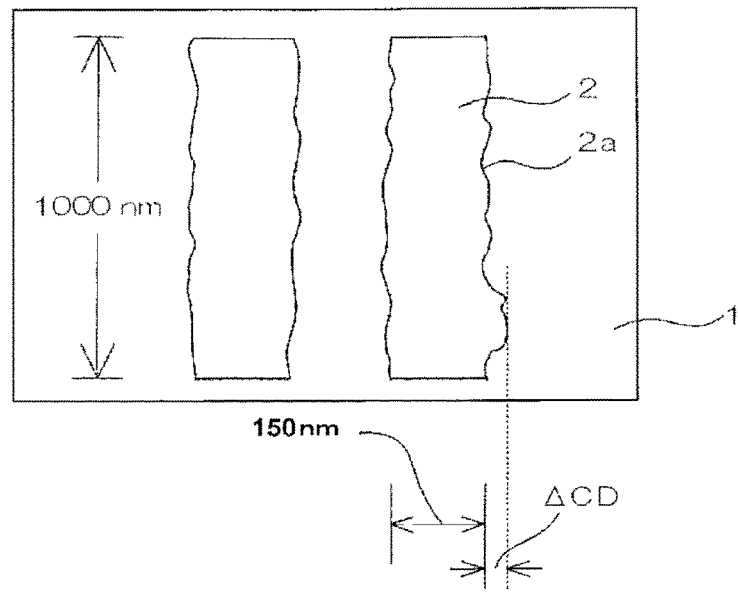
FIG. 1 shows a schematic plan view illustrating the nanoedge roughness of a pattern.

According to an embodiment of the invention made for solving the aforementioned problems, a resist pattern-forming method includes: a film-forming step of forming a resist film on a substrate using a chemically amplified resist material; a patternwise exposure step of patternwise exposing the resist film to a radioactive ray having a wavelength of no greater than 250 nm; a floodwise exposure step of floodwise exposing the resist film obtained after the patternwise exposure step to a radioactive ray having a wavelength of greater than 250 nm; a baking step of baking the resist film obtained after the floodwise exposure step; and a development step of developing the resist film obtained after the baking step with a developer solution containing an organic solvent as a principal component, wherein the chemically amplified resist material contains: (1) a polymer component that is capable of being made insoluble in the developer solution by an action of an acid; and (2) a component that is capable of generating a radiation-sensitive sensitizer and an acid upon an exposure, wherein the component (2) contains the following components (a) and (b), the following components (b) and (c), or all of the following components (a) to (c):

(a) a radiation-sensitive acid-and-sensitizer generating agent that is capable of generating, upon the exposure to the radioactive ray in the patternwise exposure step, an acid, and a radiation-sensitive sensitizer absorbing the radioactive ray in the floodwise exposure step, and substantially does not generate the acid and the radiation-sensitive sensitizer in the floodwise exposure step, in regions light-unexposed in the patternwise exposure step;

(b) a radiation-sensitive sensitizer generating agent that is capable of generating, upon the exposure to the radioactive ray in the patternwise exposure step, a radiation-sensitive sensitizer absorbing the radioactive ray in the floodwise exposure step, and substantially does not generate the radiation-sensitive sensitizer in the floodwise exposure step, in regions light-unexposed in the patternwise exposure step; and (c) a radiation-sensitive acid generating agent that is capable of generating an acid upon the exposure to the radioactive ray in the patternwise exposure step, and substantially does not generate the acid in the floodwise exposure step, in regions light-unexposed in the patternwise exposure step, and wherein the component (b) contains a compound represented by the following formula (B):

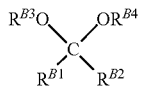

(B)

wherein, in the formula (B), $R^{B1}$ and $R^{B2}$ each independently represent a hydrogen atom, a phenyl group, a naphthyl group, an anthracenyl group, an alkoxy group having 1 to 5 carbon atoms, an alkylthio group having 1 to 5 carbon atoms, a phenoxy group, a naphthoxy group, an anthracenoxy group, an amino group, an amide group, a saturated or unsaturated linear, branched or cyclic hydrocarbon group having 1 to 30 carbon atoms, or a carbonyl group to which an alkyl group having 1 to 12 carbon atoms bonds, wherein a part or all of hydrogen atoms included in the phenyl group, the naphthyl group, the anthracenyl group, the alkoxy group, the alkylthio group, the phenoxy group, the naphthoxy group, the anthracenoxy group or the hydrocarbon group are unsubstituted or substituted, and wherein $R^{B1}$ and $R^{B2}$ may taken together represent a ring structure via a single bond or a double bond, or via a bond that includes —$CH_2$—, —O—, —S—, —$SO_2$—, —$SO_2NH$—, —C(=O)—, —C(=O) O—, —NHCO—, —NHC(=O)NH—, —$CHR^g$—, —$CR^g_2$—, —NH— or —$NR^g$— together with the carbon atom to which $R^{B1}$ and $R^{B2}$ bond, wherein $R^g$ represents an alky group having 1 to 5 carbon atoms; and $R^{B3}$ and $R^{B4}$ represent a substituted or unsubstituted phenyl group, a halogen atom, or a saturated or unsaturated linear, branched or cyclic hydrocarbon group having 1 to 30 carbon atoms, or, optionally, at least two of carbon atoms included in the phenyl group or the hydrocarbon group bond with each other to form a ring structure together with —O—C—O— to which $R^{B3}$ and $R^{B4}$ bond.

The term "principal component" as referred to herein means a component included at the greatest content on mass basis (accounting for no less than 50% by mass, for example). The phrases "substantially does not generate the acid and the radiation-sensitive sensitizer in the floodwise exposure step, in regions light-unexposed in the patternwise exposure step", "substantially does not generate the radiation-sensitive sensitizer in the floodwise exposure step, in regions light-unexposed in the patternwise exposure step" and "substantially does not generate the acid in the floodwise exposure step, in regions light-unexposed in the patternwise exposure step" as referred to mean that the acid and/or the radiation-sensitive sensitizer is/are not generated through the exposure to (or, irradiation with) a radioactive ray in the floodwise exposure step, or that even in the case where the acid and/or the radiation-sensitive sensitizer is/are generated through the exposure to (or, irradiation with) a radioactive ray in the floodwise exposure step, the amount of the acid and/or the radiation-sensitive sensitizer generated in the regions unexposed to the patterning light, i.e., the radioactive ray, in the floodwise exposure step is so small that the difference in the concentration of the acid and/or the radiation-sensitive sensitizer between the light-exposed regions and the light-unexposed regions after the patternwise exposure can be maintained at a level to permit the pattern formation, and consequently the amount of the acid or radiation-sensitive sensitizer thus generated is so small that either the patternwise exposed regions or the patternwise unexposed regions alone can be dissolved in the developer solution in the development step.

According to the resist pattern-forming method of the embodiment of the present invention, in a case where a radioactive ray having a wavelength of no greater than 250 nm such as EUV light, an electron beam, a KrF excimer laser beam and an ArF excimer laser beam is used as the patterning exposure light, high levels of the sensitivity and the lithography performances can be exhibited.

Hereinafter, embodiments of the present invention will be described in detail. It is to be noted that the present invention is not limited to the following embodiments.

Chemically Amplified Resist Material

The resist pattern-forming method according to an embodiment of the present invention principally includes: a film-forming step of forming a resist film on a substrate using a chemically amplified resist material; a patternwise exposure step of patternwise exposing the resist film to a radioactive ray having a wavelength of no greater than 250 nm (hereinafter, may be also referred to as "first radioactive ray"); a floodwise exposure step of floodwise exposing the resist film obtained after the patternwise exposure step to a radioactive ray having a wavelength of greater than 250 nm (hereinafter, may be also referred to as "second radioactive ray"); a baking step of baking the resist film obtained after the floodwise exposure step; and a development step of developing the resist film obtained after the baking step with a developer solution containing an organic solvent as a principal component.

Moreover, the resist pattern-forming method may further include, before the film-forming step, the step of forming an organic underlayer film directly or indirectly on a face of the substrate on which the resist film is to be formed, and may further include, after the organic underlayer film-forming step and before the film-forming step, the step of forming a silicon-containing film directly or indirectly on a face of the organic underlayer film on which the resist film is to be formed.

Further, the resist pattern-forming method may further include, after the patternwise exposure step and before the floodwise exposure step, the step of baking the resist film.

Moreover, the resist pattern-forming method may further include, after the development step, the step of forming a substrate pattern by using the formed resist pattern as a mask.

Organic Underlayer Film-Forming Step

In the organic underlayer film-forming step, an organic underlayer film is formed on a substrate. The term "organic underlayer film" as referred to herein means a film that contains an organic substance as a principal component.

The substrate is exemplified by conventionally well-known substrates such as silicon wafers, wafers coated with silicon dioxide or aluminum, glass substrates and ITO substrates.

The organic substance is exemplified by a polymer constituting the polymer component (1) described later, an acenaphthylene resin, and the like.

The organic underlayer film is exemplified by a film for improving adhesiveness of the resist film to the substrate, a film for ameliorating the shape of the resist pattern, an antireflective film for reducing the reflection of the radioactive ray on the substrate, and the like. The antireflective film can inhibit generation of a standing wave due to the reflection of the radioactive ray on the substrate, etc. in the patternwise exposure step. Well-known antireflective films may be used as the aforementioned antireflective film.

In addition, it is desired that the organic underlayer film does not absorb the second radioactive ray used in the floodwise exposure step. In a case where the organic underlayer film absorbs the second radioactive ray used in the floodwise exposure step, it is preferred that a buffer layer which does not propagate a radioactive ray sensitization reaction is provided between the resist film and the organic underlayer film, and thereby the sensitization from the underlayer film which has absorbed the radioactive ray is prevented. The buffer layer is exemplified by a transparent film which does not absorb the second radioactive ray.

Silicon-Containing Film-Forming Step

In the silicon-containing film-forming step, a silicon-containing film is further formed between the organic underlayer film and the resist film. The silicon-containing film is exemplified by a Spin on glass (SOG) film used in multilayer resist processes, and the like. Well-known compositions for SOG film formation can be used as the composition for forming the SOG film. Moreover, in regard to conditions for the SOG film formation, etc., well-known conditions can be suitably applied.

Film-Forming Step

In the film-forming step, the resist film is formed on the substrate using a chemically amplified resist material described later. In a case where the organic underlayer film-forming step and the silicon-containing film-forming step are not performed, the resist film is formed directly on the surface of the substrate, whereas in a case where the organic underlayer film-forming step and the silicon-containing film-forming step are performed, the resist film is formed on the surface of the silicon-containing film.

The forming procedure of the resist film is exemplified by a procedure that involves applying the chemically amplified resist material onto the substrate. The application procedure is exemplified by spin coating, cast coating, roll coating, and the like.

Moreover, after the chemically amplified resist material is applied onto the substrate, prebaking (PB) may be performed as needed to evaporate a solvent in the coating film.

In addition, a protective film may be further formed on the resist film. The formation of the protective film can inhibit the deactivation of the radiation-sensitive sensitizer and the acid which are generated in the patternwise exposure step, as well as reaction intermediates thereof, leading to an improvement of process stability.

Further, in a case where liquid immersion lithography is carried out and the chemically amplified resist material does not contain a water-repellent polymer additive such as a fluorine atom-containing compound, a protective film for liquid immersion which is insoluble in a liquid immersion liquid may be provided on the resist film formed as described above in order to inhibit direct contact of the liquid immersion liquid and the resist film. The protective film for liquid immersion is exemplified by a solvent-removable protective film which can be removed by a solvent (see Japanese Unexamined Patent Application, Publication No. 2006-227632, for example), a developer solution-removable protective film which is removed concomitantly with a development in the development step (see WO 2005-069076 and WO 2006-035790, for example), and the like. In light of throughput, the developer solution-removable protective film for liquid immersion is preferred.

Chemically Amplified Resist Material

The chemically amplified resist material according to another embodiment of the present invention contains: the polymer component (1); and (2) a component that is capable of generating a radiation-sensitive sensitizer and an acid upon an exposure. The component (2) may be incorporated into a part of a polymer constituting the polymer component (1), or may be a compound different from the polymer component (1).

Moreover, the chemically amplified resist material may contain, in addition to the polymer component (1) and the component (2), an acid diffusion control agent, a radical trapping agent, a crosslinking agent, other additive, a solvent, and the like.

(1) Polymer Component

The polymer component (1) is made insoluble in a developer solution by an action of an acid. The polymer component (1) preferably contains a first polymer (hereinafter, may be also referred to as "(A) polymer" or "polymer (A)") having a structural unit (hereinafter, may be also referred to as "structural unit (I)") that includes a group that is capable of generating a polar group through dissociation of an acid-labile group by an action of an acid (hereinafter, may be also referred to as "acid-labile group"). In addition, the polymer component (1) may further contain a polymer (hereinafter, may be also referred to as "(F) polymer" or "polymer (F)") having a greater proportion of fluorine atom contained than that of the polymer (A).

(A) Polymer

Structural Unit (I)

The structural unit (I) includes the acid-labile group. The structural unit (I) is preferably a structural unit represented by the following formula (a-1) (hereinafter, may be also referred to as "structural unit (I-1)") or a structural unit represented by the following formula (a-2) (hereinafter, may be also referred to as "structural unit (I-2)"). In the following formulae (a-1) and (a-2), the groups represented by —$CR^{42}R^{43}R^{44}$ and —$CR^{46}R^{47}R^{48}$ correspond to the acid-labile group.

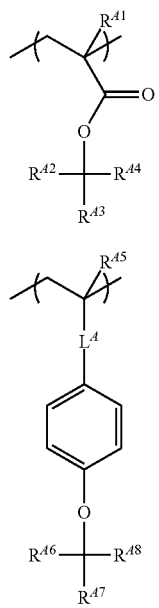

(a-1)

(a-2)

In the above formula (a-1), $R^{41}$ represents a hydrogen atom, a fluorine atom, a methyl group or a trifluoromethyl group; $R^{42}$ represents a monovalent hydrocarbon group having 1 to 20 carbon atoms; and $R^{43}$ and $R^{44}$ each independently represent a monovalent chain hydrocarbon group having 1 to 20 carbon atoms or a monovalent alicyclic hydrocarbon group having 3 to 20 carbon atoms, or $R^{43}$ and $R^{44}$ taken together represent an alicyclic structure having 3 to 20 ring atoms together with the carbon atom to which $R^{43}$ and $R^{44}$ bond.

In the formula (a-2), $R^{45}$ represents a hydrogen atom, a fluorine atom, a methyl group or a trifluoromethyl group; $R^{46}$ represents a hydrogen atom, a monovalent hydrocarbon group having 1 to 20 carbon atoms or a monovalent oxyhydrocarbon group having 1 to 20 carbon atoms; $R^{47}$ and $R^{48}$ each independently represent a monovalent hydrocarbon group having 1 to 20 carbon atoms or a monovalent oxyhydrocarbon group having 1 to 20 carbon atoms; and $L^A$ represents a single bond, —O—, —COO— or —CONH—.

The number of "ring atoms" as referred to herein means the number of atoms constituting a ring included in the alicyclic structure or the aliphatic heterocyclic structure, and in the case of polycyclic alicyclic structures and polycyclic aliphatic heterocyclic structures, the number of "ring atoms" means the number of atoms constituting the plurality of rings.

Examples of the monovalent hydrocarbon group having 1 to 20 carbon atoms which may be represented by $R^{42}$, $R^{46}$, $R^{47}$ or $R^{48}$ include:

chain hydrocarbon groups, e.g.
alkyl groups such as a methyl group, an ethyl group, a propyl group and a butyl group;

alkenyl groups such as an ethenyl group, a propenyl group and a butenyl group; and alkynyl groups such as an ethynyl group, a propynyl group and a butynyl group;

alicyclic hydrocarbon groups, e.g.
cycloalkyl groups such as a cyclopropyl group, a cyclopentyl group, a cyclohexyl group, a cyclooctyl group, a norbornyl group and an adamantyl group; and cycloalkenyl groups such as a cyclopropenyl group, a cyclopentenyl group, a cyclohexenyl group and a norbornenyl group;

aromatic hydrocarbon groups, e.g.
aryl groups such as a phenyl group, a tolyl group, a xylyl group, a naphthyl group and an anthryl group; and aralkyl groups such as a benzyl group, a phenethyl group and a naphthylmethyl group; and the like.

$R^{42}$ represents preferably a chain hydrocarbon group or a cycloalkyl group, more preferably an alkyl group or a cycloalkyl group, and still more preferably a methyl group, an ethyl group, a propyl group, a cyclopentyl group, a cyclohexyl group, a cyclooctyl group or an adamantyl group.

The monovalent chain hydrocarbon group having 1 to 20 carbon atoms which may be represented by $R^{43}$ or $R^{44}$ is exemplified by the chain monovalent hydrocarbon groups among the groups exemplified as the monovalent hydrocarbon group which may be represented by $R^{42}$, and the like.

Examples of the monovalent alicyclic hydrocarbon group having 3 to 20 carbon atoms which may be represented by $R^{43}$ or $R^{44}$ include:

saturated monocyclic hydrocarbon groups such as a cyclopropyl group, a cyclobutyl group, a cyclopentyl group, a cyclohexyl group, a cycloheptyl group, a cyclooctyl group, a cyclodecyl group and a cyclododecyl group;

unsaturated monocyclic hydrocarbon groups such as a cyclopropenyl group, a cyclobutenyl group, a cyclopentenyl group, a cyclohexenyl group, a cyclooctenyl group and a cyclodecenyl group;

saturated polycyclic hydrocarbon groups such as a bicyclo[2.2.1]heptanyl group, a bicyclo[2.2.2]octanyl group and a tricyclo[3.3.1.1$^{3,7}$]decanyl group;

unsaturated polycyclic hydrocarbon groups such as a bicyclo[2.2.1]heptenyl group and a bicyclo[2.2.2]octenyl group; and the like.

Examples of the alicyclic structure having 3 to 20 ring atoms which may be taken together represented by the groups $R^{43}$ and $R^{44}$ together with the carbon atom to which the groups $R^{43}$ and $R^{44}$ bond include:

monocyclic cycloalkane structures such as a cyclopropane structure, a cyclobutane structure, a cyclopentane structure, a cyclopentene structure, a cyclopentadiene structure, a cyclohexane structure, a cyclooctane structure and a cyclodecane structure;

polycyclic cycloalkane structures such as a norbornane structure, an adamantane structure, a tricyclodecane structure and a tetracyclododecane structure; and the like.

$R^{43}$ and $R^{44}$ represent preferably a monocyclic cycloalkane structure, a norbornane structure or an adamantane structure, which may be taken together represented by $R^{43}$ and $R^{44}$, or an alkyl group, and more preferably a methyl group, an ethyl group, a cyclopentane structure, a cyclohexane structure or an adamantane structure.

Examples of the monovalent oxyhydrocarbon group having 1 to 20 carbon atoms which may be represented by $R^{46}$, $R^{47}$ or $R^{48}$ include groups obtained by incorporating an oxygen atom between two adjacent carbon atoms of the monovalent hydrocarbon group exemplified as the monovalent hydrocarbon group having 1 to 20 carbon atoms which may be represented by $R^{A2}$, $R^{A6}$, $R^{A7}$ or $R^{A8}$, and the like.

$R^{A6}$, $R^{A7}$ and $R^{A8}$ preferably represent a chain hydrocarbon group, and an oxygen atom-containing alicyclic hydrocarbon group.

$L^A$ represents preferably a single bond or —COO—, and more preferably a single bond.

In light of the copolymerizability of a monomer that gives the structural unit (I), $R^{A1}$ represents preferably a hydrogen atom or a methyl group, and more preferably a methyl group.

In light of the copolymerizability of the monomer that gives the structural unit (I), $R^{A5}$ represents preferably a hydrogen atom or a methyl group, and more preferably a hydrogen atom.

Examples of the structural unit (I) include: structural units represented by the following formulae (a-1-a) to (a-1-d) (hereinafter, may be also referred to as "structural units (I-1-a) to (I-1-d)"); a structural unit represented by the following formula (a-2-a) (hereinafter, may be also referred to as "structural unit (I-2-a)"); and the like.

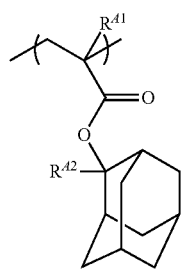

(a-1-a)

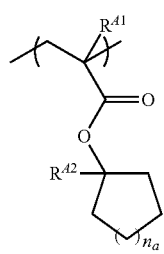

(a-1-b)

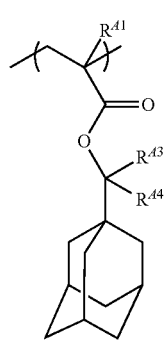

(a-1-c)

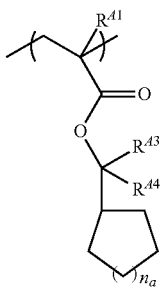

(a-1-d)

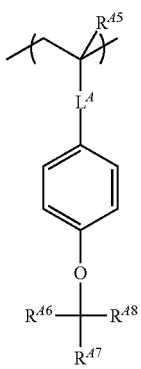

(a-2-a)

In the above formulae (a-1-a) to (a-1-d), $R^{A1}$ to $R^{A4}$ are as defined in the above formula (a-1); and $n_a$ is an integer of 1 to 4. In the above formula (a-2-a), $R^{A5}$ to $R^{A8}$ are as defined in the above formula (a-2).

In the above formulae (a-1-b) and (a-1-d), $n_a$ is preferably 1, 2 or 4, and more preferably 1.

Examples of the structural unit (I) include structural units represented by the following formulae, and the like.

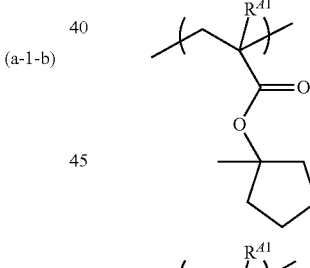 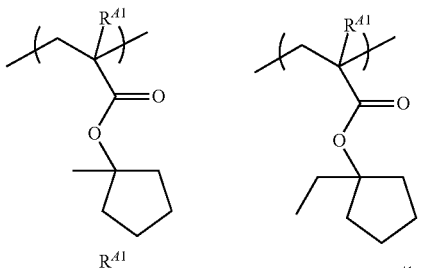

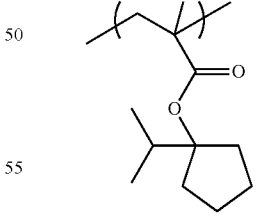 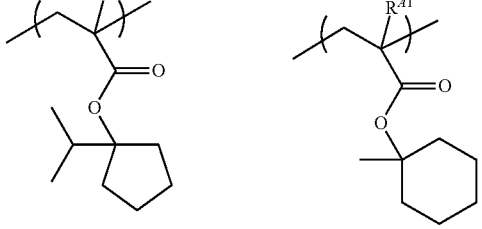

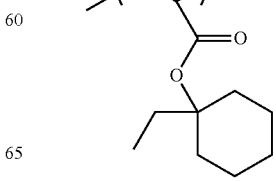 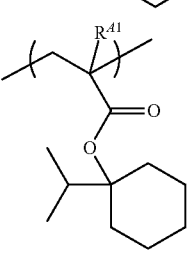

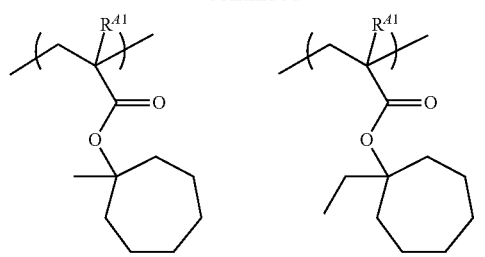
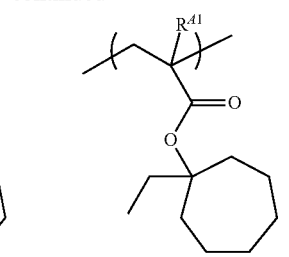
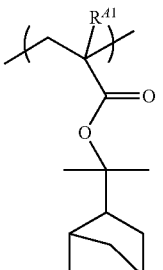
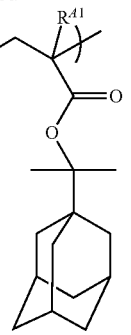
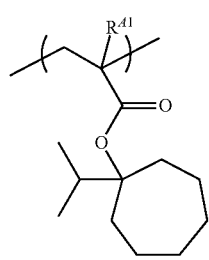
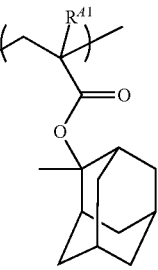
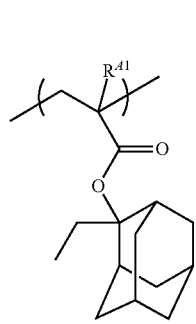
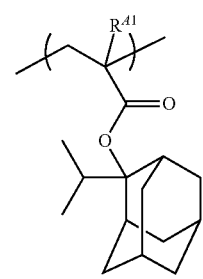
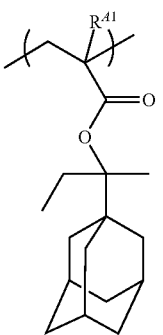
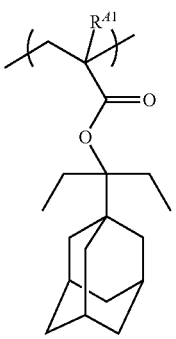
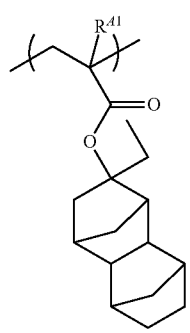
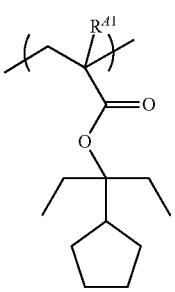
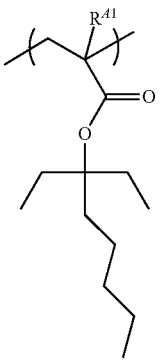
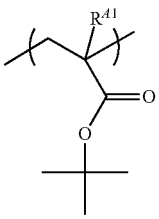
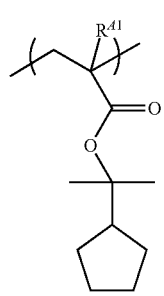
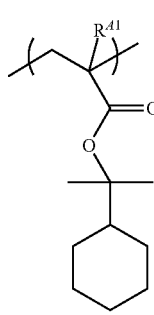
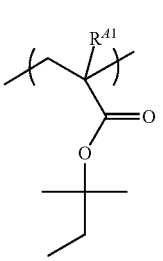
In the above formulae, $R^{A1}$ is as defined in the above formula (a-1).
Examples of the structural unit (I-2) include structural units represented by the following formulae, and the like.

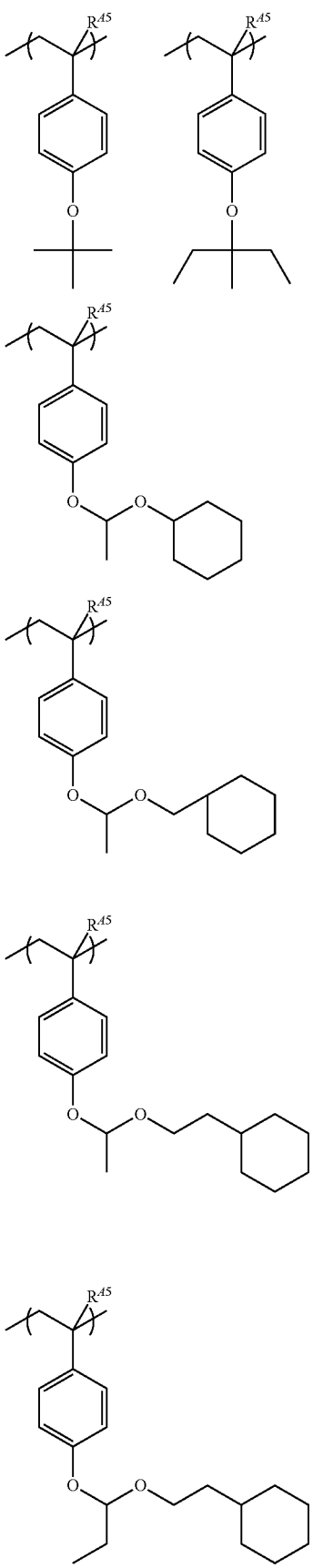

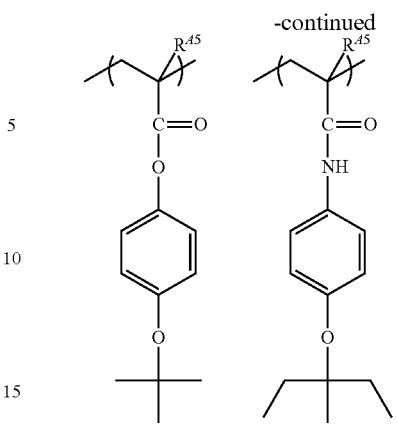

-continued

In the above formulae, $R^{A5}$ is as defined in the above formula (a-2).

As the structural unit (I), structural units (I-1-a) to (I-1-d) are preferred, and a structural unit derived from 2-methyl-2-adamantyl (meth)acrylate, a structural unit derived from 2-i-propyl-2-adamantyl (meth)acrylate, a structural unit derived from 1-methyl-1-cyclopentyl (meth)acrylate, a structural unit derived from 1-ethyl-1-cyclohexyl (meth)acrylate, a structural unit derived from 1-i-propyl-1-cyclopentyl (meth)acrylate, a structural unit derived from 2-cyclohexylpropan-2-yl (meth)acrylate, and a structural unit derived from 2-(adamantan-1-yl)propan-2-yl (meth)acrylate are more preferred.

The lower limit of the proportion of the structural unit (I) with respect to the total structural units constituting the polymer (A) is preferably 10 mol %, more preferably 20 mol %, still more preferably 25 mol %, and particularly preferably 30 mol %. On the other hand, the upper limit of the proportion of the structural unit (I) is preferably 80 mol %, more preferably 70 mol %, still more preferably 65 mol %, and particularly preferably 60 mol %. When the proportion of the structural unit (I) falls within the above range, a contrast in terms of dissolution in the developer solution between the light-exposed regions and the light-unexposed regions of the resist film formed from the chemically amplified resist material can be sufficiently established, and consequently the resolution and the like may be improved.

Structural Unit (II)

The structural unit (II) is a structural unit that includes a lactone structure, a cyclic carbonate structure, a sultone structure or a combination thereof. When the polymer (A) further has the structural unit (II) in addition to the structural unit (I), adequate polarity of the polymer (A) may be attained. Consequently, the chemically amplified resist material can produce a resist pattern that is finer and more superior in rectangularity of cross-sectional shape. The lactone structure as referred to herein means a structure which has one ring including a group represented by —O—C(O)— (lactone ring). Moreover, the cyclic carbonate structure as referred to means a structure which has one ring including a group represented by —O—C(O)—O— (cyclic carbonate ring). The sultone structure as referred to means a structure which has one ring including a group represented by —O—S(O)$_2$— (sultone ring).

Examples of the structural unit (II) include structural units represented by the following formulae, and the like.

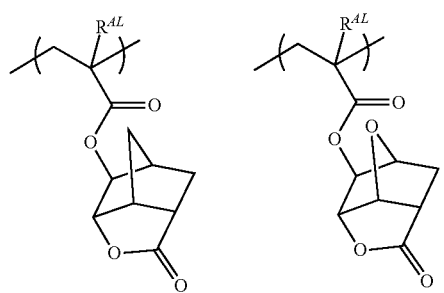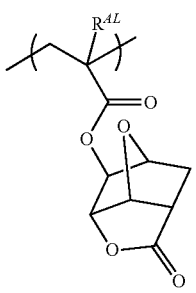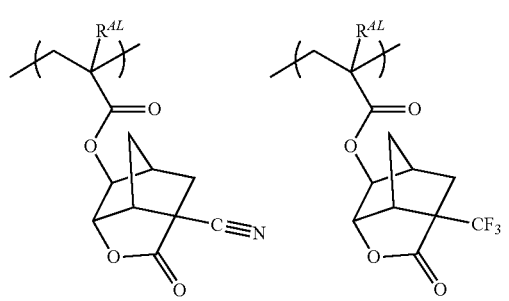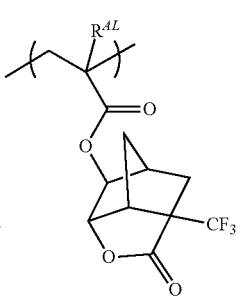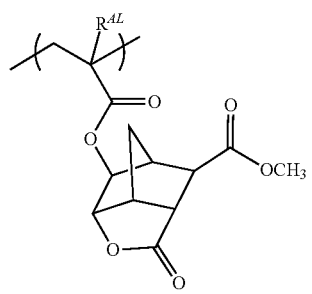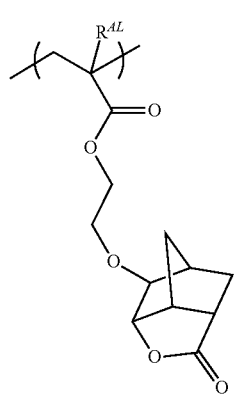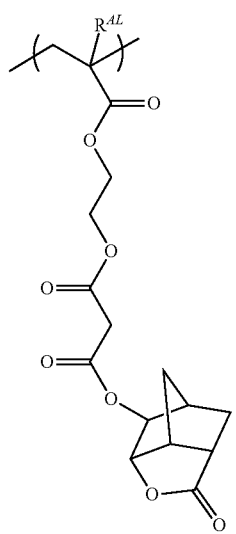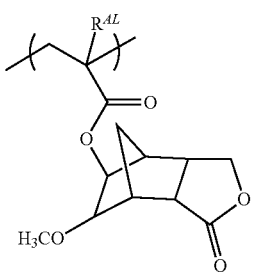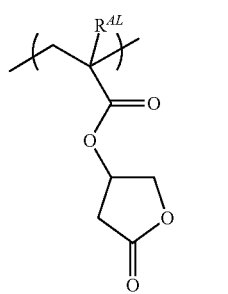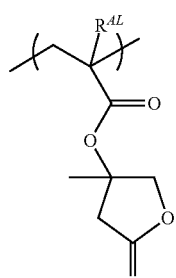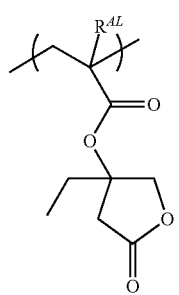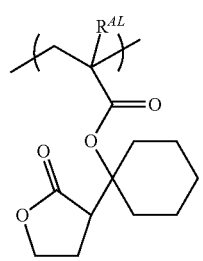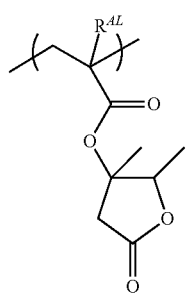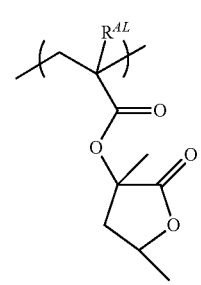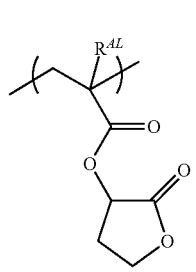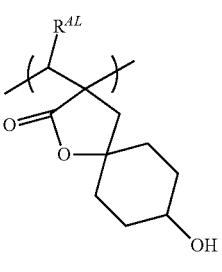

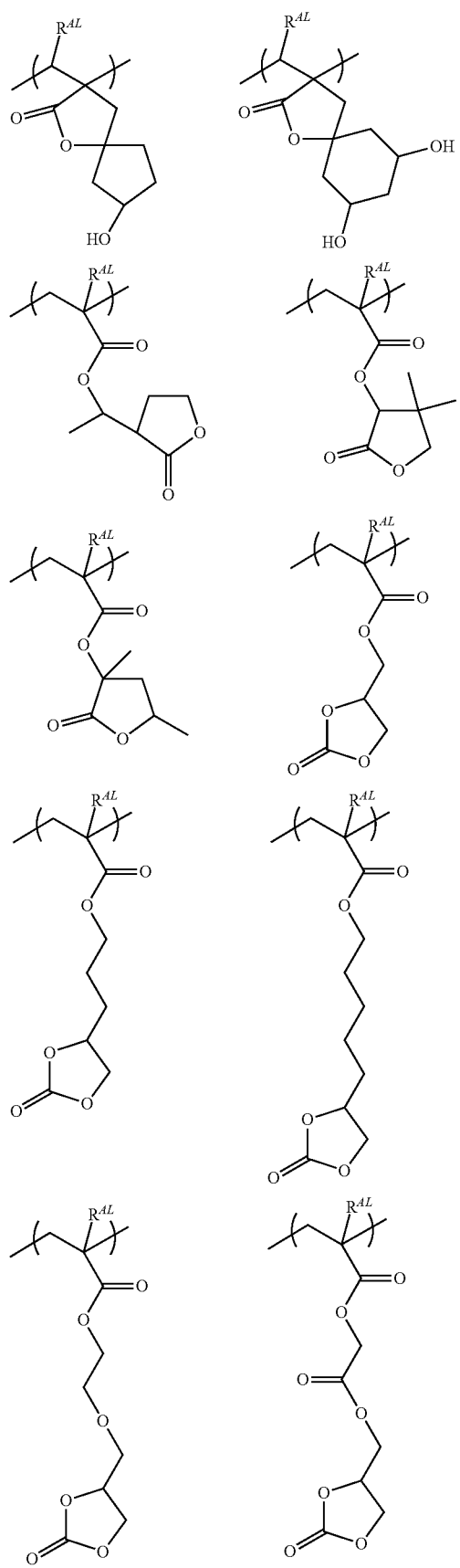
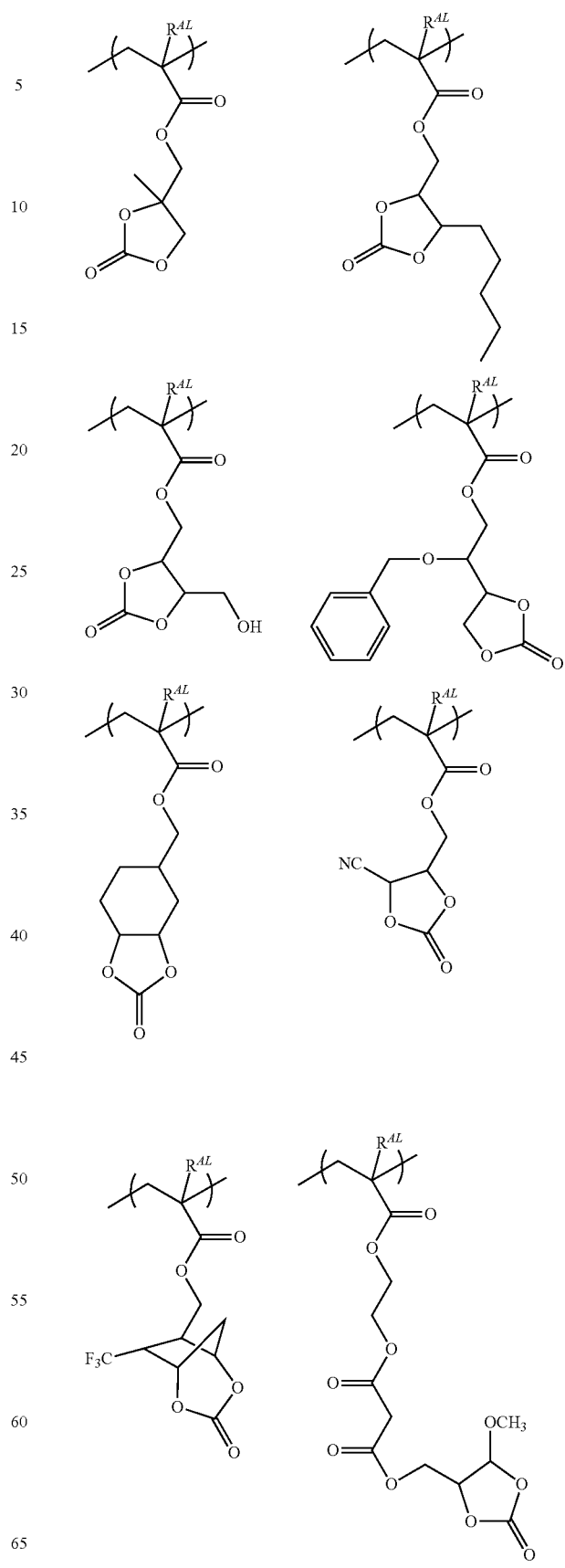

-continued

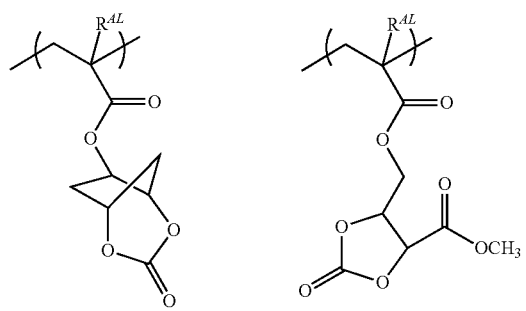
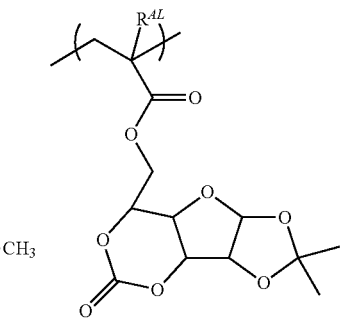
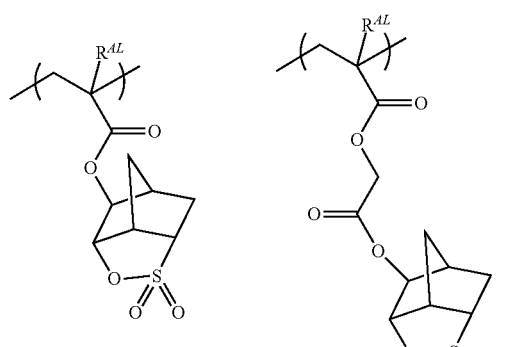
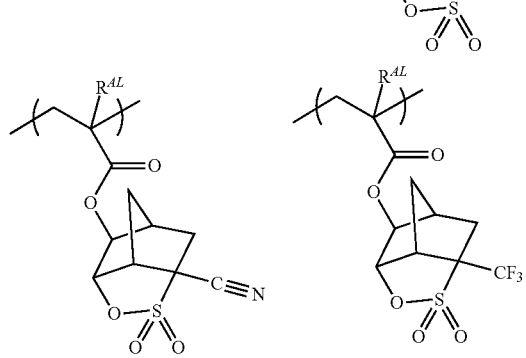
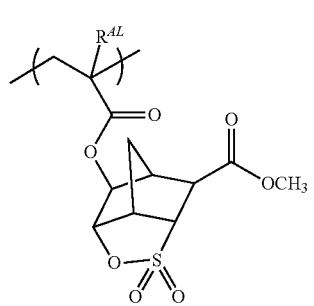

-continued

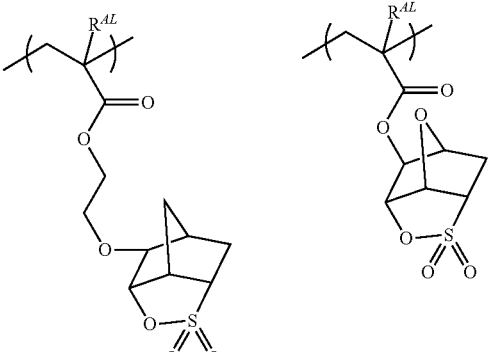
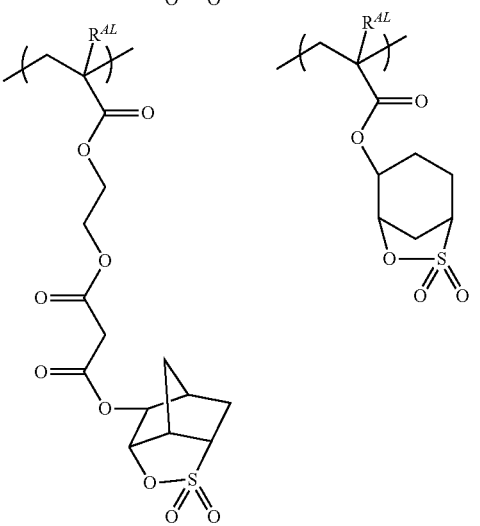
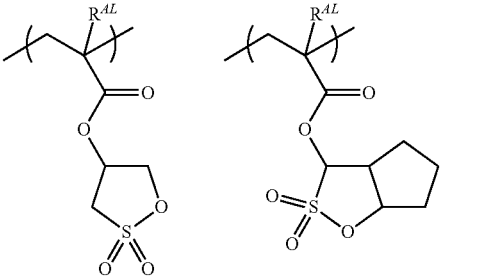

In the above formulae, $R^{AL}$ represents a hydrogen atom, a fluorine atom, a methyl group, or a trifluoromethyl group.

In light of the copolymerizability of a monomer that gives the structural unit (II), $R^{AL}$ represents preferably a hydrogen atom or a methyl group, and more preferably a methyl group.

Of these, as the structural unit (II), a structural unit that includes a norbornanelactone structure, a structural unit that includes an oxanorbornanelactone structure, a structural unit that includes a γ-butyrolactone structure, a structural unit that includes an ethylene carbonate structure, and a structural unit that includes a norbornanesultone structure are preferred, and a structural unit derived from norbornanelacton-yl (meth)acrylate, a structural unit derived from oxanorbornanelacton-yl (meth)acrylate, a structural unit derived from cyano-substituted norbornanelacton-yl (meth)acrylate, a structural unit derived from norbornanelacton-yloxycarbonylmethyl (meth)acrylate, a structural unit derived from butyrolacton-3-yl (meth)acrylate, a structural unit derived from butyrolacton-4-yl (meth)acrylate, a structural unit derived from 3,5-dimethylbutyrolacton-3-yl (meth)acrylate, a structural unit derived from 4,5-dimethylbutyrolacton-4-yl (meth)acrylate, a structural unit derived from 1-(butyrolacton-3-yl)cyclohexan-1-yl (meth)acrylate, a structural unit derived from ethylene carbonate-ylmethyl (meth)acrylate, a structural unit derived from cyclohexene carbonate-ylmethyl (meth)acrylate, a structural unit derived from norbornanesultone-yl (meth)acrylate, and a structural unit derived from norbornanesultone-yloxycarbonylmethyl (meth)acrylate are more preferred.

In a case where the polymer (A) has the structural unit (II), the lower limit of the proportion of the structural unit (II) with respect to the total structural units constituting the polymer (A) is preferably 1 mol %, more preferably 10 mol %, still more preferably 20 mol %, and particularly preferably 25 mol %. On the other hand, the upper limit of the proportion of the structural unit (II) is preferably 70 mol %, more preferably 65 mol %, still more preferably 60 mol %, and particularly preferably 55 mol %. When the proportion of the structural unit (II) falls within the above range, the adhesiveness of the resist pattern formed from the chemically amplified resist material to a substrate can be more improved. When the proportion of the structural unit (II) is less than the lower limit, the adhesiveness of the resist pattern to the substrate may be deteriorated. When the proportion of the structural unit (II) is greater than the upper limit, the pattern formability of the chemically amplified resist material may be deteriorated.

Structural Unit (III)

The structural unit (III) is a structural unit that includes a phenolic hydroxyl group. When the polymer (A) has the structural unit (III), the sensitivity can be increased in the case of the irradiation with a KrF excimer laser beam, EUV (extreme ultraviolet ray), an electron beam or the like in the patternwise exposure step.

The structural unit (III) is exemplified by a structural unit represented by the following formula (af), and the like.

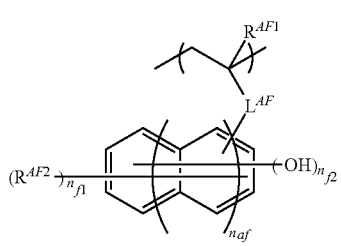

(af)

In the above formula (af), $R^{AF1}$ represents a hydrogen atom or a methyl group; $L^{AF}$ represents a single bond, —COO—, —O— or —CONH—; $R^{AF2}$ represents a monovalent organic group having 1 to 20 carbon atoms; $n_{f1}$ is an integer of 0 to 3, wherein in a case where $n_{f1}$ is 2 or 3, a plurality of $R^{AF2}$s may be identical or different; $n_{f2}$ is an integer of 1 to 3, wherein the sum of $n_{f1}$ and $n_{f2}$ is no greater than 5; and $n_{AF}$ is an integer of 0 to 2.

In light of the copolymerizability of a monomer that gives the structural unit (III), $R^{AF1}$ preferably represents a hydrogen atom.

$L^{AF}$ preferably represents a single bond or —COO—.

The monovalent organic group having 1 to 20 carbon atoms which is represented by $R^{AF2}$ is exemplified by: a monovalent hydrocarbon group having 1 to 20 carbon atoms; a group (a) obtained by incorporating a divalent hetero atom-containing group between two adjacent carbon atoms or at the end on the atomic bonding side of the hydrocarbon group; a group obtained by substituting a part or all of hydrogen atoms included in the hydrocarbon group or the group (a) with a monovalent hetero atom-containing group; and the like.

Examples of the monovalent hydrocarbon group having 1 to 20 carbon atoms which is represented by $R^{AF2}$ include monovalent hydrocarbon groups similar to those exemplified in connection with the group represented by $R^{A2}$, $R^{A6}$, $R^{A7}$ or $R^{A8}$, and the like.

Examples of the divalent hetero atom-containing group include —O—, —CO—, —CO—O—, —S—, —CS—, —SO$_2$—, —NR'—, a combination of at least two of these groups, and the like, wherein R' represents a hydrogen atom or a monovalent hydrocarbon group.

Examples of the monovalent hetero atom-containing group include halogen atoms such as a fluorine atom, a chlorine atom, a bromine atom and an iodine atom, a hydroxy group, a carboxy group, a cyano group, an amino group, a sulfanyl group (—SH), and the like.

Of these, a monovalent chain hydrocarbon group is preferred, an alkyl group is more preferred, and a methyl group is still more preferred.

In the above formula (af), $n_{f1}$ is preferably an integer of 0 to 2, more preferably 0 or 1, and still more preferably 0.

In the above formula (af), $n_{f2}$ is preferably 1 or 2, and more preferably 1.

In the above formula (af), $n_{AF}$ is preferably 0 or 1, and more preferably 0.

As the structural unit (III), structural units represented by the following formulae (f-1) to (f-6) (hereinafter, may be also referred to as "structural units (III-1) to (III-6)") and the like are preferred.

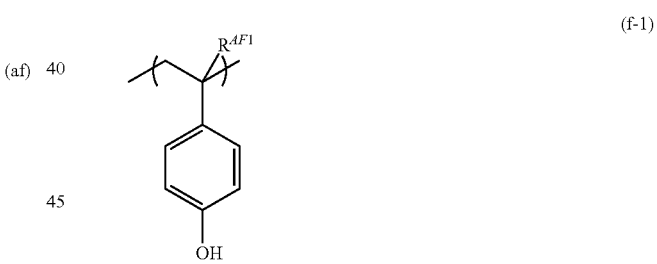

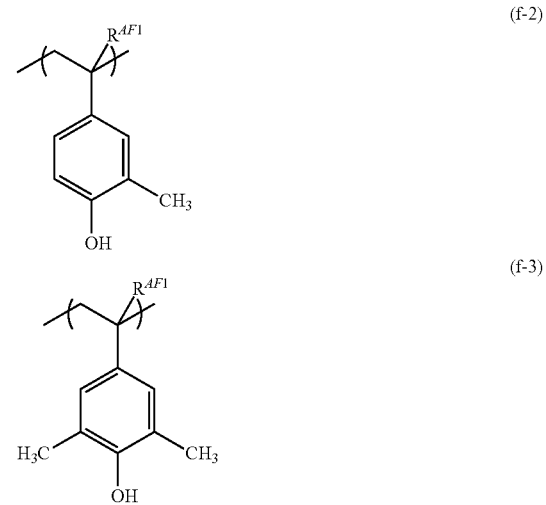

-continued

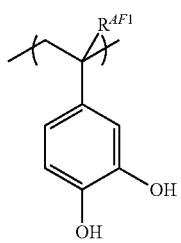

(f-4)

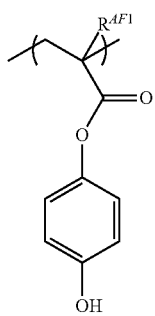

(f-5)

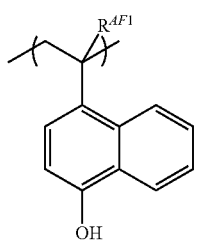

(f-6)

In the above formulae (f-1) to (f-6), $R^{AF1}$ is as defined in the above formula (af).

Of these, the structural units (III-1) and (III-2) are preferred, and the structural unit (III-1) is more preferred.

In a case where the polymer (A) has the structural unit (III), the lower limit of the proportion of the structural unit (III) with respect to the total structural units constituting the polymer (A) is preferably 1 mol %, more preferably 30 mol %, and still more preferably 50 mol %. On the other hand, the upper limit of the proportion of the structural unit (III) is preferably 90 mol %, more preferably 80 mol %, and still more preferably 75 mol %. When the proportion of the structural unit (III) falls within the above range, the sensitivity of the chemically amplified resist material can be more improved.

It is to be noted that the structural unit (III) can be formed by polymerizing a monomer obtained from hydroxystyrene by substitution of the hydrogen atom of an —OH group of the hydroxystyrene with an acetyl group or the like, and thereafter subjecting the obtained polymer to a hydrolysis reaction in the presence of an amine, or the like.

Other Structural Unit

The polymer (A) may have other structural unit than the structural units (I) to (III). The other structural unit is exemplified by a structural unit that includes a fluorine atom, an alcoholic hydroxyl group, a carboxy group, a cyano group, a nitro group, a sulfonamide group or the like, etc. Of these, a structural unit that includes a fluorine atom, a structural unit that includes an alcoholic hydroxyl group and a structural unit that includes a carboxy group are preferred, and a structural unit that includes a fluorine atom and a structural unit that includes an alcoholic hydroxyl group are more preferred.

In a case where the polymer (A) has the other structural unit, the lower limit of the proportion of the other structural unit with respect to the total structural units constituting the polymer (A) is preferably 1 mol %, more preferably 20 mol %, and still more preferably 40 mol %. On the other hand, the upper limit of the proportion of the other structural unit is preferably 80 mol %, more preferably 75 mol %, and still more preferably 70 mol %. When the proportion of the other structural unit falls within the above range, more adequate solubility of the polymer (A) in the developer solution can be attained. When the proportion of the other structural unit is greater than the upper limit, the pattern formability may be deteriorated.

The content of the polymer (A) with respect to the total solid content of the chemically amplified resist material is preferably no less than 70% by mass, more preferably no less than 75% by mass, and still more preferably no less than 80% by mass. The "solid content" as referred to herein means the entire component of the chemically amplified resist material except for a solvent.

The polystyrene equivalent weight average molecular weight (Mw) as determined by gel permeation chromatography (GPC) of the polymer (A) is not particularly limited, and the lower limit thereof is preferably 1,000, more preferably 2,000, still more preferably 3,000, and particularly preferably 5,000. On the other hand, the upper limit of the Mw of the polymer (A) is preferably 50,000, more preferably 30,000, still more preferably 20,000, and particularly preferably 15,000. When the Mw of the polymer (A) falls within the above range, the application property and development defects-inhibiting property of the chemically amplified resist material may be improved. When the Mw of the polymer (A) is less than the lower limit, the resist film exhibiting sufficient heat resistance may not be obtained. When the Mw of the polymer (A) is greater than the upper limit, the developability of the resist film may be deteriorated.

The lower limit of the ratio (Mw/Mn) of the Mw to the polystyrene equivalent number average molecular weight (Mn) as determined by GPC of the polymer (A) is typically 1. On the other hand, the upper limit of the ratio (Mw/Mn) is typically 5, preferably 3, and still more preferably 2.

As used herein, the Mw and the Mn of the polymer are determined using gel permeation chromatography (GPC) under the following conditions.

GPC columns: G2000 HXL×2, G3000 HXL×1 and G4000 HXL×1 (each available from Tosoh Corporation)

column temperature: 40° C.

elution solvent: tetrahydrofuran (available from Wako Pure Chemical Industries, Ltd.)

flow rate: 1.0 mL/min sample concentration: 1.0% by mass amount of injected sample: 100 μL detector: differential refractometer standard substance: mono-dispersed polystyrene The upper limit of the content of the low molecular weight component in the polymer (A) is preferably 1.0% by mass, more preferably 0.5% by mass, and still more preferably 0.3% by mass. The lower limit of the content of the low molecular weight component is 0.01% by mass, for example. When the content of the low molecular weight component in the polymer (A) falls within the above range, the lithography performances in the resist pattern-forming method can be more improved. The low molecular weight component in the polymer as referred to means a component having a molecular weight of no greater than 1,000.

As used herein, the content of the low molecular weight component in the polymer is determined by high performance liquid chromatography (HPLC) under the following conditions.

column: "Inertsil ODS-25 μm column" (4.6 mmφ×250 mm) available from GL Sciences, Inc.

eluent: acrylonitrile/0.1% by mass aqueous phosphoric acid solution flow rate: 1.0 mL/min sample concentration: 1.0% by mass amount of injected sample: 100 μl, detector: differential refractometer Synthesis Method of Polymer (A)

The polymer (A) may be produced by, for example, polymerizing monomer(s) each corresponding to the predetermined structural unit in an appropriate polymerization reaction solvent using a polymerization initiator such as a radical polymerization initiator. For example, the polymer (A) is preferably synthesized according to: a procedure that involves adding a solution containing a monomer and a radical polymerization initiator dropwise to a solution containing a polymerization reaction solvent or a monomer to permit a polymerization reaction; a procedure that involves separately adding a solution containing a monomer and a solution containing a radical polymerization initiator dropwise to a solution containing a polymerization reaction solvent or a monomer to permit a polymerization reaction; a procedure that involves separately adding a plurality of kinds of solutions containing each monomer, and a solution containing a radical polymerization initiator dropwise to a solution containing a polymerization reaction solvent or a monomer to permit a polymerization reaction; or the like.

Examples of the radical polymerization initiator include: azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide radical initiators such as benzoyl peroxide, t-butyl hydroperoxide and cumene hydroperoxide; and the like. Of these, AIBN and dimethyl 2,2'-azobisisobutyrate are preferred, and AIBN is more preferred. These radical initiators may be used either alone of one type, or in combination of two or more types thereof.

Examples of the solvent which may be used in the polymerization include solvents similar to those which may be contained in the chemically amplified resist material and will be described later.

The lower limit of the reaction temperature in the polymerization is preferably 40° C., and more preferably 50° C. On the other hand, the upper limit of the reaction temperature is preferably 150° C., and more preferably 120° C. The lower limit of the reaction time period is preferably 1 hour. On the other hand, the upper limit of the reaction time period is preferably 48 hrs, and more preferably 24 hrs.

The polymer (A) is preferably recovered according to a reprecipitation technique. More specifically, after the completion of the reaction, the intended copolymer is recovered in the form of a powder through charging the reaction mixture into a reprecipitation solvent. Alcohols, alkanes and the like may be used as the reprecipitation solvent, either alone or in combination of two or more types thereof. In addition to the reprecipitation technique, a liquid separating operation, a column operation, an ultrafiltration operation or the like enables the polymer to be recovered through eliminating the low molecular weight component such as monomers and oligomers.

(F) Polymer

The polymer (F) has a greater percentage content of fluorine atom than that of the polymer (A). When the chemically amplified resist material contains the polymer (F), in forming the resist film, the polymer (F) in the film tends to be localized in the surface region of the resist film due to the oil repellency characteristics thereof. Thus, the elution of the acid generating agent, the acid diffusion control agent and/or the like into a liquid immersion medium in the liquid immersion lithography can be inhibited. In addition, due to the water repellency characteristics of the polymer (F), an advancing contact angle of the liquid immersion medium on the resist film can be controlled to fall within a desired range, whereby generation of bubble defects can be inhibited. Further, a greater receding contact angle of the liquid immersion medium on the resist film can be attained, whereby an exposure by high speed scanning without being accompanied by residual water beads is enabled. Thus, when the chemically amplified resist material contains the polymer (F), a resist film suitable for the liquid immersion lithography processes can be formed. On the other hand, when the chemically amplified resist material contains the polymer (F), the number of defects generated in the development can be reduced.

In a case where the chemically amplified resist material contains the polymer (F), the lower limit of the percentage content of fluorine atom of the polymer (F) is preferably 1% by mass, more preferably 2% by mass, still more preferably 4% by mass, and particularly preferably 7% by mass. On the other hand, the upper limit of the percentage content of fluorine atom of the polymer (F) is preferably 60% by mass, more preferably 40% by mass, and still more preferably 30% by mass. When the percentage content of fluorine atom of the polymer (F) is less than the lower limit, the hydrophobicity of the surface of the resist film may be deteriorated. It is to be noted that the percentage content of fluorine atom (% by mass) of the polymer can be calculated based on the polymer structure determined by $^{13}$C-NMR spectroscopy.

The mode of incorporation of the fluorine atom in the polymer (F) is not particularly limited, and the fluorine atom may bond to any of the main chain, a side chain and an end of the polymer (F). In addition, in light of an improvement of the development defects-inhibiting property of the chemically amplified resist composition, the polymer (F) preferably has a structural unit that includes an acid-labile group. The structural unit that includes an acid-labile group is exemplified by the structural unit (I) in the polymer (A), and the like.

The polymer (F) preferably has an alkali-labile group. When the polymer (F) has the alkali-labile group, the surface of the resist film can be altered effectively from hydrophobic to hydrophilic in a development with an alkali, whereby the development defects-inhibiting property of the chemically amplified resist material may be improved. The term "alkali-labile group" as referred to means a group that substitutes for the hydrogen atom included in a carboxy group, a hydroxy group or the like and may be dissociated in an alkaline aqueous solution (for example, a 2.38% by mass aqueous tetramethylammonium hydroxide solution at 23° C.).

The lower limit of the proportion of the structural unit that includes an acid-labile group in the polymer (F) with respect to the total structural units constituting the polymer (F) is preferably 10 mol %, more preferably 15 mol %, and still more preferably 20 mol %. On the other hand, the upper limit of the proportion of the structural unit that includes an acid-labile group in the polymer (F) is preferably 80 mol %, more preferably 75 mol %, and still more preferably 70 mol %. When the proportion of the structural unit that includes an acid-labile group in the polymer (F) falls within the above range, the development defects-inhibiting property of the chemically amplified resist material can be more improved.

In a case where the chemically amplified resist material contains the polymer (F), the lower limit of the content of the polymer (F) with respect to 100 parts by mass of the polymer (A) is preferably 0.1 parts by mass, more preferably 0.2 parts by mass, still more preferably 0.5 parts by mass, and particularly preferably 1 part by mass. On the other hand, the upper limit of the content of the polymer (F) is preferably 30 parts by mass, more preferably 20 parts by mass, still more preferably 15 parts by mass, and particularly preferably 10 parts by mass.

The polymer (F) can be synthesized according to a method similar to the method for the polymer (A) described above.

The polystyrene equivalent weight average molecular weight (Mw) as determined by gel permeation chromatography (GPC) of the polymer (F) is not particularly limited, and the lower limit thereof is preferably 1,000, more preferably 2,000, still more preferably 2,500, and particularly preferably 3,000. On the other hand, the upper limit of the weight average molecular weight of the polymer (F) is preferably 50,000, more preferably 30,000, still more preferably 20,000, and particularly preferably 15,000. When the Mw of the polymer (F) falls within the above range, the application property and development defects-inhibiting property of the chemically amplified resist material may be improved. When the Mw of the polymer (F) is less than the lower limit, the resist film exhibiting sufficient heat resistance may not be obtained. When the Mw of the polymer (F) is greater than the upper limit, the developability of the resist film may be deteriorated.

The lower limit of the ratio (Mw/Mn) of the Mw to the polystyrene equivalent number average molecular weight (Mn) as determined by GPC of the polymer (F) is preferably 1. On the other hand, the upper limit of the ratio (Mw/Mn) is preferably 5, more preferably 3, and still more preferably 2.

(2) Component Generating Radiation-Sensitive Sensitizer and Acid Upon Exposure

The component (2) generates a radiation-sensitive sensitizer and an acid upon an exposure (irradiation with a radioactive ray). Among three components of (a) a radiation-sensitive acid-and-sensitizer generating agent, (b) a radiation-sensitive sensitizer generating agent, and (c) a radiation-sensitive acid generating agent, the component (2) contains the components (a) and (b), the components (b) and (c), or all of the components (a) to (c).

(a) Radiation-Sensitive Acid-and-Sensitizer Generating Agent

The radiation-sensitive acid-and-sensitizer generating agent (a) generates, upon the irradiation with the first radioactive ray, an acid, and a radiation-sensitive sensitizer that absorbs the second radioactive ray, upon the irradiation with the first radioactive ray, and substantially does not generate the acid and the radiation-sensitive sensitizer, upon the irradiation with the second radioactive ray, in light-unexposed regions which are not irradiated with the first radioactive ray in the patternwise exposure step.

The radiation-sensitive acid-and-sensitizer generating agent (a) is exemplified by an onium salt compound, a diazomethane compound, a sulfonimide compound, and the like. The onium salt compound is exemplified by a sulfonium salt compound, a tetrahydrothiophenium salt compound, an iodonium salt compound, and the like. In light of the high reduction potential, the radiation-sensitive acid-and-sensitizer generating agent (a) is preferably the sulfonium salt compound or the iodonium salt compound, and more preferably the iodonium salt compound.

The sulfonium salt compound is constituted with a sulfonium cation and an acid anion. As the sulfonium salt compound, compounds represented by the following formulae (I) to (III) are preferred.

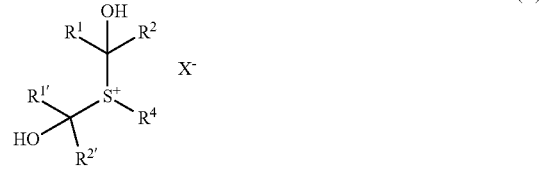

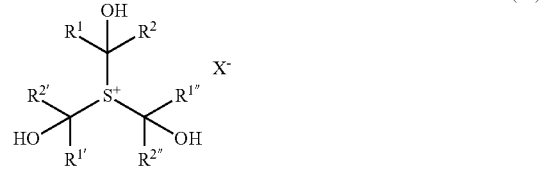

In the above formulae (I) to (III), $R^1$, $R^2$, $R^{1'}$, $R^{2'}$, $R^{1''}$, $R^{2''}$, $R^3$ and $R^4$ each independently represent: a hydrogen atom; a phenyl group; a naphthyl group; an anthracenyl group; a phenoxy group; a naphthoxy group; an anthracenoxy group; an amino group; an amide group; a halogen atom; a saturated or unsaturated linear, branched or cyclic hydrocarbon group, preferably an alkyl group, having 1 to 30 carbon atoms, preferably 1 to 5 carbon atoms; a phenoxy group substituted with an alkoxy group having 1 to 5 carbon atoms, a hydroxyl group, an amino group, an amide group, or an alkyl group having 1 to 5 carbon atoms; a phenyl group substituted with a saturated or unsaturated linear, branched or cyclic hydrocarbon group, preferably an alkyl group, having 1 to 30 carbon atoms, preferably 1 to 5 carbon atoms, an alkoxy group having 1 to 5 carbon atoms, an amino group, an amide group, or a hydroxyl group; a naphthoxy group substituted with an alkoxy group having 1 to 5 carbon atoms, an alkyl group having 1 to 5 carbon atoms, an amino group, an amide group, or a hydroxyl group; an anthracenoxy group substituted with an alkoxy group having 1 to 5 carbon atoms, an alkyl group having 1 to 5 carbon atoms, an amino group, an amide group, or a hydroxyl group; a saturated or unsaturated linear, branched or cyclic hydrocarbon group, preferably an alkyl group, having 1 to 30 carbon atoms, preferably 1 to 5 carbon atoms, substituted with an alkoxy group having 1 to 5 carbon atoms, a phenoxy group, a naphthoxy group, an anthracenoxy group, an amino group, an amide group, or a hydroxyl group; or a carbonyl group to which an alkyl group having 1 to 12 carbon atoms bonds. In the above formulae (I) to (III), the hydrogen atom of the hydroxyl group may be substituted with: a phenyl group; a halogen atom; a saturated or unsaturated linear, branched or cyclic hydrocarbon group, preferably an alkyl group, having 1 to 30 carbon atoms, preferably 1 to 5 carbon atoms; or a phenyl group substituted with a saturated or unsaturated linear, branched or cyclic hydrocarbon group, preferably an alkyl group, having 1 to 30 carbon atoms, preferably 1 to 5 carbon atoms, an alkoxy group having 1 to 5 carbon atoms, or a hydroxyl group. In a case where the hydrogen atom of the hydroxyl group is substituted, the sulfonium salt compound shall include a ketal compound group or an acetal compound group. In the formulae (I) to (III), any at least two of the groups represented by $R^1$, $R^2$, $R^{1\prime}$, $R^{2\prime}$, $R^{1\prime\prime}$, $R^{2\prime\prime}$, $R^3$, and $R^4$ may taken together form a ring structure via a single bond or a double bond, or via a bond that includes —$CH_2$—, —O—, —S—, —$SO_2$—, —$SO_2NH$—, —C(=O)—, —C(=O)O—, —NHCO—, —NHC(=O)NH—, —$CHR^e$—, —$CR^e_2$—, —NH— or —$NR^e$—. $R^e$ represents: a phenyl group; a phenoxy group; a halogen atom; a saturated or unsaturated linear, branched or cyclic hydrocarbon group, preferably an alkyl group, having 1 to 30 carbon atoms, preferably 1 to 5 carbon atoms; a phenoxy group substituted with an alkoxy group having 1 to 5 carbon atoms, a hydroxyl group, or an alkyl group having 1 to 5 carbon atoms; or a phenyl group substituted with a saturated or unsaturated linear, branched or cyclic hydrocarbon group, preferably an alkyl group, having 1 to 30 carbon atoms, preferably 1 to 5 carbon atoms, an alkoxy group having 1 to 5 carbon atoms, or a hydroxyl group. $R^1$, $R^2$, $R^{1\prime}$, $R^{2\prime}$, $R^{1\prime\prime}$, $R^{2\prime\prime}$, $R^3$ and $R^4$ each independently represent preferably a phenyl group; a phenoxy group; a phenoxy group substituted with an alkyl group having 1 to 5 carbon atoms; or a phenyl group substituted with an alkoxy group having 1 to 5 carbon atoms or a hydroxyl group. In the formulae (I) to (III), $X^-$ represents an anion derived from an acid, preferably a strong acid, and more preferably a superacid.

In the above formulae (I) to (III), examples of the group represented by —C(—OH)$R^1R^2$, —C(—OH)$R^{1\prime}R^{2\prime}$, —C(—OH)$R^{1\prime\prime}R^{2\prime\prime}$ or the like include groups represented by the following formulae. It is to be noted that * in the formulae denotes a binding site to the sulfur ion in the above formulae (I) to (III). In the group represented by —C(—OH)$R^1R^2$, —C(—OH)$R^{1\prime}R^{2\prime}$, or —C(—OH)$R^{1\prime\prime}R^{2\prime\prime}$, the hydroxyl group and the carbon atom to which the hydroxyl group bonds are to give a carbonyl group upon the patternwise exposure. Thus, in the compounds represented by the above formulae (I) to (III), the group represented by —C(—OH)$R^1R^2$, —C(—OH)$R^{1\prime}R^{2\prime}$, or —C(—OH)$R^{1\prime\prime}R^{2\prime\prime}$ is dissociated after the patternwise exposure to generate the radiation-sensitive sensitizer.

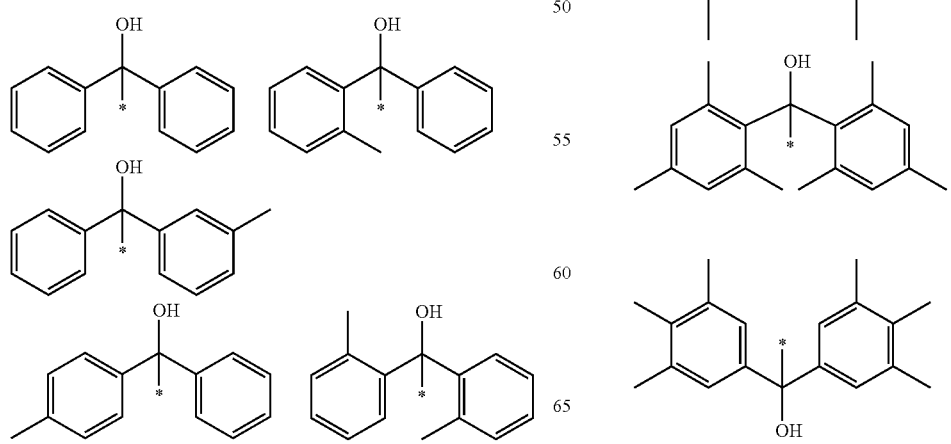

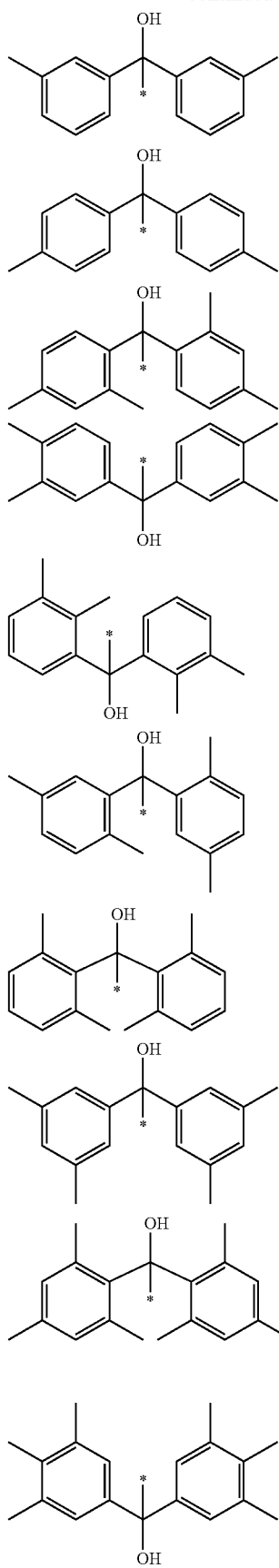

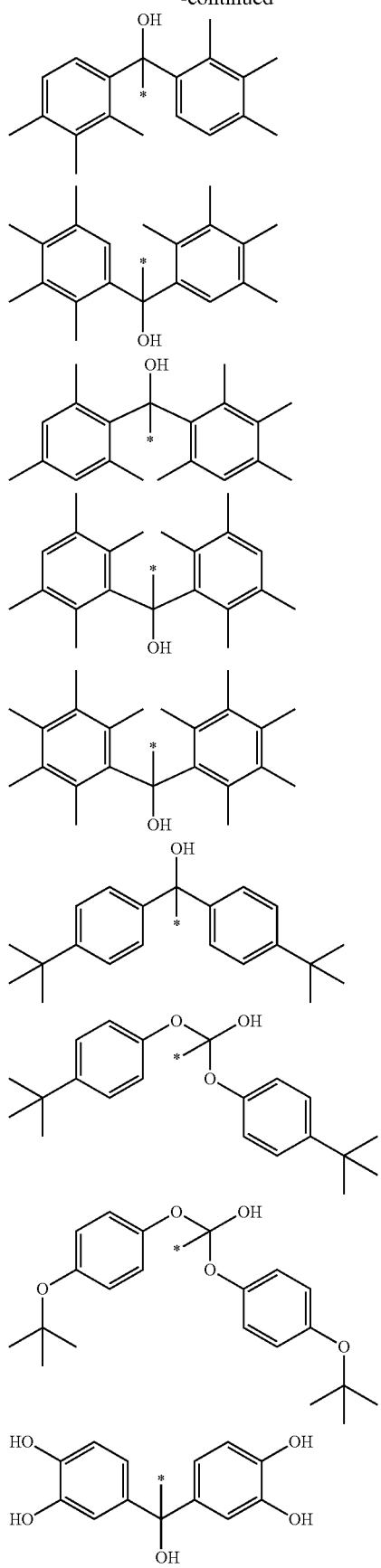
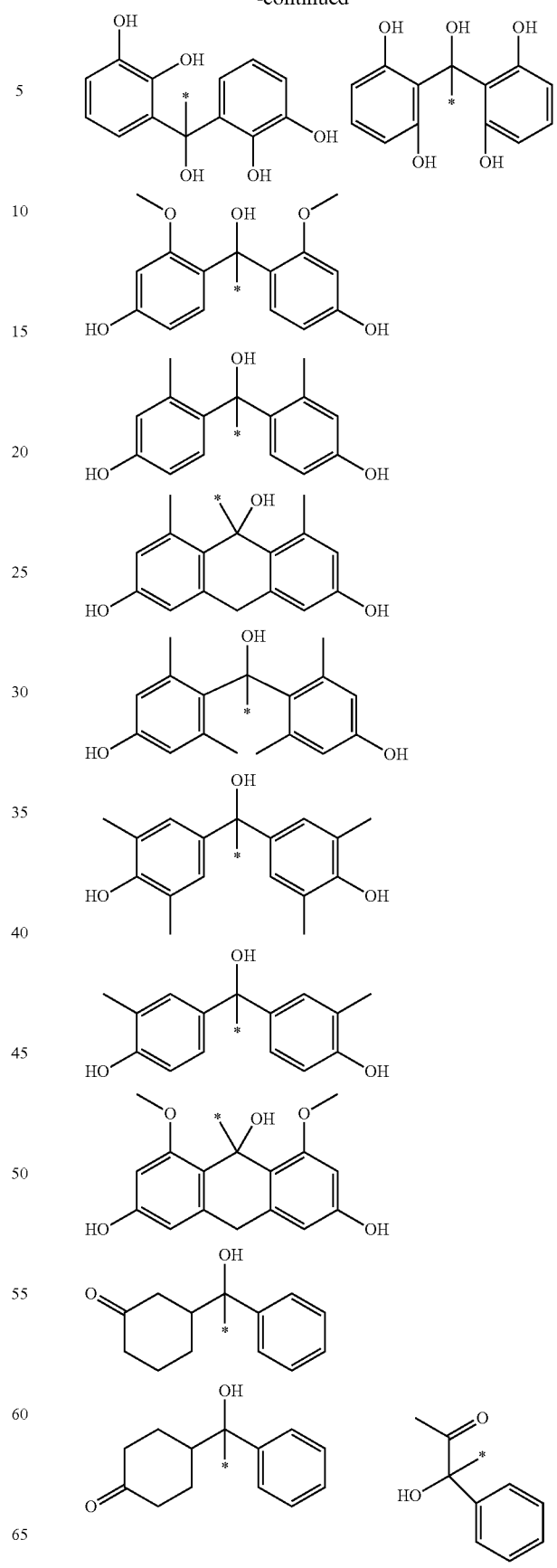

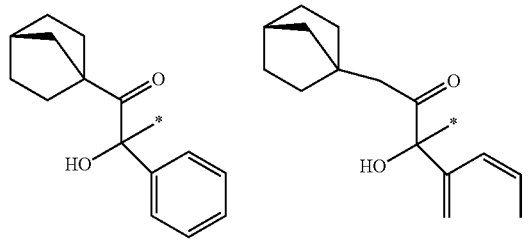
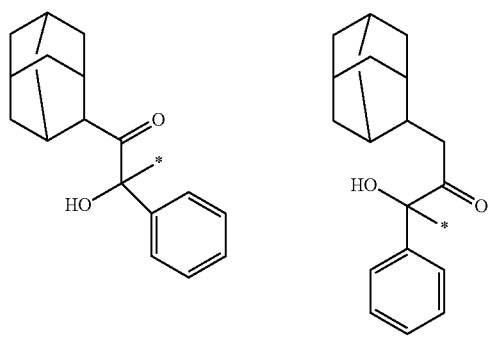
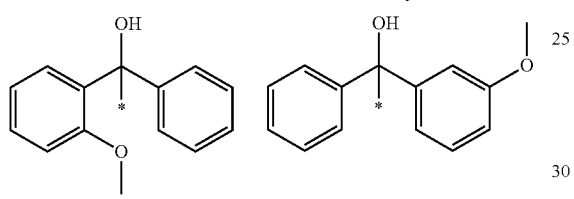
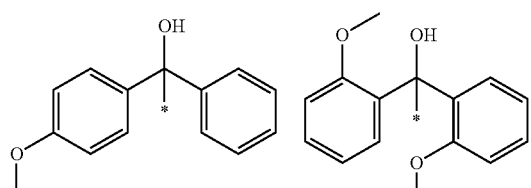
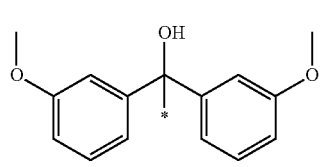
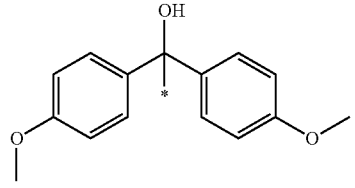
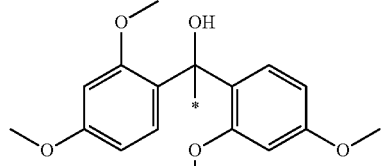
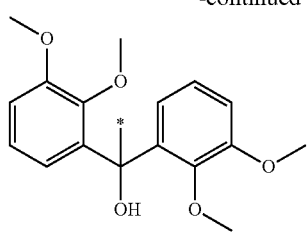
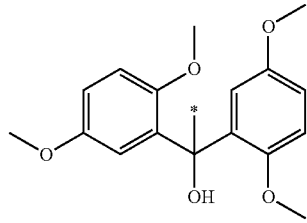
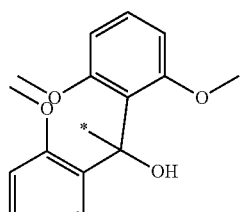
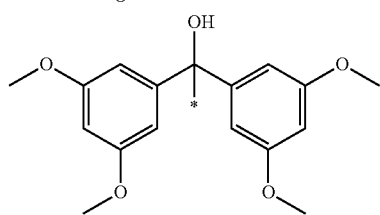
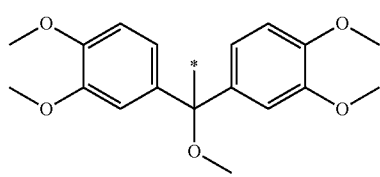
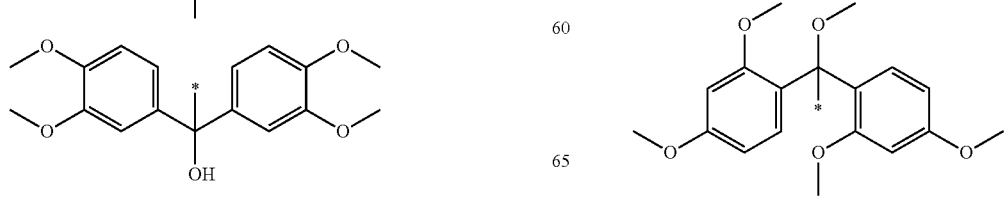

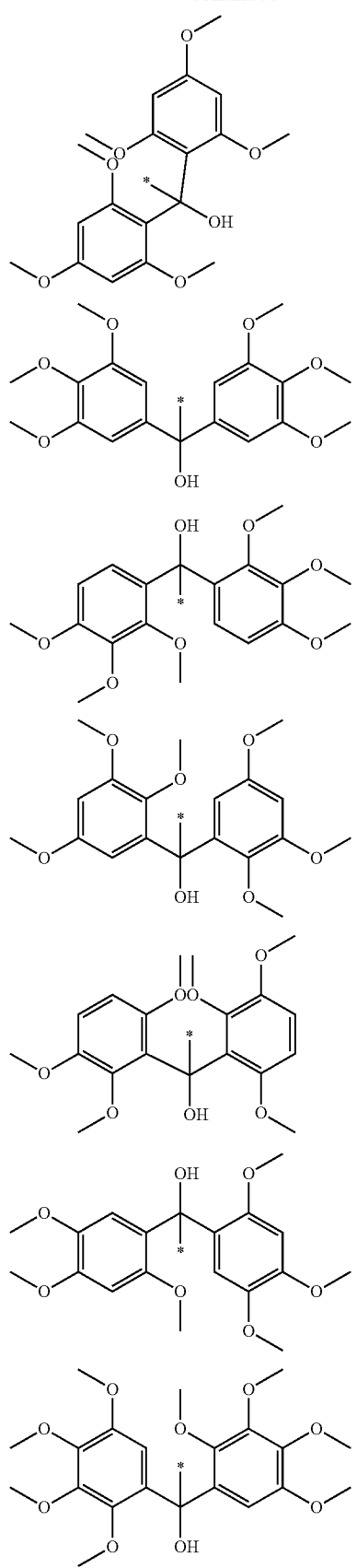
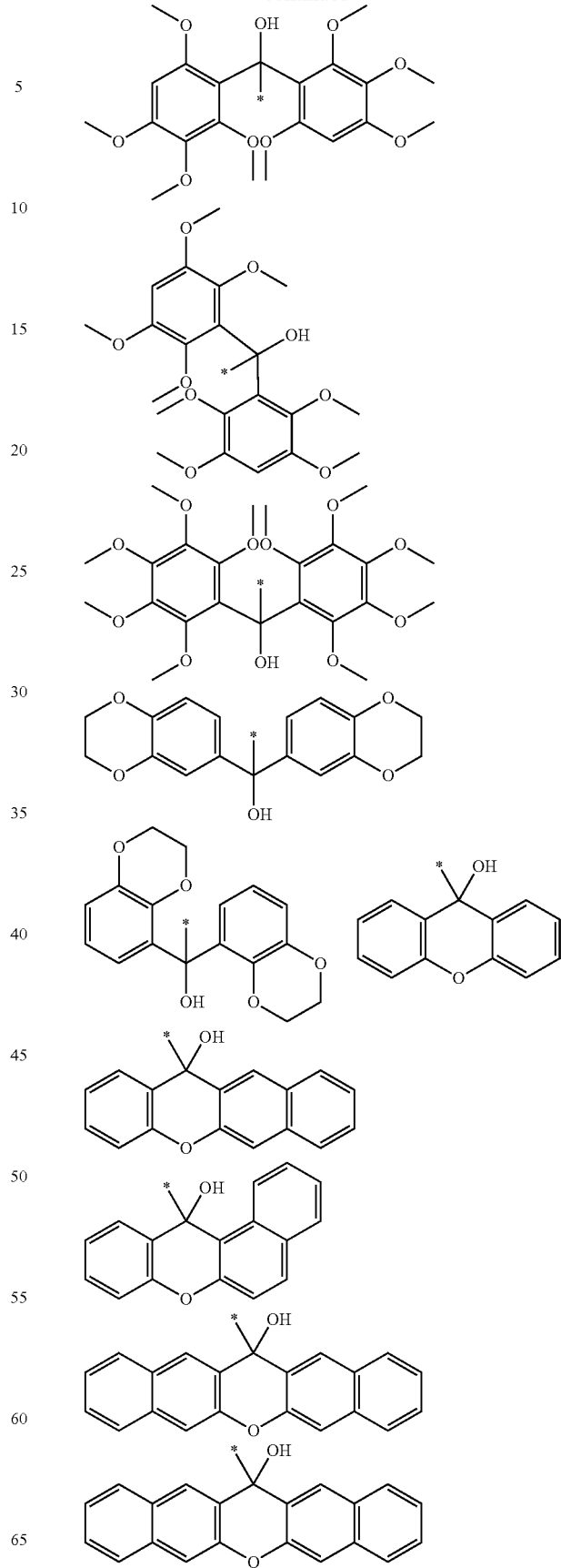

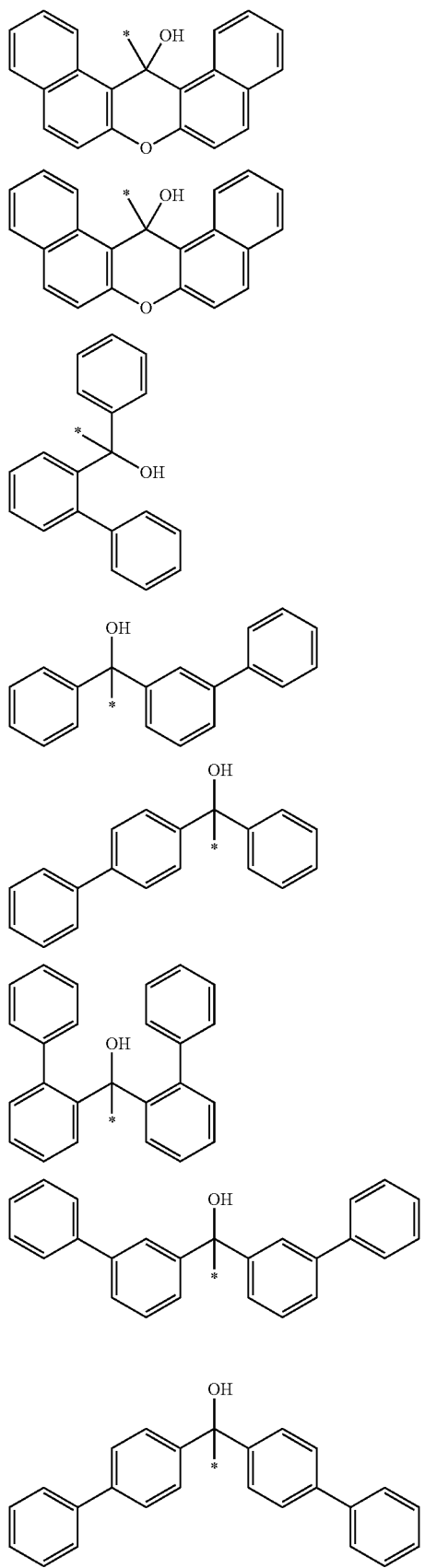
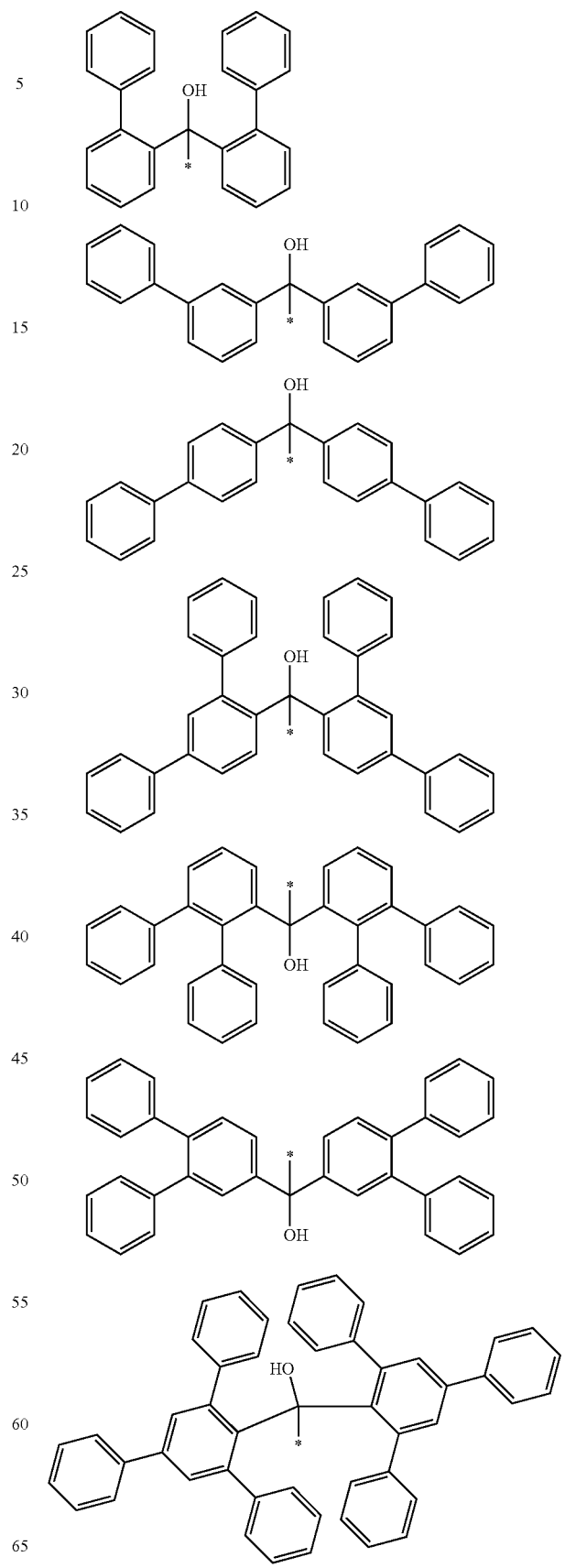

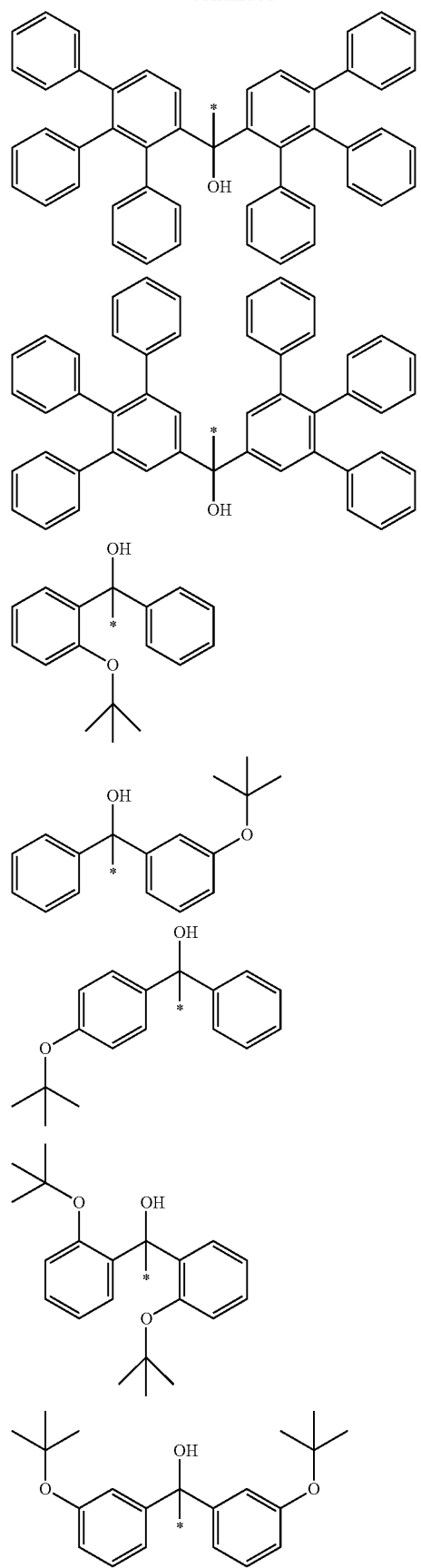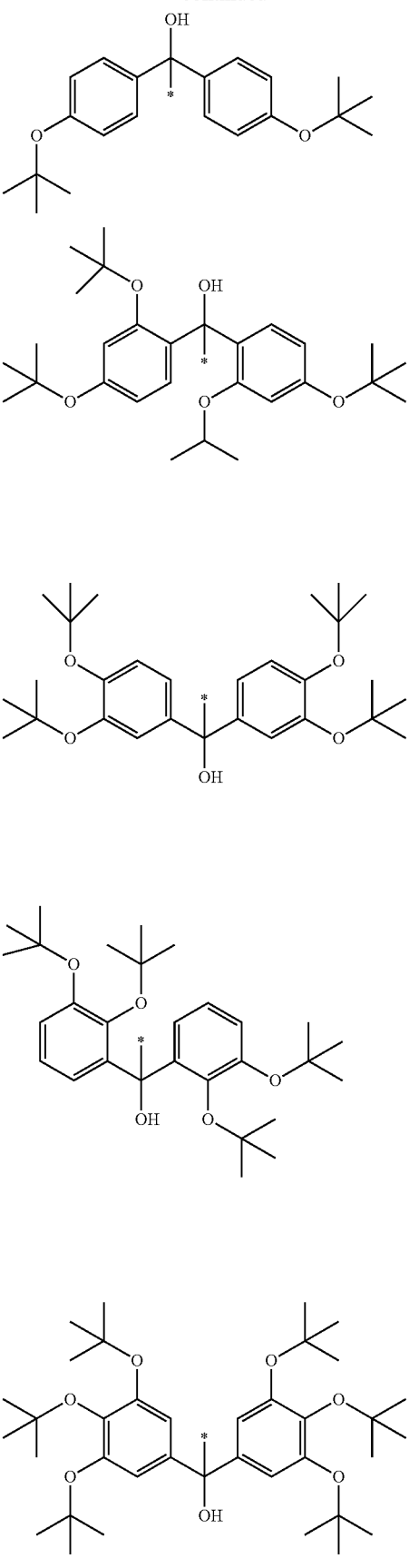

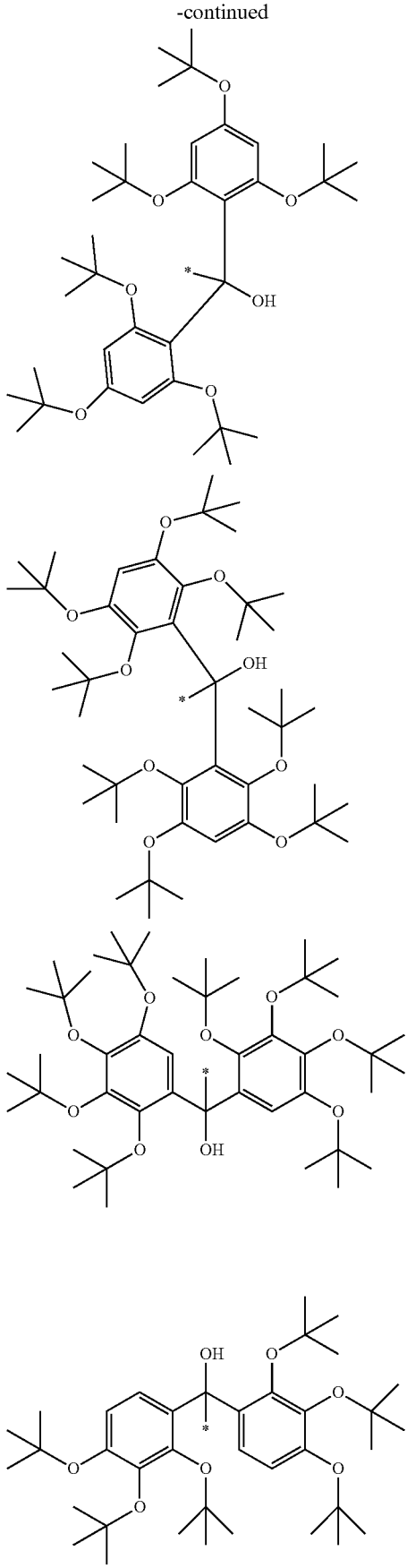

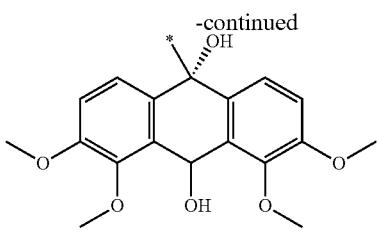

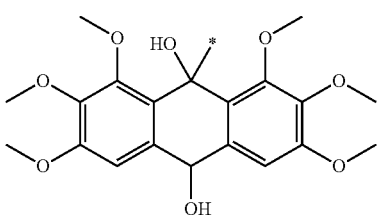

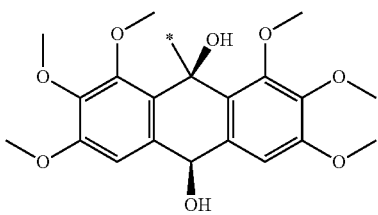

The iodonium salt compound is constituted with an iodonium cation and an acid anion. As the iodonium salt compound, compounds represented by the following formulae (IV) to (V) are preferred.

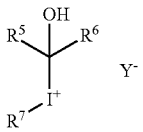
(IV)

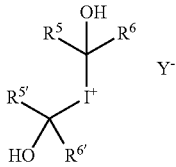
(V)

In the above formulae (IV) to (V), $R^5$, $R^6$, $R^{5'}$, $R^{6'}$, and $R^7$ each independently represent: a hydrogen atom; a phenyl group; a naphthyl group; an anthracenyl group; a phenoxy group; a naphthoxy group; an anthracenoxy group; an amino group; an amide group; a halogen atom; a saturated or unsaturated linear, branched or cyclic hydrocarbon group, preferably an alkyl group, having 1 to 30 carbon atoms, preferably 1 to 5 carbon atoms; a phenoxy group substituted with an alkoxy group having 1 to 5 carbon atoms, a hydroxyl group, an amino group, an amide group, or an alkyl group having 1 to 5 carbon atoms; a phenyl group substituted with a saturated or unsaturated linear, branched or cyclic hydrocarbon group, preferably an alkyl group, having 1 to 30 carbon atoms, preferably 1 to 5 carbon atoms, an alkoxy group having 1 to 5 carbon atoms, an amino group, an amide group, or a hydroxyl group; a naphthoxy group substituted with an alkoxy group having 1 to 5 carbon atoms, an alkyl group having 1 to 5 carbon atoms, an amino group, an amide group, or a hydroxyl group; an anthracenoxy group substituted with an alkoxy group having 1 to 5 carbon atoms, an alkyl group having 1 to 5 carbon atoms, an amino group, an amide group, or a hydroxyl group; a saturated or unsaturated linear, branched or cyclic hydrocarbon group, preferably an alkyl group, having 1 to 30 carbon atoms, preferably 1 to 5 carbon atoms, substituted with an alkoxy group having 1 to 5 carbon atoms, a phenoxy group, a naphthoxy group, an anthracenoxy group, an amino group, an amide group, or a hydroxyl group; or a carbonyl group to which an alkyl group having 1 to 12 carbon atoms bonds. In the above formulae (IV) to (V), the hydrogen atom of the hydroxyl group may be substituted with: a phenyl group; a halogen atom; a saturated or unsaturated linear, branched or cyclic hydrocarbon group, preferably an alkyl group, having 1 to 30 carbon atoms, preferably 1 to 5 carbon atoms; or a phenyl group substituted with a saturated or unsaturated linear, branched or cyclic hydrocarbon group, preferably an alkyl group, having 1 to 30 carbon atoms, preferably 1 to 5 carbon atoms, an alkoxy group having 1 to 5 carbon atoms, or a hydroxyl group. In a case where the hydrogen atom of the hydroxyl group is substituted, the iodonium salt compound shall include a ketal compound group or an acetal compound group. In the formulae (IV) to (V), any at least two of the groups represented by $R^5$, $R^6$, $R^{5'}$, $R^{6'}$, and $R^7$ may taken together form a ring structure via a single bond or a double bond, or via a bond that includes —$CH_2$—, —O—, —S—, —$SO_2NH$—, —C(=O)—, —C(=O)O—, —NHCO—, —NHC(=O)NH—, —$CHR^f$—, —$CR^f{}_2$—, —NH— or —$NR^f$—. $R^f$ represents: a phenyl group; a phenoxy group; a halogen atom; a saturated or unsaturated linear, branched or cyclic hydrocarbon group, preferably an alkyl group, having 1 to 30 carbon atoms, preferably 1 to 5 carbon atoms; a phenoxy group substituted with an alkoxy group having 1 to 5 carbon atoms, a hydroxyl group, or an alkyl group having 1 to 5 carbon atoms; or a phenyl group substituted with a saturated or unsaturated linear, branched or cyclic hydrocarbon group, preferably an alkyl group, having 1 to 30 carbon atoms, preferably 1 to 5 carbon atoms, an alkoxy group having 1 to 5 carbon atoms, or a hydroxyl group. $R^5$, $R^6$, $R^{5'}$, $R^{6'}$, and $R^7$ each independently represent preferably: a phenyl group; a phenoxy group; a phenoxy group substituted with an alkoxy group having 1 to 5 carbon atoms, a hydroxyl group, or an alkyl group having 1 to 5 carbon atoms; or a phenyl group substituted with an alkoxy group having 1 to 5 carbon atoms or a hydroxyl group. In the formulae (IV) to (V), $Y^-$ represents an anion derived from an acid, preferably a strong acid, and more preferably a superacid.

In the above formulae (IV) to (V), examples of the group represented by —C(—OH)$R^5R^6$ or —C(—OH)$R^{5'}R^{6'}$ include groups similar to those exemplified as the group represented by —C(—OH)$R^1R^2$, —C(—OH)$R^{1'}R^{2'}$, —C(—OH)$R^{1''}R^{2''}$ or the like in connection with the above formulae (I) to (III).

The acid anion in the sulfonium salt compound and the iodonium salt compound is exemplified by a sulfonic acid anion, a carboxylic acid anion, a bis(alkylsulfonyl)amide anion, a tris(alkylsulfonyl)methide anion, and the like, and acid anions represented by the following general formulae (XX), (XXI) and (XXII) are preferred, and an acid anion represented by the following general formula (XX) is more preferred.

 (XX)

 (XXI)

 (XXII)

In the above general formulae (XX), (XXI) and (XXII), $R^{18}$ to $R^{21}$ each independently represent an organic group. The organic group is exemplified by an alkyl group, an aryl group, a group obtained by linking a plurality of alkyl groups and/or aryl groups, and the like. The organic group is preferably an alkyl group substituted with a fluorine atom or a fluoroalkyl group in 1-position, or a phenyl group substituted with a fluorine atom or a fluoroalkyl group. When the organic group includes the fluorine atom or the fluoroalkyl group, the acidity of the acid generated upon the exposure tends to increase, leading to an improvement of the sensitivity. However, it is preferred that the organic group does not include the fluorine atom as the substituent at an end thereof.

The acid anion preferably includes at least one anion group selected from the group consisting of a sulfonic acid anion, a carboxylic acid anion, a sulfonylimide anion, a bis(alkylsulfonyl)imide anion, and a tris(alkylsulfonyl)methide anion. The acid anion is exemplified by an anion represented by the general formula "$R^{22}$—$SO_3^-$", wherein $R^{22}$ represents a linear, branched or cyclic alkyl group, a halogenated alkyl group, an aryl group, or an alkenyl group, wherein the linear, branched or cyclic alkyl group, the halogenated alkyl group, the aryl group and the alkenyl group may include a substituent. The number of carbon atoms of the linear or branched alkyl group which may be represented by $R^{22}$ is preferably no less than 1 and no greater than 10. In a case where $R^{22}$ represents the alkyl group, for example, the acid anion is exemplified by alkylsulfonates such as methanesulfonate, n-propanesulfonate, n-butanesulfonate, n-octanesulfonate, 1-adamantanesulfonate, 2-norbornanesulfonate and d-camphor-10-sulfonate. The halogenated alkyl group which may be represented by $R^{22}$ is a group obtained by substituting a part or all of hydrogen atoms of the alkyl group with a halogen atom, and the number of carbon atoms of the alkyl group is preferably no less than 1 and no greater than 10. Among the alkyl groups, linear or branched alkyl groups are more preferred, and a methyl group, an ethyl group, a propyl group, an isopropyl group, a n-butyl group, a tert-butyl group, a tert-pentyl group, and an isopentyl group are still more preferred. Moreover, examples of the halogen atom substituting the hydrogen atom include a fluorine atom, a chlorine atom, an iodine atom, a bromine atom, and the like. In regard to the halogenated alkyl group, it is preferred that no less than 50% and no greater than 100% of the total number of hydrogen atoms included in the alkyl group (alkyl group in its unhalogenated state) are substituted by the halogen atom, and it is more preferred that all hydrogen atoms are substituted by the halogen atom. In this regard, the halogenated alkyl group is preferably a fluorinated alkyl group. The number of carbon atoms of the fluorinated alkyl group is preferably no less than 1 and no greater than 10, more preferably no less than 1 and no greater than 8, and most preferably no less than 1 and no greater than 4. In addition, the degree of fluorination of the fluorinated alkyl group is preferably no less than 10% and no greater than 100%, and more preferably no less than 50% and no greater than 100%, and in particular, all of the hydrogen atoms are preferably substituted by the fluorine atom in light of an increase of the strength of the acid. Examples of the preferred fluorinated alkyl group include a trifluoromethyl group, a heptafluoro-n-propyl group, a nonafluoro-n-butyl group, and the like.

$R^{22}$ may include a substituent. The substituent includes a divalent linking group that has an oxygen atom. The linking group is exemplified by non-hydrocarbon, oxygen atom-containing linking groups such as an oxygen atom (ether linkage: —O—), an ester linkage (—C(=O)—O—), an amide linkage (—C(=O)—NH—), a carbonyl group (—C(=O)—), a sulfonyl group (—$SO_2$—), and a carbonate linkage (—O—C(=O)—O—).

Examples of the acid anion include, but not limited to, anions represented by the following formulae.

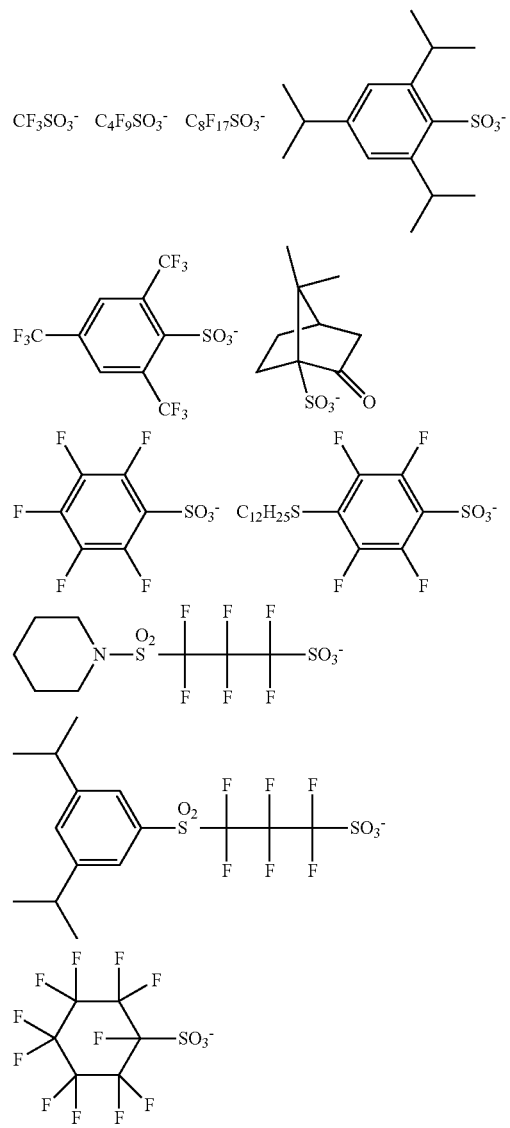

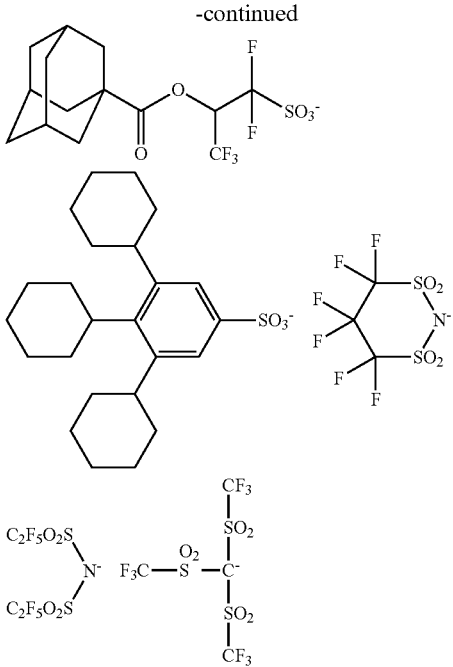

Alternatively, the radiation-sensitive acid-and-sensitizer generating agent (a) may be a part of the polymer constituting the polymer component (1). In this case, the radiation-sensitive acid-and-sensitizer generating agent (a) is present in the form of a group obtained by eliminating one hydrogen atom from the aforementioned compound and bound to the polymer.

In a case where the radiation-sensitive acid-and-sensitizer generating agent (a) is a component different from the polymer component (1), the lower limit of the amount of the radiation-sensitive acid-and-sensitizer generating agent (a) blended with respect to 100 parts by mass of the polymer component (1) is preferably 0.005 parts by mass, and more preferably 0.1 parts by mass. On the other hand, the upper limit of the amount of the radiation-sensitive acid-and-sensitizer generating agent (a) blended is preferably 50 parts by mass, and more preferably 30 parts by mass.

In the case where the radiation-sensitive acid-and-sensitizer generating agent (a) is a part of the polymer constituting the polymer component (1), the proportion of the radiation-sensitive acid-and-sensitizer generating agent (a) contained with respect to 1 mol of the polymer component (1) is preferably 0.001 mol, more preferably 0.002 mol, and still more preferably 0.01 mol. On the other hand, the upper limit of the proportion of the radiation-sensitive acid-and-sensitizer generating agent (a) is preferably 0.5 mol, and more preferably 0.3 mol.

When the amount of the radiation-sensitive acid-and-sensitizer generating agent (a) blended or the proportion of the radiation-sensitive acid-and-sensitizer generating agent (a) contained is less than the lower limit, the sensitivity may be deteriorated. To the contrary, when the amount of the radiation-sensitive acid-and-sensitizer generating agent (a) blended or the proportion of the radiation-sensitive acid-and-sensitizer generating agent (a) contained is greater than the upper limit, it may be difficult to form the resist film, and/or the rectangularity of the cross-sectional shape of the resist pattern may be deteriorated.

(b) Radiation-Sensitive Sensitizer Generating Agent

The radiation-sensitive sensitizer generating agent (b) contains a compound represented by the following formula (B) (hereinafter, may be also referred to as "(B) compound" or "compound (B)"). The radiation-sensitive sensitizer generating agent (b) generates, upon the irradiation with the first radioactive ray, a radiation-sensitive sensitizer that absorbs the second radioactive ray, and the radiation-sensitive sensitizer generating agent (b) substantially does not generate the radiation-sensitive sensitizer upon the irradiation with the second radioactive ray in light-unexposed regions which are not irradiated with the first radioactive ray in the patternwise exposure step; thus, the radiation-sensitive sensitizer generating agent (b) is different from the radiation-sensitive acid-and-sensitizer generating agent (a).

According to the pattern-forming method of the embodiment of the present invention, in the regions light-exposed in the patternwise exposure step, the chemical structure of the radiation-sensitive sensitizer generating agent (b) is altered through a direct or indirect reaction to generate a radiation-sensitive sensitizer that assists in the generation of the acid in the floodwise exposure step. Since the radiation-sensitive sensitizer absorbs the second radioactive ray more readily in the floodwise exposure step as compared with the radiation-sensitive sensitizer generating agent (b), the absorption capacity with respect to the second radioactive ray differs significantly upon the patternwise exposure between the light-exposed regions where the radiation-sensitive sensitizer is generated and the patternwise unexposed regions where the radiation-sensitive sensitizer is not generated, whereby a contrast of the absorption capacity can be attained more easily.

According to the resist pattern-forming method, due to the use of the organic solvent as the developer solution and to the radiation-sensitive sensitizer generating agent (b) containing the compound (B), when a radioactive ray having a wavelength of no greater than 250 nm such as EUV light is used as the patterning exposure light, high levels of the sensitivity and the lithography performances can be exhibited. Although not necessarily clarified, the reason for achieving the effects described above due to the resist pattern-forming method having the aforementioned constitution is inferred as in the following, for example. More specifically, the compound (B) would be able to absorb the radioactive ray such as EUV light more efficiently, and consequently a sensitization action in the patternwise exposed regions would proceed more efficiently. In addition, in the patternwise exposed regions, the generation of the acid would be facilitated by the sensitization action, and the resist film would be made insoluble in the organic solvent and soluble in an alkali through the action of the acid. In this regard, the degree of the decrease of the solubility of the resist film in the organic solvent due to the aforementioned sensitization action would be greater than the degree of the increase of the solubility in the alkali, and consequently the degree of the increase of the sensitivity in the formation of the negative resist pattern through the development with the organic solvent would be greater as compared with that in the case of the formation of the positive resist pattern through the development with the alkali.

(B)

In the above formula (B), $R^{B1}$ and $R^{B2}$ each independently represent a hydrogen atom, a phenyl group, a naphthyl group, an anthracenyl group, an alkoxy group having 1 to 5 carbon atoms, an alkylthio group having 1 to 5 carbon atoms, a phenoxy group, a naphthoxy group, an anthracenoxy group, an amino group, an amide group, a saturated or unsaturated linear, branched or cyclic hydrocarbon group having 1 to 30 carbon atoms, or a carbonyl group to which an alkyl group having 1 to 12 carbon atoms bonds, wherein a part or all of hydrogen atoms included in the phenyl group, the naphthyl group, the anthracenyl group, the alkoxy group, the alkylthio group, the phenoxy group, the naphthoxy group, the anthracenoxy group or the hydrocarbon group are unsubstituted or substituted, and wherein $R^{B1}$ and $R^{B2}$ may taken together represent a ring structure via a single bond or a double bond, or via a bond that includes —CH$_2$—, —O—, —S—, —SO$_2$—, —SO$_2$NH—, —C(=O)—, —C(=O)O—, —NHCO—, —NHC(=O)NH—, —CHR$^g$—, —CR$^g{}_2$—, —NH— or —NR$^g$— together with the carbon atom to which $R^{B1}$ and $R^{B2}$ bond, wherein $R^g$ represents an alky group having 1 to 5 carbon atoms; and $R^{B3}$ and $R^{B4}$ represent a substituted or unsubstituted phenyl group, a halogen atom, or a saturated or unsaturated linear, branched or cyclic hydrocarbon group having 1 to 30 carbon atoms, or, optionally, at least two of carbon atoms included in the phenyl group or the hydrocarbon group bond with each other to form a ring structure together with —O—C—O— to which $R^{B3}$ and $R^{B4}$ bond.

$R^{B1}$ and $R^{B2}$ represent preferably a hydrogen atom, a phenyl group, a naphthyl group, an anthracenyl group and a chain hydrocarbon group having 1 to 30 carbon atoms, and more preferably a hydrogen atom, a phenyl group, and a chain hydrocarbon group having 1 to 10 carbon atoms.

Moreover, $R^{B1}$ and $R^{B2}$ preferably represent a ring structure together with the carbon atom to which $R^{B1}$ and $R^{B2}$ bond.

$R^{B3}$ and $R^{B4}$ represent preferably a substituted or unsubstituted phenyl group, or a chain hydrocarbon group having 1 to 30 carbon atoms, more preferably a substituted or unsubstituted phenyl group, or an alkyl group having 1 to 10 carbon atoms, and more preferably a substituted phenyl group, a methyl group or an ethyl group.

Examples of the substituent which may be included in $R^{B1}$ or $R^{B2}$ and the substituent which may be included in the phenyl group represented by $R^{B3}$ and $R^{B4}$ include an alkyl group having 1 to 12 carbon atoms, an alkoxy group having 1 to 5 carbon atoms, an amino group, an amide group, a hydroxy group, and the like. Of these, an alkyl group having 1 to 12 carbon atoms, and an alkoxy group having 1 to 5 carbon atoms are preferred, an alkyl group having 1 to 5 carbon atoms, and an alkoxy group having 1 to 5 carbon atoms are more preferred, and a methyl group, an ethyl group, a methoxy group and an ethoxy group are still more preferred.

Moreover, as the compound (B), compounds represented by the following formulae (i) to (iv) are preferred.

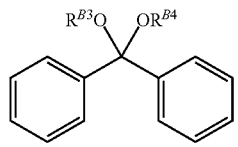

(i)

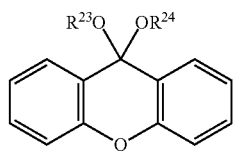

(ii)

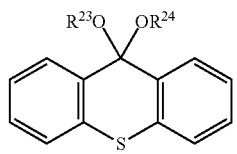

(iii)

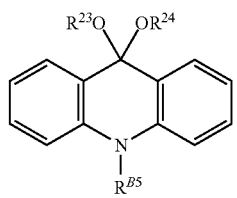

(iv)

In the above formula (i) to (iv), $R^{B3}$ and $R^{B4}$ are as defined in the above formula (B); and $R^{23}$ and $R^{24}$ are each as defined in $R^{B3}$ and $R^{B4}$. In the above formula (iv), $R^{B5}$ represents an alkyl group having 1 to 5 carbon atoms.

Examples of the compound (B) include compounds represented by the following formulae.

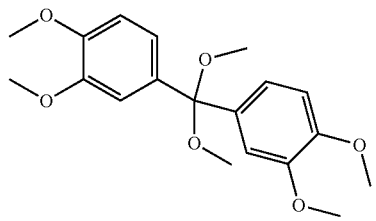

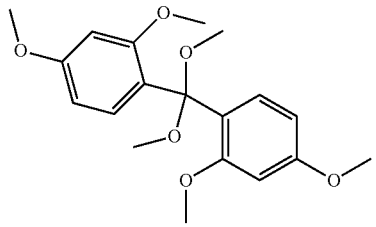

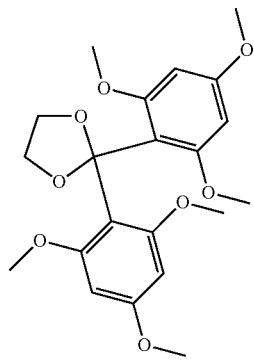

51
-continued
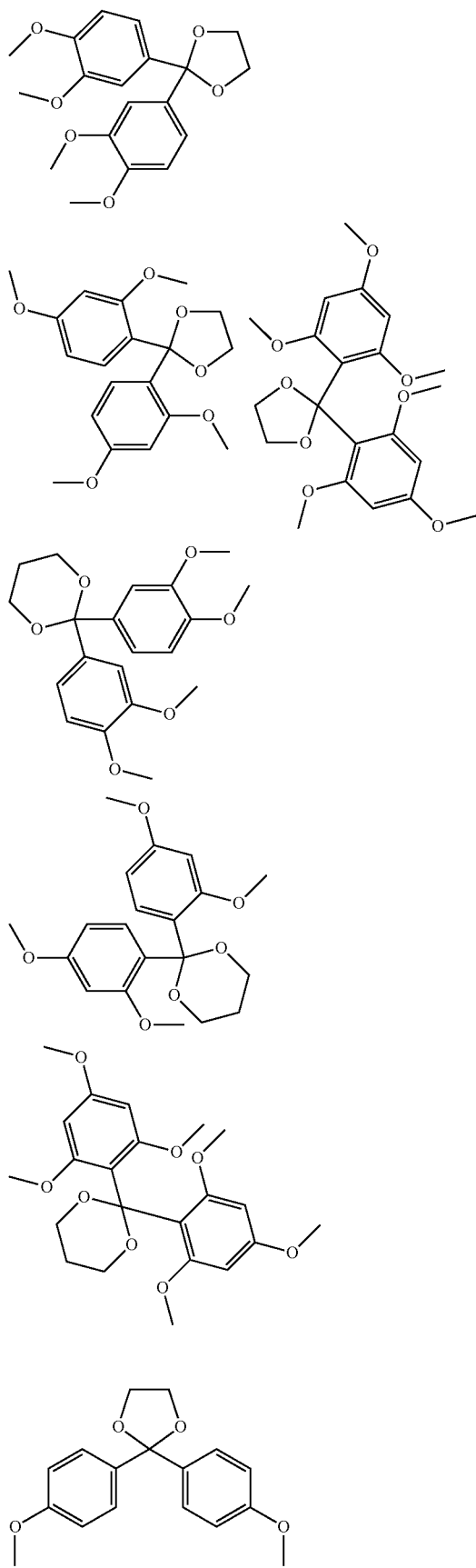
52
-continued
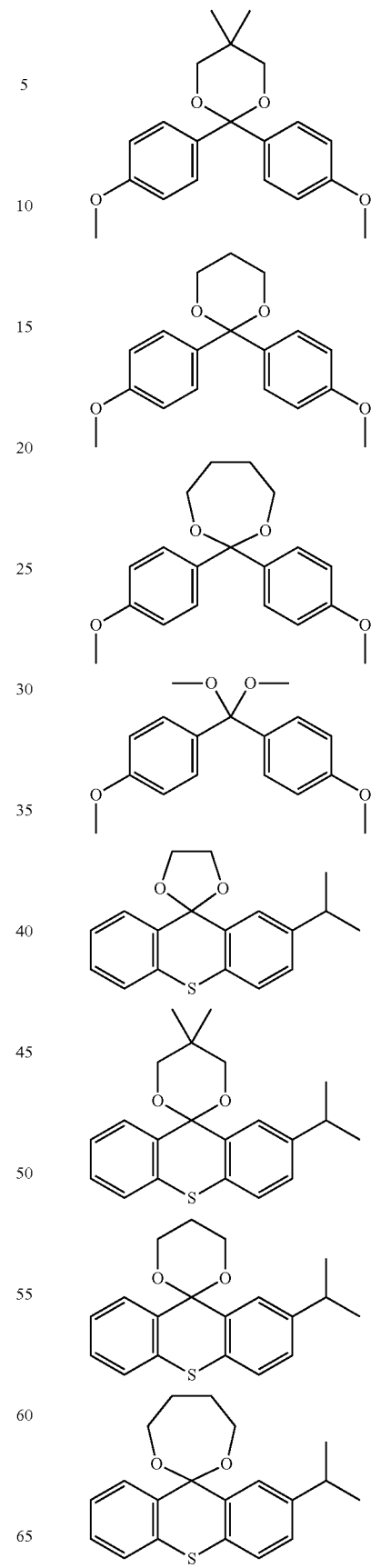

53
-continued
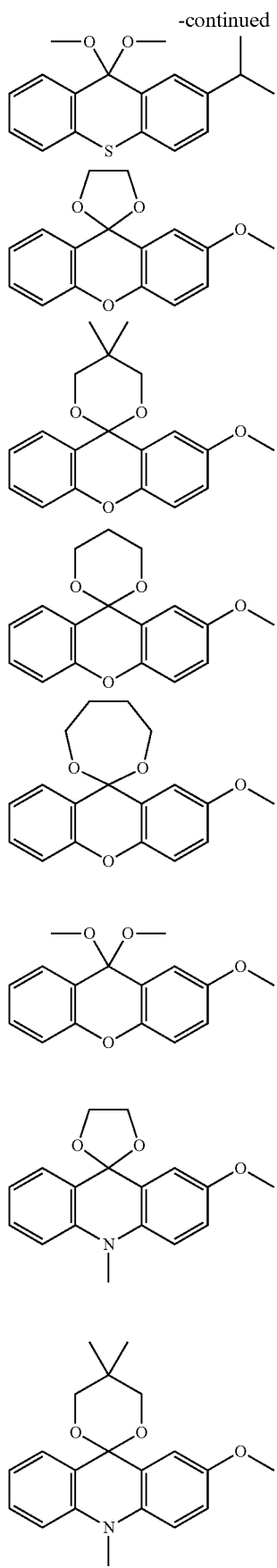
54
-continued
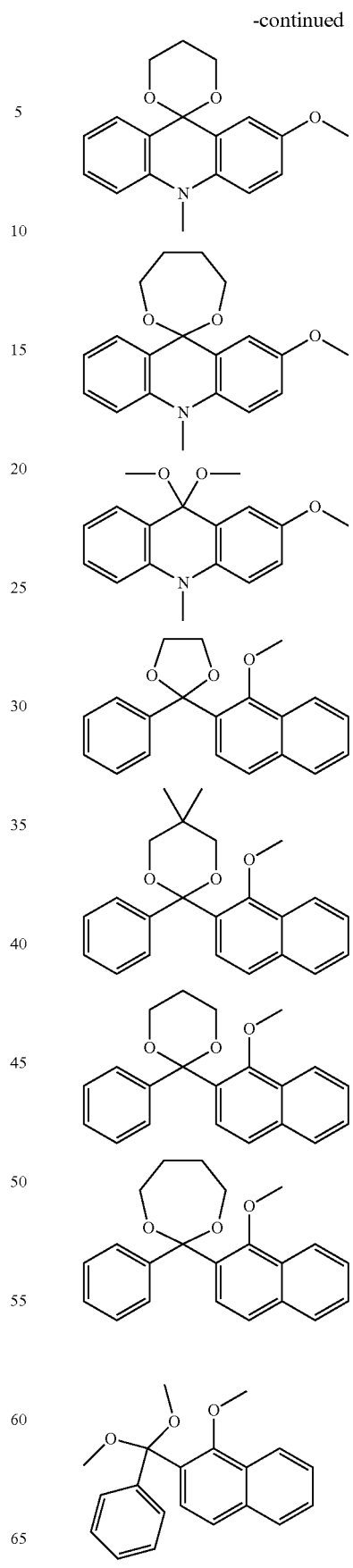

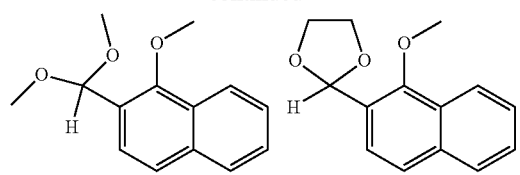
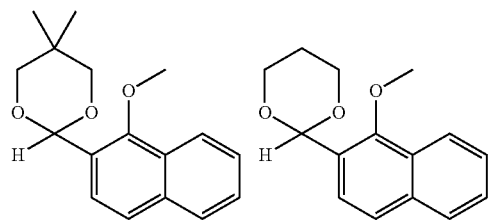
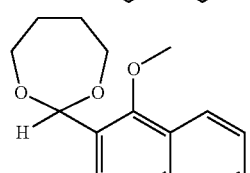
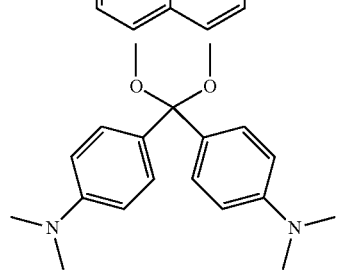
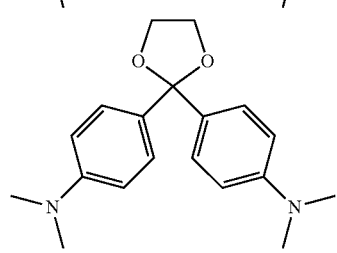
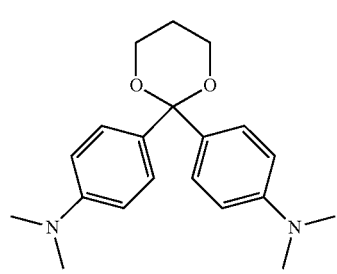
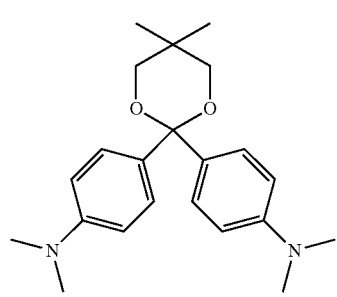
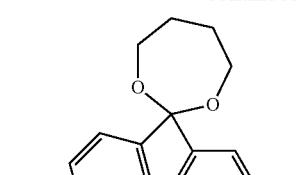
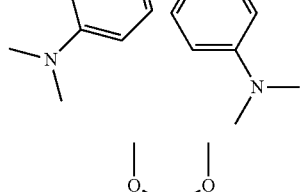
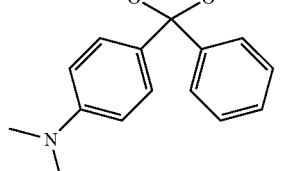
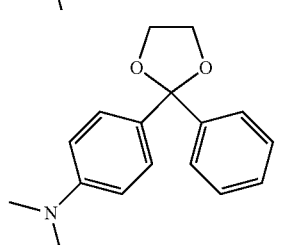
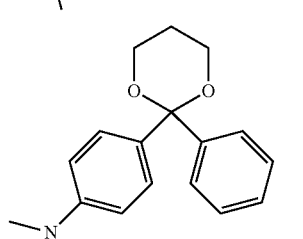
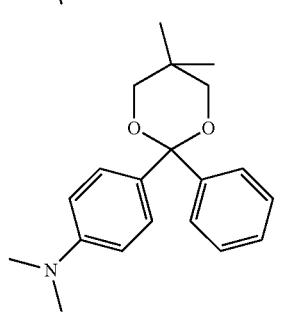
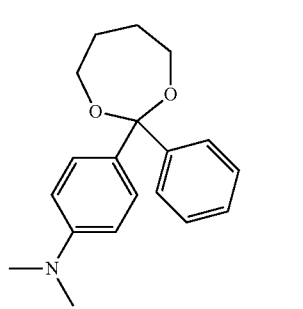

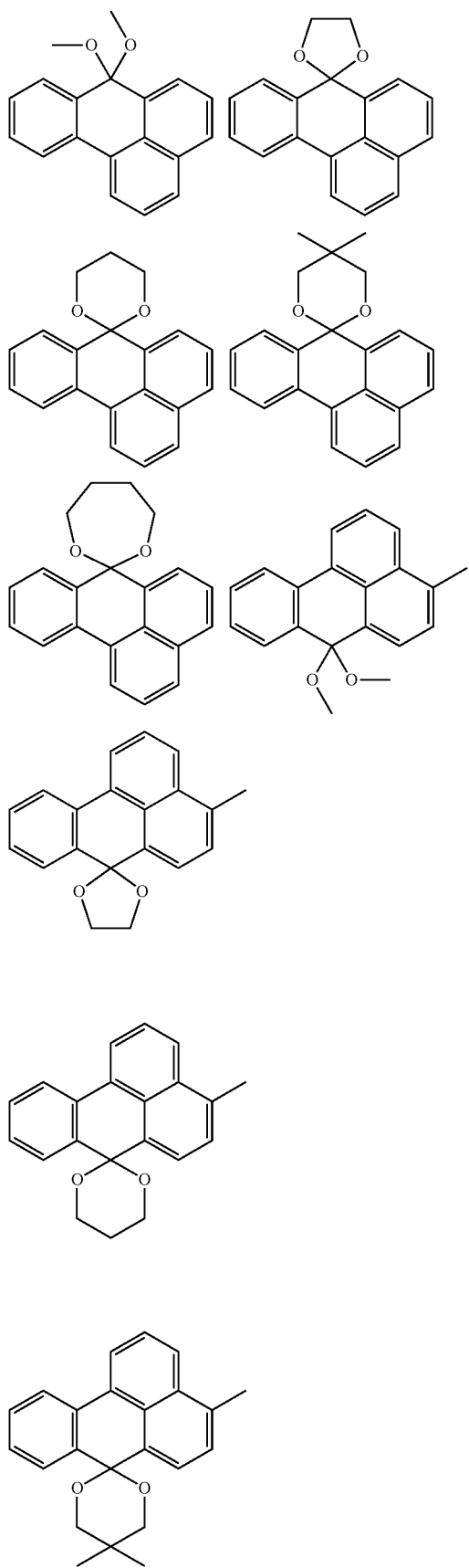
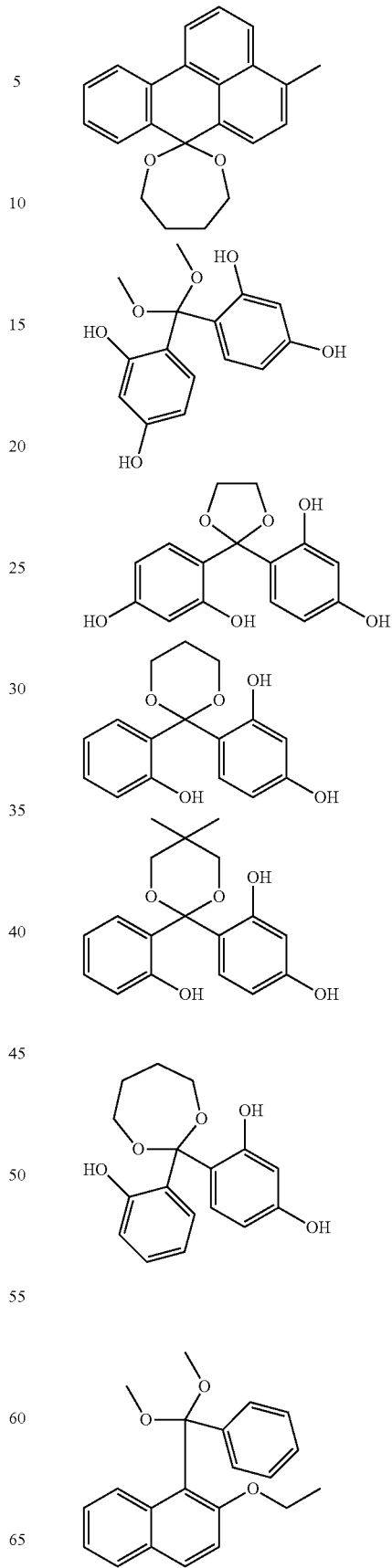

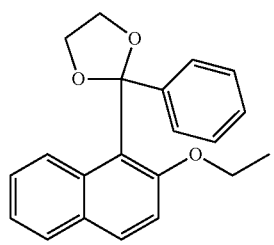
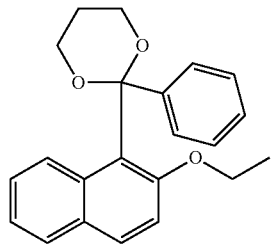
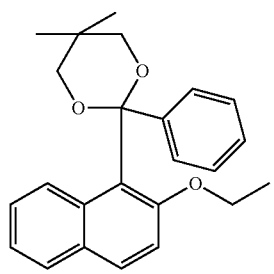
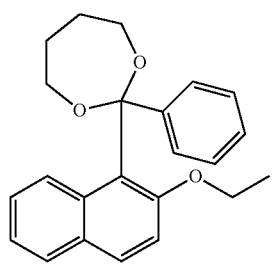
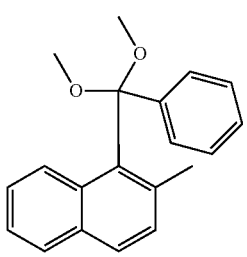
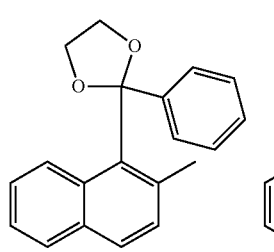
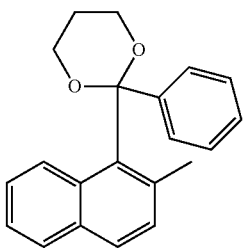
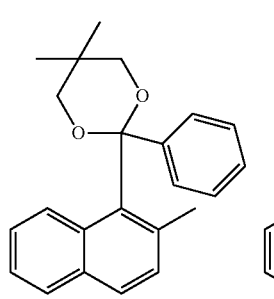
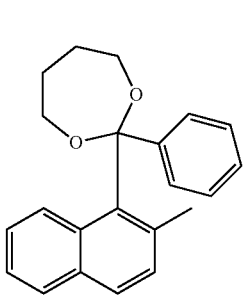
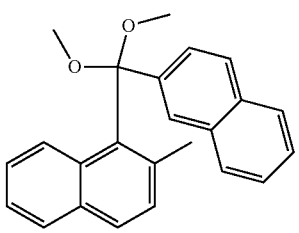
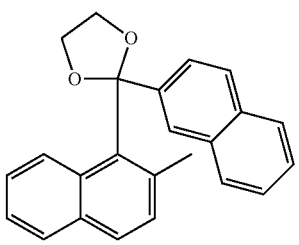
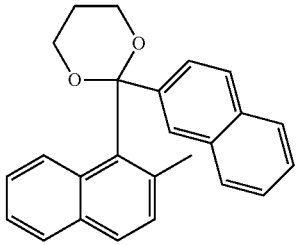
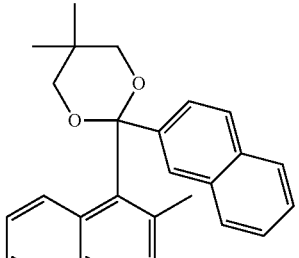
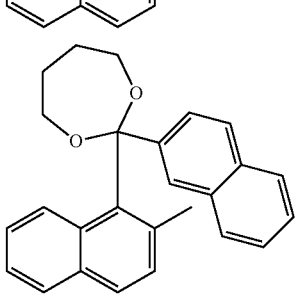
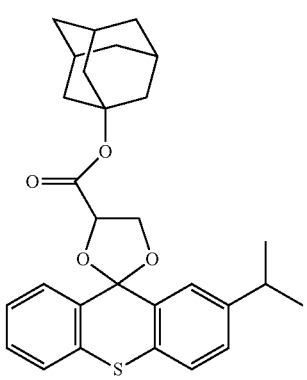

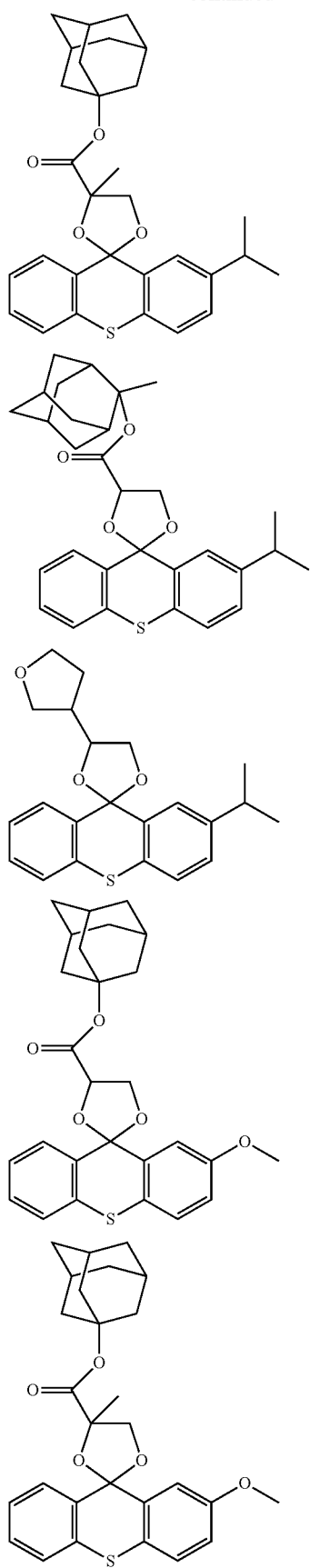
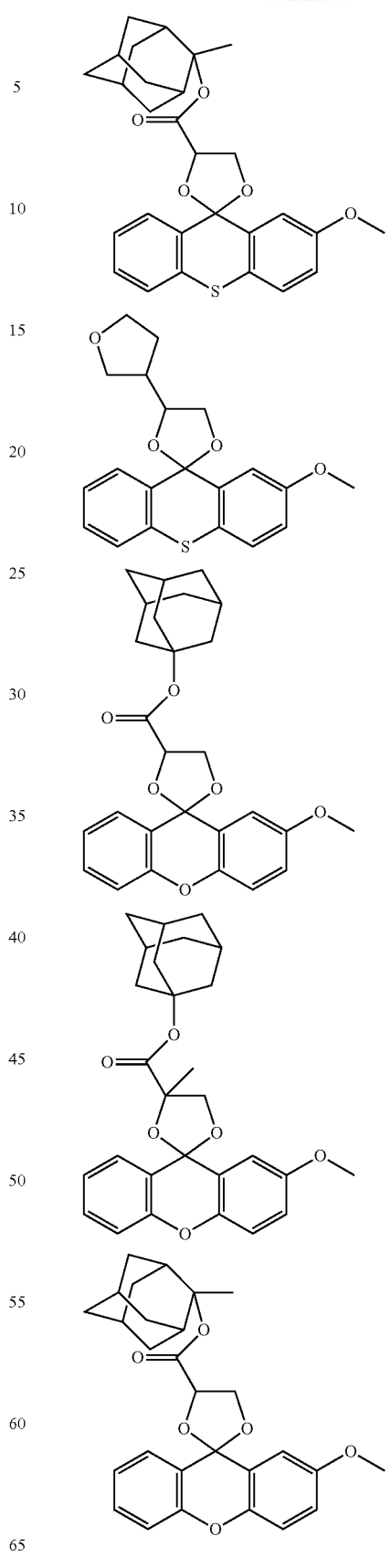

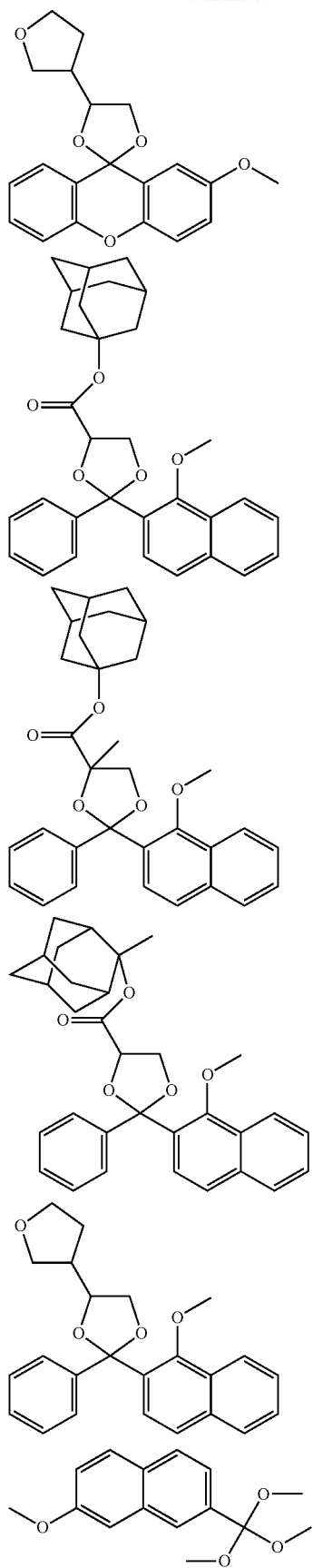
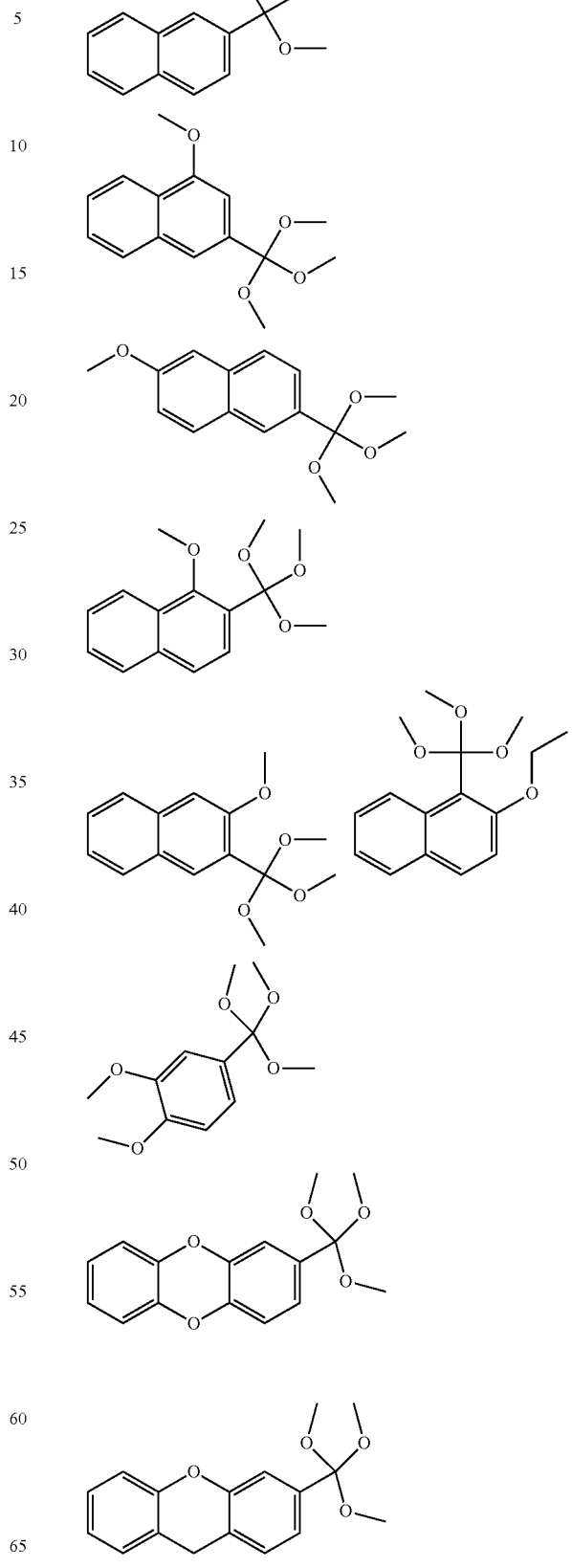

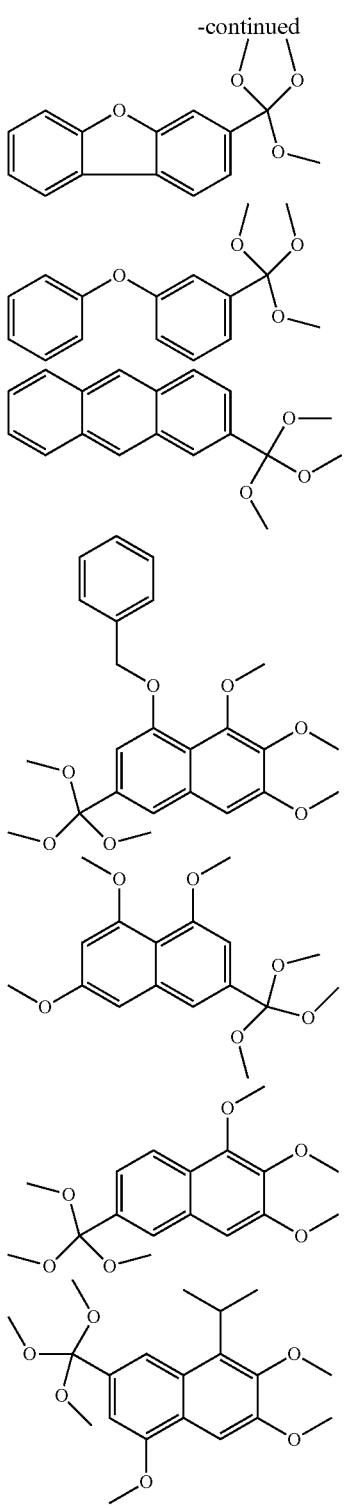

The radiation-sensitive sensitizer generating agent (b) may further contain a well-known radiation-sensitive sensitizer generating agent in addition to the compound (B). In this case, the lower limit of the proportion of the compound (B) contained in the radiation-sensitive sensitizer generating agent (b) is preferably 60 mol %, and more preferably 70 mol %. On the other hand, the upper limit of the proportion of the compound (B) contained in the radiation-sensitive sensitizer generating agent (b) is preferably 100 mol %.

When the proportion of the compound (B) contained in the radiation-sensitive sensitizer generating agent (b) is less than the lower limit, the sensitivity of the chemically amplified resist material may not be improved sufficiently.

In addition, the radiation-sensitive sensitizer generating agent (b) may be a part of the polymer constituting the polymer component (1). In this case, the radiation-sensitive sensitizer generating agent (b) is present in the form of a group obtained by eliminating one hydrogen atom from the aforementioned compound and bound to the polymer.

In the case where the radiation-sensitive sensitizer generating agent (b) is the component different from the polymer component (1), the lower limit of the amount of the radiation-sensitive sensitizer generating agent (b) blended with respect to 100 parts by mass of the polymer component (1) is preferably 0.005 parts by mass, and more preferably 0.1 parts by mass. On the other hand, the upper limit of the amount of the radiation-sensitive sensitizer generating agent (b) blended is preferably 50 parts by mass, and more preferably 30 parts by mass.

In the case where the radiation-sensitive sensitizer generating agent (b) is a part of the polymer constituting the polymer component (1), the lower limit of the proportion of the radiation-sensitive sensitizer generating agent (b) contained with respect to 1 mol of the polymer component (1) is preferably 0.001 mol, more preferably 0.002 mol, and still more preferably 0.01 mol. On the other hand, the upper limit of the radiation-sensitive sensitizer generating agent (b) contained is preferably 0.95 mol, and more preferably 0.3 mol.

When the amount of the radiation-sensitive sensitizer generating agent (b) blended or the proportion of the radiation-sensitive sensitizer generating agent (b) contained is less than the lower limit, the sensitivity may be deteriorated. To the contrary, when the amount of the radiation-sensitive sensitizer generating agent (b) blended or the proportion of the radiation-sensitive sensitizer generating agent (b) contained is greater than the upper limit, it may be difficult to form the resist film, and/or the rectangularity of the cross-sectional shape of the resist pattern may be deteriorated.

Radiation-Sensitive Sensitizer

The radiation-sensitive sensitizer is generated from the radiation-sensitive acid-and-sensitizer generating agent (a) or the radiation-sensitive sensitizer generating agent (b) upon the irradiation with the first radioactive ray in the patternwise exposure step, and can absorb the second radioactive ray in the floodwise exposure step to degrade (c) a radiation-sensitive acid generating agent.

Examples of the radiation-sensitive sensitizer include chalcone, 1,2-diketone, benzoin, benzophenone, fluorene, naphthoquinone, anthraquinone, xanthene, thioxanthene, xanthone, thioxanthone, cyanine, merocyanine, naphthalocyanine, subphthalocyanine, pyrylium, thiopyrylium, tetraphylline, annulene, spiropyran, spirooxazine, thiospiropyran, oxole, azine, thiazine, oxazine, indoline, azulene, azulenium, squarylium, porphyrin, porphyrazine, triarylmethane, phthalocyanine, acridone, coumarin, ketocoumarin, quinolinone, benzoxazole, acridine, thiazine, benzothiazole, phenothiazine, benzotriazole, perylene, naphthalene, anthracene, phenanthrene, pyrene, naphthacene, pentacene, coronene, and derivatives of these, and the like.

Moreover, the radiation-sensitive sensitizer preferably contains a carbonyl compound. The carbonyl compound preferably includes a ketone, an aldehyde, a carboxylic acid, an ester, an amide, an enone, a carboxylic acid chloride, or a carboxylic anhydride as the carbonyl group. Examples of the carbonyl compound include benzophenone derivatives, xanthone derivatives, thioxanthone derivatives, coumarin derivatives, acridone derivatives, and the like. Alternatively, the carbonyl compound may be a naphthalene derivative, an anthracene derivative, or an acridone derivative.

Further, at least one of hydrogen atoms of the aromatic ring included in the radiation-sensitive sensitizer is preferably substituted with an electron-donating group. When the hydrogen atom is substituted by the electron-donating group, an efficiency of an electron transfer through the sensitization reaction in the floodwise exposure step tends to be improved, leading to an improvement of the sensitivity of the chemically amplified resist material. In addition, a greater difference can be attained between the absorption wavelength of the radioactive ray which the radiation-sensitive acid-and-sensitizer generating agent (a) and the radiation-sensitive sensitizer generating agent (b) can absorb, and the absorption wavelength of the radioactive ray which the radiation-sensitive sensitizer can absorb, whereby the radiation-sensitive sensitizer can be excited more selectively in the floodwise exposure step. As a result of these, a contrast of a latent image of the acid in the chemically amplified resist material may be more improved. Examples of the electron-donating group include a hydroxyl group, a methoxy group, an alkoxy group, an amino group, an alkylamino group, an alkyl group, and the like.

Examples of the radiation-sensitive sensitizer include acetophenone, 2,2-dimethoxy-2-phenylacetophenone, diethoxyacetophenone, 1-hydroxycyclohexyl phenyl ketone, 1,2-hydroxy-2-methyl-1-phenylpropan-1-one, α-hydroxycyclohexyl phenyl ketone, 2-hydroxy-2-methyl-1-phenylpropanone, 2-hydroxy-2-methyl-1-(4-isopropylphenyl)propanone, 2-hydroxy-2-methyl-1-(4-dodecylphenyl)propanone, 2-hydroxy-2-methyl-1-[(2-hydroxyethoxy)phenyl]propanone, benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, 4-benzoyl-4'-methyldiphenyl sulfide, benzophenonetetracarboxylic acid or the tetramethyl ester thereof, 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone, benzil, anthraquinone, 2-t-butylanthraquinone, 2-methylanthraquinone, phenanthraquinone, fluorenone, 2-benzyl-2-dimethylamino-1-(4-morpholinophenyl)-1-butanone, 2-(dimethylamino)-2-[(4-methylphenyl)methyl]-1-[4-(4-morpholinyl)phenyl]-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, benzoin methyl ether, benzoin ethyl ether, benzoin propyl ether, benzoin isopropyl ether, benzoin isobutyl ether, benzoin phenyl ether, benzil dimethyl ketal, acridone, chloroacridone, N-methylacridone, N-butylacridone, N-butyl-chloroacridone, 2,4,6-trimethylbenzoyldiphenylphosphine oxide, 2,6-dimethoxybenzoyldiphenylphosphine oxide, 2,6-dichlorobenzoyldiphenylphosphine oxide, 2,4,6-trimethylbenzoylmethoxyphenylphosphine oxide, 2,4,6-trimethylbenzoylethoxyphenylphosphine oxide, 2,3,5,6-tetramethylbenzoyldiphenylphosphine oxide, bis-(2,6-dichlorobenzoyl)phenylphosphine oxide, bis-(2,6-dichlorobenzoyl)-2,5-dimethylphenylphosphine oxide, bis-(2,6-dichlorobenzoyl)-4-propylphenylphosphine oxide, bis-(2,6-dichlorobenzoyl)-1-naphthylphosphine oxide, bis-(2,6-dimethoxybenzoyl)phenylphosphine oxide, bis-(2,6-dimethoxybenzoyl)-2,4,4-trimethylpentylphosphine oxide, bis-(2,6-dimethoxybenzoyl)-2,5-dimethylphenylphosphine oxide, bis-(2,4,6-trimethylbenzoyl)phenylphosphine oxide, (2,5,6-trimethylbenzoyl)-2,4,4-trimethylpentylphosphine oxide, 2-isopropylthioxanthone, 4-isopropylthioxanthone, 2,4-diethylthioxanthone, 2,4-dichlorothioxanthone, 1-chloro-4-propoxythioxanthone, benzoyl di-(2,6-dimethylphenyl)phosphonate, 1-[4-(phenylthio)phenyl]-1,2-octanedione-2-(O-benzoyloxime), 1-[9-ethyl-6-(2-methylbenzoyl)-9H-carbazol-3-yl]ethanone-1-(O-acetyloxime), 1-[9-ethyl-6-(2-methylbenzoyl)-9H-carbazol-3-yl]-3-cyclopentylpropanone-1-(O-acetyloxime), 1-[4-(phenylthio)phenyl]-3-cyclopentylpropane-1,2-dione-2-(O-benzoyloxime), 2,2-dimethoxy-1,2-diphenylethan-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)-benzyl]phenyl}-2-methyl-propan-1-one, phenylglyoxylic acid methyl ester, 2-methyl-1-(4-methylthiophenyl)-2-morpholinopropan-1-one, 2-benzyl-2-dimethylamino-1-(4-morpholinophenyl)-butanone-1, 1.2-octanedione, 1-[4-(phenylthio)-, 2-(O-benzoyloxime)], ethanone, 1-[9-ethyl-6-(2-methylbenzoyl)-9H-carbazol-3-yl]-, 1-(O-acetyloxime), and the like.

(c) Radiation-Sensitive Acid Generating Agent

The radiation-sensitive acid generating agent (c) generates an acid upon the irradiation with the first radioactive ray, and substantially does not generate the acid upon the irradiation with the second radioactive ray in the light-unexposed regions which are not irradiated with the first radioactive ray in the patternwise exposure step; thus, the radiation-sensitive acid generating agent (c) is different from the radiation-sensitive acid-and-sensitizer generating agent (a).

The radiation-sensitive acid generating agent (c) is exemplified by an onium salt compound, an N-sulfonyloxyimide compound, sulfonimide compound, a halogen-containing compound, a diazo ketone compound, and the like.

The onium salt compound is exemplified by a sulfonium salt, a tetrahydrothiophenium salt, an iodonium salt, a phosphonium salt, a diazonium salt, a pyridinium salt, and the like.

Specific examples of the radiation-sensitive acid generating agent (c) include compounds disclosed in paragraphs [0080] to [0113] of Japanese Unexamined Patent Application, Publication No. 2009-134088, and the like.

The radiation-sensitive acid generating agent (c) is preferably an acid generating agent represented by the following formula (c). When the radiation-sensitive acid generating agent (c) has the following structure, it is believed that due to an interaction, etc., with the structural unit (I) or structural unit (II) of the polymer (A), the diffusion length of the acid, which is generated in the patternwise exposure step, in the resist film would decrease moderately, and consequently performances such as the depth of focus of the chemically amplified resist material would be improved.

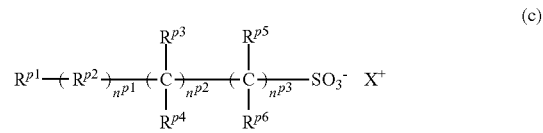

(c)

In the above formula (c), $R^{p1}$ represents a monovalent group that includes a ring structure having 6 or more ring atoms; $R^{p2}$ represents a divalent linking group; $R^{p3}$ and $R^{p4}$ each independently represent a hydrogen atom, a fluorine atom, a monovalent hydrocarbon group having 1 to 20 carbon atoms or a monovalent fluorinated hydrocarbon group having 1 to 20 carbon atoms; $R^{p5}$ and $R^{p6}$ each independently represent a fluorine atom or a monovalent fluorinated hydrocarbon group having 1 to 20 carbon atoms; $n^{p1}$ is an integer of 0 to 10; $n^{p2}$ is an integer of 0 to 10; $n^{p3}$ is an integer of 1 to 10, wherein in a case where $n^{p1}$ is no less than 2, a plurality of $R^{p2}$s may be identical or different, wherein in a case where $n^{p2}$ is no less than 2, a plurality of $R^{p3}$s may be identical or different, and a plurality of $R^{p4}$s may be identical or different, and wherein in a case where $n^{p3}$ is no less than 2, a plurality of $R^{p5}$s may be identical or different, and a plurality of $R^{p6}$s may be identical or different; and $X^+$ represents a monovalent radiation-sensitive onium cation.

The monovalent group that includes ring structure having 6 or more ring atoms, which is represented by $R^{p1}$ is exemplified by a monovalent group that includes an alicyclic structure having 6 or more ring atoms, a monovalent group that includes an aliphatic heterocyclic structure having 6 or more ring atoms, a monovalent group that includes an aromatic ring structure having 6 or more ring atoms, a monovalent group that includes an aromatic heterocyclic structure having 6 or more ring atoms, and the like.

Examples of the alicyclic structure having 6 or more ring atoms include:

monocyclic cycloalkane structures such as a cyclohexane structure, a cycloheptane structure, a cyclooctane structure, a cyclononane structure, a cyclodecane structure and a cyclododecane structure;

monocyclic cycloalkene structures such as a cyclohexene structure, a cycloheptene structure, a cyclooctene structure and a cyclodecene structure;

polycyclic cycloalkane structures such as a norbornane structure, an adamantane structure, a tricyclodecane structure and a tetracyclododecane structure;

polycyclic cycloalkene structures such as a norbornene structure and a tricyclodecene structure; and the like.

Examples of the aliphatic heterocyclic structure having 6 or more ring atoms include:

lactone structures such as a hexanolactone structure and a norbornanelactone structure;

sultone structures such as a hexanosultone structure and a norbornanesultone structure;

oxygen atom-containing heterocyclic structures such as an oxacycloheptane structure and an oxanorbornane structure;

nitrogen atom-containing heterocyclic structures such as an azacyclohexane structure and a diazabicyclooctane structure;

sulfur atom-containing heterocyclic structures such as a thiacyclohexane structure and a thianorbornane structure; and the like.

Examples of the aromatic ring structure having 6 or more ring atoms include a benzene structure, a naphthalene structure, a phenanthrene structure, an anthracene structure, and the like.

Examples of the aromatic heterocyclic structure having 6 or more ring atoms include: oxygen atom-containing heterocyclic structures such as a furan structure, a pyran structure and a benzopyran structure; nitrogen atom-containing heterocyclic structures such as a pyridine structure, a pyrimidine structure and an indole structure; and the like.

The lower limit of the number of ring atoms of the ring structure in $R^{p1}$ is preferably 7, more preferably 8, still more preferably 9, and particularly preferably 10. On the other hand, the upper limit of the number of ring atoms of the ring structure in $R^{p1}$ is preferably 15, more preferably 14, still more preferably 13, and particularly preferably 12. When the number of ring atoms falls within the above range, the abovementioned diffusion length of the acid can be decreased further moderately, and consequently various types of performances of the chemically amplified resist material can be more improved.

A part or all of hydrogen atoms included in the ring structure in $R^{p1}$ may be substituted with a substituent. Examples of the substituent include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like. Of these, a hydroxy group is preferred.

Of these, $R^{p1}$ represents preferably a monovalent group that includes an alicyclic structure having 6 or more ring atoms or a monovalent group that includes an aliphatic heterocyclic structure having 6 or more ring atoms, more preferably a monovalent group that includes an alicyclic structure having 9 or more ring atoms or a monovalent group that includes an aliphatic heterocyclic structure having 9 or more ring atoms, still more preferably an adamantyl group, a hydroxyadamantyl group, a norbornanelacton-yl group, a norbornanesultone-yl group or a 5-oxo-4-oxatricyclo[4.3.1.1$^{3,8}$]undecan-yl group, and particularly preferably an adamantyl group.

Examples of the divalent linking group represented by $R^{p1}$ include a carbonyl group, an ether group, a carbonyloxy group, a sulfide group, a thiocarbonyl group, a sulfonyl group, a divalent hydrocarbon group, and the like. The divalent linking group represented by $R^{p1}$ is preferably a carbonyloxy group, a sulfonyl group, an alkanediyl group or a cycloalkanediyl group, more preferably a carbonyloxy group or a cycloalkanediyl group, still more preferably a carbonyloxy group or a norbornanediyl group, and particularly preferably a carbonyloxy group.

The monovalent hydrocarbon group having 1 to 20 carbon atoms which may be represented by $R^{p3}$ or $R^{p4}$ is exemplified by an alkyl group having 1 to 20 carbon atoms, and the like. The monovalent fluorinated hydrocarbon group having 1 to 20 carbon atoms which may be represented by $R^{p3}$ or $R^{p4}$ is exemplified by a fluorinated alkyl group having 1 to 20 carbon atoms, and the like. $R^{p3}$ and $R^{p4}$ each independently represent preferably a hydrogen atom, the fluorine atom or the fluorinated alkyl group, more preferably the fluorine atom or the perfluoroalkyl group, and still more preferably the fluorine atom or the trifluoromethyl group.

The monovalent fluorinated hydrocarbon group having 1 to 20 carbon atoms which may be represented by $R^{p5}$ or $R^{p6}$ is exemplified by a fluorinated alkyl group having 1 to 20 carbon atoms, and the like. $R^{p5}$ and $R^{p6}$ each independently represent preferably a fluorine atom or a fluorinated alkyl group, more preferably a fluorine atom or a perfluoroalkyl group, still more preferably a fluorine atom or a trifluoromethyl group, and particularly preferably a fluorine atom.

In the above formula (c), $n^{p1}$ is preferably an integer of 0 to 5, more preferably an integer of 0 to 3, still more preferably an integer of 0 to 2, and particularly preferably 0 or 1.

In the above formula (c), $n^{p2}$ is preferably an integer of 0 to 5, more preferably an integer of 0 to 2, still more preferably 0 or 1, and particularly preferably 0.

In the above formula (c), $n^{p3}$ is preferably an integer of 1 to 5, more preferably an integer of 1 to 4, still more preferably an integer of 1 to 3, and particularly preferably 1 or 2.

The monovalent radiation-sensitive onium cation represented by $X^+$ is degraded by the irradiation with the exposure light. In the light-exposed regions, a sulfonic acid is generated from the sulfonate anion, and a proton generated through the degradation of the photo-labile onium cation. The monovalent radiation-sensitive onium cation represented by $X^+$ is exemplified by a cation represented by the following formula (c-a) (hereinafter, may be also referred to as "cation (c-a)"), a cation represented by the following formula (c-b) (hereinafter, may be also referred to as "cation (c-b)"), a cation represented by the following formula (c-c) (hereinafter, may be also referred to as "cation (c-c)"), and the like.

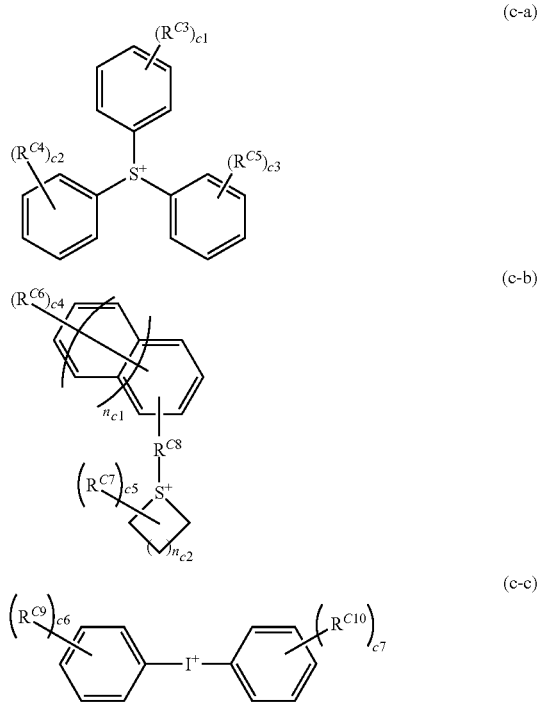

In the above formula (c-a), $R^{C3}$, $R^{C4}$ and $R^{C5}$ each independently represent a substituted or unsubstituted linear or branched alkyl group having 1 to 12 carbon atoms, a substituted or unsubstituted aromatic hydrocarbon group having 6 to 12 carbon atoms, $-OSO_2-R^{CC1}$ or $-SO_2-R^{CC2}$, or at least two of $R^{C3}$, $R^{C4}$ and $R^{C5}$ taken together represent a ring structure; $R^{CC1}$ and $R^{CC2}$ each independently represent a substituted or unsubstituted linear or branched alkyl group having 1 to 12 carbon atoms, a substituted or unsubstituted alicyclic hydrocarbon group having 5 to 25 carbon atoms, or a substituted or unsubstituted aromatic hydrocarbon group having 6 to 12 carbon atoms; and c1, c2 and c3 are each independently an integer of 0 to 5, wherein in a case where $R^{C3}$ to $R^{C5}$ and $R^{CC1}$ and $R^{CC2}$ are each present in a plurality of number, a plurality of $R^{C3}$s may be identical or different, a plurality of $R^{C4}$s may be identical or different, a plurality of $R^{C5}$s may be identical or different, a plurality of $R^{CC1}$s may be identical or different, and a plurality of $R^{CC2}$s may be identical or different.

In the above formula (c-b), $R^{C6}$ represents a substituted or unsubstituted linear or branched alkyl group having 1 to 8 carbon atoms or a substituted or unsubstituted aromatic hydrocarbon group having 6 to 8 carbon atoms; c4 is an integer of 0 to 7, wherein in a case where $R^{C6}$ is present in a plurality of number, a plurality of $R^{C6}$s may be identical or different, or the plurality of $R^{C6}$s may taken together represent a ring structure; $R^{C7}$ represent a substituted or unsubstituted linear or branched alkyl group having 1 to 7 carbon atoms or a substituted or unsubstituted aromatic hydrocarbon group having 6 or 7 carbon atoms; c5 is an integer of 0 to 6, wherein in a case where $R^{C7}$ is present in a plurality of number, a plurality of $R^{C7}$s may be identical or different, or the plurality of $R^{C7}$ may taken together represent a ring structure; $n_{c2}$ is an integer of 0 to 3; $R^{C8}$ represents a single bond or a divalent organic group having 1 to 20 carbon atoms; and $n_{c1}$ is an integer of 0 to 2.

In the above formula (c-c), $R^{C9}$ and $R^{C10}$ each independently represent a substituted or unsubstituted linear or branched alkyl group having 1 to 12 carbon atoms, a substituted or unsubstituted aromatic hydrocarbon group having 6 to 12 carbon atoms, $-OSO_2-R^{CC3}$ or $-SO_2-R^{CC4}$, or $R^{C9}$ and $R^{C10}$ taken together represent a ring structure; $R^{CC3}$ and $R^{CC4}$ each independently represent a substituted or unsubstituted linear or branched alkyl group having 1 to 12 carbon atoms, a substituted or unsubstituted alicyclic hydrocarbon group having 5 to 25 carbon atoms, or a substituted or unsubstituted aromatic hydrocarbon group having 6 to 12 carbon atoms; and c6 and c7 are each independently an integer of 0 to 5, wherein in a case where $R^{C9}$, $R^{C10}$, $R^{CC3}$ and $R^{CC4}$ are each present in a plurality of number, a plurality of $R^{C9}$s may be identical or different, a plurality of $R^{C10}$s may be identical or different, a plurality of $R^{CC3}$s may be identical or different, and a plurality of $R^{CC4}$s may be identical or different.

Examples of the unsubstituted linear alkyl group which may be represented by $R^{C3}$, $R^{C4}$, $R^{C5}$, $R^{C6}$, $R^{C7}$, $R^{C9}$ or $R^{C10}$ include a methyl group, an ethyl group, a n-propyl group, a n-butyl group, and the like.

Examples of the unsubstituted branched alkyl group which may be represented by $R^{C3}$, $R^{C4}$, $R^{C5}$, $R^{C6}$, $R^{C7}$, $R^{C9}$ or $R^{C10}$ include an i-propyl group, an i-butyl group, a sec-butyl group, a t-butyl group, and the like.

Examples of the unsubstituted aromatic hydrocarbon group which may be represented by $R^{C3}$, $R^{C4}$, $R^{C5}$, $R^{C9}$ or $R^{C10}$ include:

aryl groups such as a phenyl group, a tolyl group, a xylyl group, a mesityl group and a naphthyl group;

aralkyl groups such as a benzyl group and a phenethyl group; and the like.

Examples of the unsubstituted aromatic hydrocarbon group which may be represented by $R^{C6}$ or $R^{C7}$ include a phenyl group, a tolyl group, a benzyl group, and the like.

The divalent organic group represented by $R^{C8}$ is exemplified by a group obtained by eliminating one hydrogen atom from the monovalent organic group having 1 to 20 carbon atoms which is exemplified in connection with $R^{AF2}$ in the formula (af) in the structural unit (III) of the polymer (A), and the like.

Examples of the substituent which may substitute for a hydrogen atom included in the alkyl group or the aromatic hydrocarbon group include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like. Of these, halogen atoms are preferred, and a fluorine atom is more preferred.

$R^{C3}$, $R^{C4}$, $R^{C5}$, $R^{C6}$, $R^{C7}$, $R^{C9}$ and $R^{C10}$ each independently represent preferably an unsubstituted linear or branched alkyl group, a fluorinated alkyl group, an unsubstituted monovalent aromatic hydrocarbon group, —$OSO_2$—$R^{BB5}$, or —$SO_2$—$R^{BB5}$, more preferably a fluorinated alkyl group or an unsubstituted monovalent aromatic hydrocarbon group, and still more preferably a fluorinated alkyl group. $R^{BB5}$ represents an unsubstituted monovalent alicyclic hydrocarbon group or an unsubstituted monovalent aromatic hydrocarbon group.

In the formula (c-a), c1, c2 and c3 are preferably an integer of 0 to 2, more preferably 0 or 1, and still more preferably 0. In the formula (c-b), c4 is preferably an integer of 0 to 2, more preferably 0 or 1, and still more preferably 1; c5 is preferably an integer of 0 to 2, more preferably 0 or 1, and still more preferably 0; $n_{c2}$ is preferably 2 or 3, and more preferably 2; and $n_{c1}$ is preferably 0 or 1, and more preferably 0. In the formula (c-c), c6 and c7 are preferably an integer of 0 to 2, more preferably 0 or 1, and still more preferably 0.

Of these, as $X^+$, the cation (c-a) and the cation (c-b) are preferred, and a diphenyliodonium cation, a triphenylsulfonium cation, a 1-[2-(4-cyclohexylphenylcarbonyl)propan-2-yl]tetrahydrothiophenium cation, and a 4-cyclohexylsulfonylphenyldiphenylsulfonium cation are more preferred.

Examples of the acid generating agent represented by the above formula (c) include compounds represented by the following formulae (c1) to (c16) (hereinafter, may be also referred to as "compounds (c1) to (c16)"), and the like.

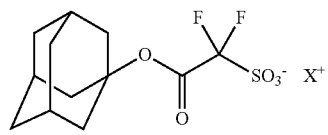
(c1)

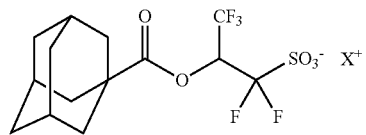
(c2)

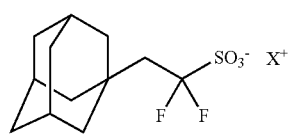
(c3)

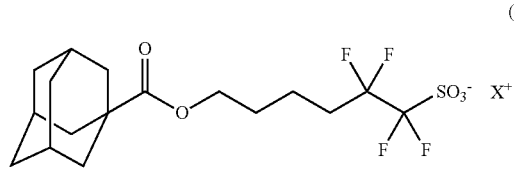
(c4)

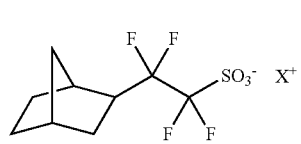
(c5)

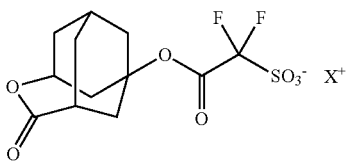
(c6)

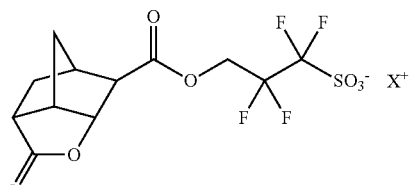
(c7)

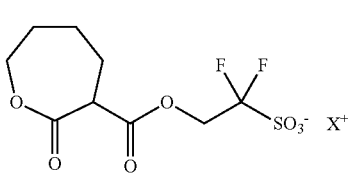
(c8)

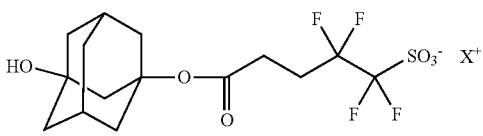
(c9)

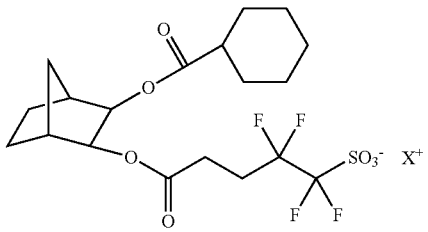
(c10)

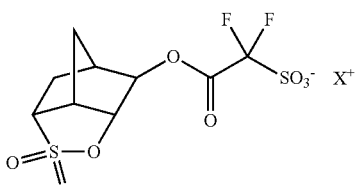
(c11)

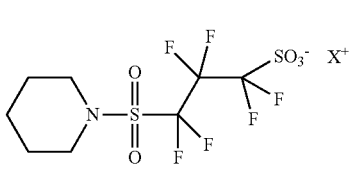
(c12)

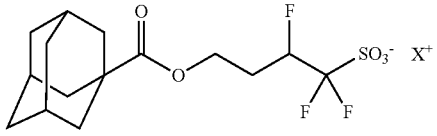
(c13)

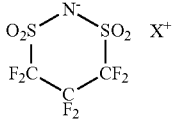
(c14)

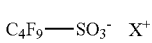
(c15)

-continued

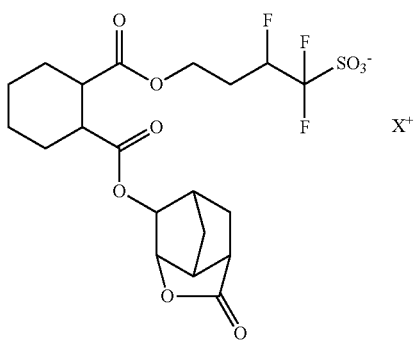

(C16)

In the above formulae (c1) to (c16), $X^+$ represents a monovalent radiation-sensitive onium cation.

As the radiation-sensitive acid generating agent (c), the onium salt compound is preferred, the sulfonium salt compound and the iodonium salt more preferred, and the compounds (c5), (c14), (c15) and (c16) are still more preferred.

Alternatively, the radiation-sensitive acid generating agent (c) may be a part of the polymer constituting the polymer component (1). In this case, the radiation-sensitive acid generating agent (c) is present in the form of a group obtained by eliminating one hydrogen atom from the aforementioned compound and bound to the polymer.

In the case where the radiation-sensitive acid generating agent (c) is the component different from the polymer component (1), the lower limit of the amount of the radiation-sensitive acid generating agent (c) blended with respect to 100 parts by mass of the polymer component (1) is preferably 0.01 parts by mass, and more preferably 0.1 parts by mass. On the other hand, the upper limit of the amount of the radiation-sensitive acid generating agent (c) blended is preferably 50 parts by mass, and more preferably 30 parts by mass.

In the case where the radiation-sensitive acid generating agent (c) is a part of the polymer constituting the polymer component (1), the lower limit of the proportion of the radiation-sensitive acid generating agent (c) contained with respect to 1 mol of the polymer component (1) is preferably 0.001 mol, more preferably 0.002 mol, and still more preferably 0.01 mol. On the other hand, the upper limit of the proportion of the radiation-sensitive acid generating agent (c) contained is preferably 0.5 mol, and more preferably 0.3 mol.

When the amount of the radiation-sensitive acid generating agent (c) blended or the proportion of the radiation-sensitive acid generating agent (c) contained is less than the lower limit, the sensitivity may be deteriorated. To the contrary, when the amount of the radiation-sensitive acid generating agent (c) blended or the proportion of the radiation-sensitive acid generating agent (c) contained is greater than the upper limit, it may be difficult to form the resist film, and/or the rectangularity of the cross-sectional shape of the resist pattern may be deteriorated.

Acid Diffusion Control Agent

The acid diffusion control agent traps an acid and a cation, and serves as a quencher. When the chemically amplified resist material contains the acid diffusion control agent, a surplus acid generated in the resist film can be neutralized, whereby a chemical contrast of the latent image of the acid between the patternwise exposed regions and the patternwise unexposed regions can be increased.

The acid diffusion control agent can be classified into a radioactive ray-reactive compound and a radioactive ray-unreactive compound.

The radioactive ray-unreactive compound is preferably a basic compound. The basic compound is exemplified by hydroxide compounds, carboxylate compounds, amine compounds, imine compounds, amide compounds, and the like, and more specifically, primary to tertiary aliphatic amines, aromatic amines, heterocyclic amines, nitrogen-containing compounds that include a carboxyl group, nitrogen-containing compounds that include a sulfonyl group, nitrogen-containing compounds that include a hydroxyl group, nitrogen-containing compounds that include a hydroxyphenyl group, alcoholic nitrogen-containing compounds, nitrogen-containing compounds that include a carbamate group, amide compounds, imide compounds, and the like. Of these, nitrogen-containing compounds that include a carbamate group are preferred.

Moreover, the radioactive ray-reactive compound is classified into a compound that is degraded by a radioactive ray to lose acid diffusion controllability (radioactive ray-degradable compound) and a compound that is generated by a radioactive ray to acquire acid diffusion controllability (radioactive ray-generable compound).

When the radioactive ray-degradable compound is degraded only in the patternwise exposed regions in the patternwise exposure step, the effect of trapping the acid and the cation is deteriorated in the patternwise exposed regions, whereas the effect of trapping the acid and the cation is maintained in the patternwise unexposed regions. Accordingly, a chemical contrast of the latent image of the acid between the light-exposed regions and the light-unexposed regions can be improved.

The radioactive ray-degradable compound is preferably a sulfonic acid salt or carboxylic acid salt containing a radioactive ray-degradable cation. As the sulfonic acid in the sulfonic acid salt, a weaker acid is preferred, and a sulfonic acid that includes a hydrocarbon group having 1 to 20 carbon atoms, and not having a fluorine atom is more preferred. Examples of the sulfonic acid include sulfonic acids such as alkylsulfonic acids, benzenesulfonic acid and 10-camphorsulfonic acid. As the carboxylic acid in the carboxylic acid salt, a weaker acid is preferred, and a carboxylic acid having 1 to 20 carbon atoms is more preferred. Examples of the carboxylic acid include carboxylic acids such as formic acid, acetic acid, propionic acid, tartaric acid, succinic acid, cyclohexylcarboxylic acid, benzoic acid and salicylic acid. The radioactive ray-degradable cation in the carboxylic acid salt containing the radioactive ray-degradable cation is preferably an onium cation, and examples of the onium cation include iodonium cations, sulfonium cations, and the like.

When the radioactive ray-generable compound is generated only in the patternwise exposed regions in the patternwise exposure step, the effect of trapping the acid and the cation is exerted in the patternwise exposed regions, but not in the patternwise unexposed regions.

Alternatively, the radioactive ray-generable compound may be a radioactive ray-generable compound that is not generated in the patternwise exposure step but is generated in the floodwise exposure step. In this case, the radiation-sensitive sensitizer can be generated efficiently in the regions light-exposed in the patternwise exposure step, and additionally an unnecessary acid and cation in the regions unexposed to light in floodwise exposure step can be trapped.

The radioactive ray-generable compound is preferably a compound that is capable of generating a base upon an exposure (radiation-sensitive base generating agent), and more preferably a nitrogen-containing organic compound that is capable of generating an amino group.

Examples of the radiation-sensitive base generating agent include compounds disclosed in Japanese Unexamined Patent Application, Publication Nos. H4-151156, H4-162040, H5-197148, H5-5995, H6-194834, H8-146608 and H10-83079, and European patent No. 622682.

Moreover, the radiation-sensitive base generating agent is exemplified by a compound that includes a carbamate group (urethane bond), a compound that includes an acyloxyimino group, an ionic compound (anion-cation complex), a compound that includes a carbamoyloxyimino group, and the like, and a compound that includes a carbamate group (urethane bond), a compound that includes an acyloxyimino group, and an ionic compound (anion-cation complex) are preferred.

Further, as the radiation-sensitive base generating agent, a compound having a ring structure in a molecule thereof is preferred. Examples of the ring structure include benzene, naphthalene, anthracene, xanthone, thioxanthone, anthraquinone, fluorene, and the like.

Alternatively, the acid diffusion control agent may be a compound that is generated through a thermal reaction to acquire acid diffusion controllability (thermally-generable compound). In this case, it is desired that the acid diffusion control agent is generated in the baking step performed after the floodwise exposure step. In light of the acid diffusion control agent thus acquiring the acid diffusion controllability in the baking step, the heating temperature in the baking step described later is preferably higher than the heating temperatures in other steps.

The lower limit of the amount of the acid diffusion control agent blended with respect to 100 parts by mass of the polymer component (1) is preferably 0.001 parts by mass, and more preferably 0.01 parts by mass. On the other hand, the upper limit of the amount of the acid diffusion control agent blended is preferably 20 parts by mass, and more preferably 10 parts by mass. When the amount of the acid diffusion control agent blended is less than the lower limit, the acid diffusion control agent may not be capable of trapping the acid and the cation satisfactorily. To the contrary, when the amount of the acid diffusion control agent blended is greater than the upper limit, the sensitivity may be unduly decreased.

Radical Trapping Agent

The radical trapping agent traps a free radical. When the chemically amplified resist material contains the radical trapping agent, the generation of the radiation-sensitive sensitizer through a reaction mediated by the radical in the patternwise unexposed regions can be reduced, leading to a greater improvement of a contrast in terms of acid concentration between the patternwise exposed regions and the light-unexposed regions after the floodwise exposure step. The radical trapping agent is exemplified by compounds such as phenol compounds, quinone compounds and amine compounds, and naturally occurring antioxidants such as rubber, and the like.

Crosslinking Agent

The crosslinking agent is a compound that includes at least two functional groups, and decreases the solubility of the patternwise exposed regions in a developer solution by, in the baking step after the floodwise exposure step, causing a crosslinking reaction of the polymer component (1) to occur through an acid-catalyzed reaction, and thereby increasing the molecular weight of the polymer component (1). Examples of the functional group include a (meth) acryloyl group, a hydroxymethyl group, an alkoxymethyl group, an epoxy group, a vinyl ether group, and the like.

Other Additive

Other additive is exemplified by a surfactant, an antioxidant, a dissolution inhibitor, a plasticizer, a stabilizer, a colorant, a halation inhibitor, a dye, and the like. Well-known additives may be used as the other additive.

Solvent

The solvent is exemplified by an alcohol solvent, an ether solvent, a ketone solvent, an amide solvent, an ester solvent, a hydrocarbon solvent, and the like.

The alcohol solvent is exemplified by a monohydric alcohol solvent, a polyhydric alcohol solvent, a polyhydric alcohol partial ether solvent, and the like.

The ether solvent is exemplified by a diallyl ether solvent, a cyclic ether solvent, an aromatic ring-containing ether solvent, and the like.

The ketone solvent is exemplified by a chain ketone solvent, a cyclic ketone solvent, and the like.

The amide solvent is exemplified by a cyclic amide solvent, a chain amide solvent, and the like.

The ester solvent is exemplified by an acetic acid ester solvent, a polyhydric alcohol partial ether acetate solvent, a lactone solvent, a carbonate solvent, and the like.

The hydrocarbon solvent is exemplified by an aliphatic hydrocarbon solvent, an aromatic hydrocarbon solvent, and the like.

Of these, an ester solvent and a ketone solvent are preferred, a polyhydric alcohol partial ether acetate solvent, a lactone solvent and a cyclic ketone solvent are more preferred, and propylene glycol monomethyl ether acetate, γ-butyrolactone and cyclohexanone are still more preferred. The chemically amplified resist material may contain one type, or two or more types of the solvent.

Preparation Method of Chemically Amplified Resist Material

The chemically amplified resist material may be prepared by, for example, mixing the polymer component (1), the component (2), other optional component and the solvent at a predetermined ratio. The chemically amplified resist material is preferably filtered through e.g. a filter having a pore size of about 0.2 μm, for example, after the mixing. The lower limit of the solid content concentration of the chemically amplified resist material is typically 0.1% by mass, preferably 0.5% by mass, and more preferably 1% by mass. On the other hand, the upper limit of the solid content concentration is typically 50% by mass, preferably 30% by mass, and more preferably 20% by mass.

Patternwise Exposure Step

In the patternwise exposure step, a part of the resist film is exposed to the first radioactive ray. Specifically, a light-shielding mask having a predetermined pattern is placed on the resist film formed in the film-forming step. Thereafter, the resist film is irradiated, through the mask, with the first radioactive ray emitted from a lithography device having a projection lens, an electrooptic mirror, or a reflecting mirror (radioactive ray emitting module). Thus, the radiation-sensitive sensitizer and the acid are generated from the components (a) to (c) in the patternwise exposed regions.

The first radioactive ray used in this step for the irradiation has a wavelength of no greater than 250 nm. Such a radioactive ray is exemplified by γ-rays, X-rays, α-rays, heavy particle beams, proton beams, β-rays, ion beams, electron beams, EUV (extreme-ultraviolet) rays, an ArF excimer laser beam (wavelength: 193 nm), a KrF excimer laser beam (wavelength: 248 nm), and the like. Of these, an electron beams, EUV, an ArF excimer laser and a KrF excimer laser are preferred, and an electron beams and EUV are more preferred.

In a case where the patternwise exposure step and/or the floodwise exposure step is/are performed through liquid immersion lithography, the liquid immersion liquid which may be used is exemplified by water, a fluorine-containing inert liquid, and the like. It is preferred that the liquid immersion liquid is transparent to an exposure wavelength, and has a temperature coefficient of the refractive index as small as possible so that distortion of an optical image projected onto the film is minimized. In particular, in a case where the ArF excimer laser beam (wavelength: 193 nm) is used as an exposure light source, it is preferred to use water in light of availability and ease of handling thereof in addition to the aforementioned considerations. In a case where water is used, a slight amount of an additive which reduces the surface tension of water and imparts enhanced surfactant power may be added. It is preferred that the additive does not cause dissolution of the resist film on the wafer, and has a negligible influence on an optical coating of an inferior face of a lens. The water for use is preferably distilled water.

On the other hand, in a case where the patternwise exposure step and/or the floodwise exposure step is/are performed through dry lithography, the step(s) may be performed in an ambient air atmosphere, a vacuum atmosphere or an inert atmosphere, and a vacuum atmosphere, a nitrogen-containing inert atmosphere, and an argon-containing inert atmosphere are preferred. In addition, the upper limit of a basic compound concentration in the atmosphere is preferably 20 ppb, more preferably 5 ppb, and still more preferably 1 ppb.

Alternatively, an absorbing film that absorbs at least a part of the radioactive ray of a wavelength which the radiation-sensitive acid generating agent contained in the component (a) or (c) can directly absorb may be provided on the resist film obtained after the patternwise exposure step. When such an absorbing film is provided, direct generation of the acid from the radiation-sensitive acid generating agent which is caused by the irradiation with the second radioactive ray in the floodwise exposure step can be further inhibited in the patternwise unexposed regions.

Further, in a case where the radiation-sensitive sensitizer generating agent (b) includes an alcoholic hydroxyl group in which the hydrogen atom is not substituted, it is preferred that after the patternwise exposure step until the floodwise exposure step, the resist film is stored under a vacuum atmosphere, a nitrogen-containing inert atmosphere, or an argon-containing inert atmosphere. By storing the resist film under the atmosphere described above, an exposure of the resist film to oxygen and the termination of a radical reaction by the oxygen can be inhibited, and additionally quenching of the acid by a slight amount of a basic compound can be inhibited. As a result of these, the process tends to be more stabilized. The upper limit of the storage time period is preferably 30 min, and more preferably 10 min. When the storage time period is no greater than the upper limit, inhibition of the decrease in sensitivity tends to be enabled.

On the other hand, in a case where the radiation-sensitive sensitizer generating agent (b) includes an alcoholic hydroxyl group in which the hydrogen atom is substituted, it is preferred that after the patternwise exposure step until the floodwise exposure step, the resist film is stored in an ambient air cleaned by using an amine-eliminating filter. By storing the resist film under the atmosphere described above, quenching of the acid by a slight amount of a basic compound can be inhibited, and consequently the process tends to be more stabilized. The upper limit of the storage time period is preferably 30 min, and more preferably 10 min. When the storage time period is no greater than the upper limit, inhibition of the decrease in sensitivity tends to be enabled.

Prior-to-Floodwise-Exposure Baking Step

In the prior-to-floodwise-exposure baking step, the resist film after the patternwise exposure step and before the floodwise exposure step is heated. Thus, the generation of the radiation-sensitive sensitizer by the hydrolysis reaction of the radiation-sensitive sensitizer generating agent (b) etc. in the resist film can be facilitated.

The lower limit of the heating temperature is preferably 30° C., more preferably 50° C., and still more preferably 60° C. On the other hand, the upper limit of the heating temperature is preferably 150° C., more preferably 120° C., and still more preferably 100° C. The lower limit of the heating time period is preferably 5 sec, and more preferably 10 sec. On the other hand, the upper limit of the heating time period is preferably 3 min, and more preferably 60 sec. In addition, the heating is preferably performed under a humidity-controlled environment. When the heating is performed under such an environment, an influence of the moisture in the ambient air on a hydrolysis reaction can be reduced in a case where the hydrolysis reaction is used as a deprotection reaction which produces the radiation-sensitive sensitizer from the radiation-sensitive sensitizer generating agent (b) etc.

Floodwise Exposure Step

In the floodwise exposure step, the entire face (entire face including the patternwise exposed regions and the patternwise unexposed regions) of the resist film after the patternwise exposure step is irradiated with the second radioactive ray. The second radioactive ray may be applied onto the entire face of the wafer at once, or combined or superimposed multiple local applications of the second radioactive ray may be executed.

In this step, since only the radiation-sensitive sensitizer which is generated by the first radioactive ray in patternwise exposed regions of the resist film absorbs the second radioactive ray, selective absorption of the second radioactive ray occurs in the patternwise exposed regions. Thus, the acid can be continuously generated only in the patternwise exposed regions, leading to a significant improvement of the sensitivity. On the other hand, the acid is not substantially generated in the patternwise unexposed regions, and consequently the sensitivity can be improved while the chemical contrast in the resist film is maintained.

Common light sources may be used as a light source of the second radioactive ray used in this step. Examples of the second radioactive ray include: ultraviolet rays emitted from a mercury lamp, a xenon lamp, or the like and filtered through a band pass filter or a cut-off filter so as to have a desired wavelength; ultraviolet rays emitted from an LED light source, a laser diode, a laser light source or the like and having a narrow-bandwidth; and the like.

The lower limit of the wavelength of the second radioactive ray is greater than 250 nm, preferably 280 nm, and more preferably 320 nm. On the other hand, the upper limit of the wavelength is preferably 450 nm, and more preferably 400 nm. When the wavelength is less than the lower limit, the amount of the acid and the radiation-sensitive sensitizer which may be generated by the second radioactive ray in the patternwise unexposed regions may be increased. To the contrary, when the wavelength is greater than the upper limit, an efficiency of the sensitization reaction caused by the second radioactive ray may be decreased.

Baking Step

In the baking step, the resist film obtained after the floodwise exposure step is baked (post exposure baking; PEB). Thus, the dissociation of the acid-labile group included in the polymer (A) or the like is accelerated by the acid generated from the radiation-sensitive acid generating agent (c) or the like in the patternwise exposed regions. In addition, in a case where the chemically amplified resist material contains the crosslinking agent and the like, a crosslinking reaction and the like may occur in the patternwise exposed regions. As a result of these, a difference in the solubility in the developer solution is produced between the light-exposed regions and the light-unexposed regions. Further, although a side wall face of the resist may be wavy due to an influence of a standing wave of the radioactive ray within the resist film, the PEB enables a reactant to be diffused in the resist film, and consequently the formation of the wave-like surface can be reduced.

The atmosphere of the PEB is exemplified by an ambient air atmosphere, a nitrogen-containing inert atmosphere, an argon-containing inert atmosphere, and the like. The PEB temperature is typically no less than 50° C. and no greater than 180° C., and preferably no less than 80° C. and no greater than 130° C. The PEB time period is typically no less than 5 sec and no greater than 600 sec, and preferably no less than 10 sec and no greater than 300 sec.

Development Step

In the development step, the resist film obtained after the baking step is brought into contact with a developer solution. Thus, the patternwise unexposed regions are eliminated with the developer solution, whereby a predetermined resist pattern is formed. Generally, the resist pattern obtained after the development is rinsed with a rinse agent such as water and an alcohol, followed by drying.

The developer solution contains an organic solvent as a principal component. The organic solvent is exemplified by one, or two or more types of solvents exemplified as the solvent for use in the chemically amplified resist material, and the like. Of these, alcohol solvents, ether solvents, ketone solvents, amide solvents and ester solvents are preferred.

Among the alcohol solvents, monohydric alcohol solvents and polyhydric alcohol partial ether solvents are more preferred, and ethanol, iso-propanol and propylene glycol monoethyl ether are still more preferred.

Among the ether solvents, diallyl ether solvents and aromatic ring-containing ether solvents are more preferred, and dibutyl ether and anisole are still more preferred.

Among the ketone solvents, chain ketone solvents and cyclic ketone solvents are more preferred, and cyclohexanone and 2-heptanone are still more preferred.

Among the amide solvents, chain amide solvents are more preferred, and N,N-dimethylacetamide is still more preferred.

Among the ester solvents, acetic acid ester solvents and lactone solvents are preferred, and butyl acetate, 3-methylbutyl acetate, γ-butyrolactone and ethyl lactate are more preferred.

The content of the organic solvent in the developer solution is preferably no less than 80% by mass, more preferably no less than 90% by mass, still more preferably no less than 95% by mass, and particularly preferably no less than 99% by mass.

Moreover, it is preferred that the developer solution further contains a first compound (hereinafter, may be also referred to as "(M) compound" or "compound (M)") that can give an ionic bond, a hydrogen bond, a covalent bond, a coordinate bond, a dipole-dipole interaction or a combination thereof with a polar group generated in the polymer (A).

The compound (M) is exemplified by a nitrogen-containing compound, an onium salt, an onium salt-containing polymer, a basic polymer, a phosphorus compound, and the like. Hereinafter, each compound will be described.

Nitrogen-Containing Compound

The nitrogen-containing compound has at least one nitrogen atom. The nitrogen-containing compound can give a hydrogen bond, a covalent bond and/or a dipole-dipole interaction with a polar group such as —COOH generated in the polymer (A).

The nitrogen-containing compound may have one, or two or more nitrogen atoms.

The lower limit of the molecular weight of the nitrogen-containing compound is preferably 50, and more preferably 100. The upper limit of the molecular weight is preferably 900, and more preferably 700.

The nitrogen-containing compound is exemplified by a compound represented by the following formula (A), and the like.

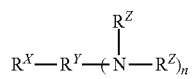

(A)

In the above formula (A), $R^X$ represents a single bond or an organic group having a valency of n; $R^Y$ represents a single bond, a substituted or unsubstituted methylene group, a substituted or unsubstituted alkylene group, a substituted or unsubstituted alkenylene group, a substituted or unsubstituted alkynylene group, a substituted or unsubstituted cycloalkylene group or a substituted or unsubstituted divalent aromatic group; $R^Z$s each independently represent a hydrogen atom or an alkyl group; n is an integer of 1 to 8, wherein in a case where n is no less than 2, a plurality of $R^Y$s may be identical or different, and wherein at least one of $R^X$ and $R^Y$ does not represent the single bond.

Examples of the organic group having a valency of n which may be represented by represented by $R^X$ include a carbon atom, a nitrogen atom, —NH—, —NR—, —O—, —S—, a carbonyl group, an alkylene group, an alkenylene group, an alkynylene group, a cycloalkylene group, an aromatic group, a heterocyclic group, a combination of at least two of these groups, a group obtained from the groups listed above by substituting a part or all of hydrogen atoms included therein with a substituent, and the like, wherein R represents a monovalent organic group, preferably an alkyl group, an alkylcarbonyl group or an alkylsulfonyl group. $R^X$ preferably represents an alkyl group, a nitrogen atom, —NH— and —NR—. The substituent which may be included in the groups listed above is exemplified by an alkyl group, an alkoxy group, an alkylcarbonyl group, an alkylcarbonyloxy group, an alkyloxycarbonyl group, an alkenyl group, an alkenyloxy group, an alkenylcarbonyl group, an alkenylcarbonyloxy group, an alkenyloxycarbonyl group, an alkynyl group, an alkynyleneoxy group, an alkynylenecarbonyl group, an alkynylenecarbonyloxy group, an alkynyleneoxycarbonyl group, an aralkyl group, an aralkyloxy group, an aralkylcarbonyl group, an aralkylcarbonyloxy group, an aralkyloxycarbonyl group, a hydroxy group, an amide group, a carboxy group, a cyano group, a fluorine atom, and the like.

The lower limit of the number of carbon atoms of the alkylene group which may be represented by $R^Y$ is preferably 2. On the other hand, the upper limit of the number of carbon atoms of the alkylene group which may be represented by $R^Y$ is preferably 40, more preferably 20, and still more preferably 12. The lower limit of the number of carbon atoms of the alkenylene group and the alkynylene group which may be represented by $R^Y$ is preferably 2. On the other hand, the upper limit of the number of carbon atoms of the alkenylene group and the alkynylene group which may be represented by $R^Y$ is preferably 40, more preferably 20, and still more preferably 12. The lower limit of the number of carbon atoms of the cycloalkylene group which may be represented by $R^Y$ is preferably 3, and more preferably 5. On the other hand, the upper limit of the number of carbon atoms of the cycloalkylene group which may be represented by $R^Y$ is preferably 40, more preferably 20, and still more preferably 12. The monovalent aromatic group which may be represented by $R^Y$ encompasses nonbenzene aromatic groups, and examples thereof include groups obtained by eliminating one hydrogen atom from a hydrocarbon or aromatic heterocyclic compound such as benzene, pyrrole, furan, thiophene, indole, naphthalene, anthracene, tetracene, benzofuran and benzothiophene, and the like.

The lower limit of n is preferably 1. On the other hand, the upper limit of n is preferably 6, more preferably 4, and still more preferably 3.

Examples of the nitrogen-containing compound wherein n is 1 include tripentylamine, trioctylamine, and the like. Examples of the nitrogen-containing compound wherein n is 2 include N,N,N',N'-tetramethylethylenediamine, N,N,N', N'-tetramethyltrimethylenediamine, and the like. Examples of the nitrogen-containing compound wherein n is no less than 3 include compounds represented by the following formulae, and the like.

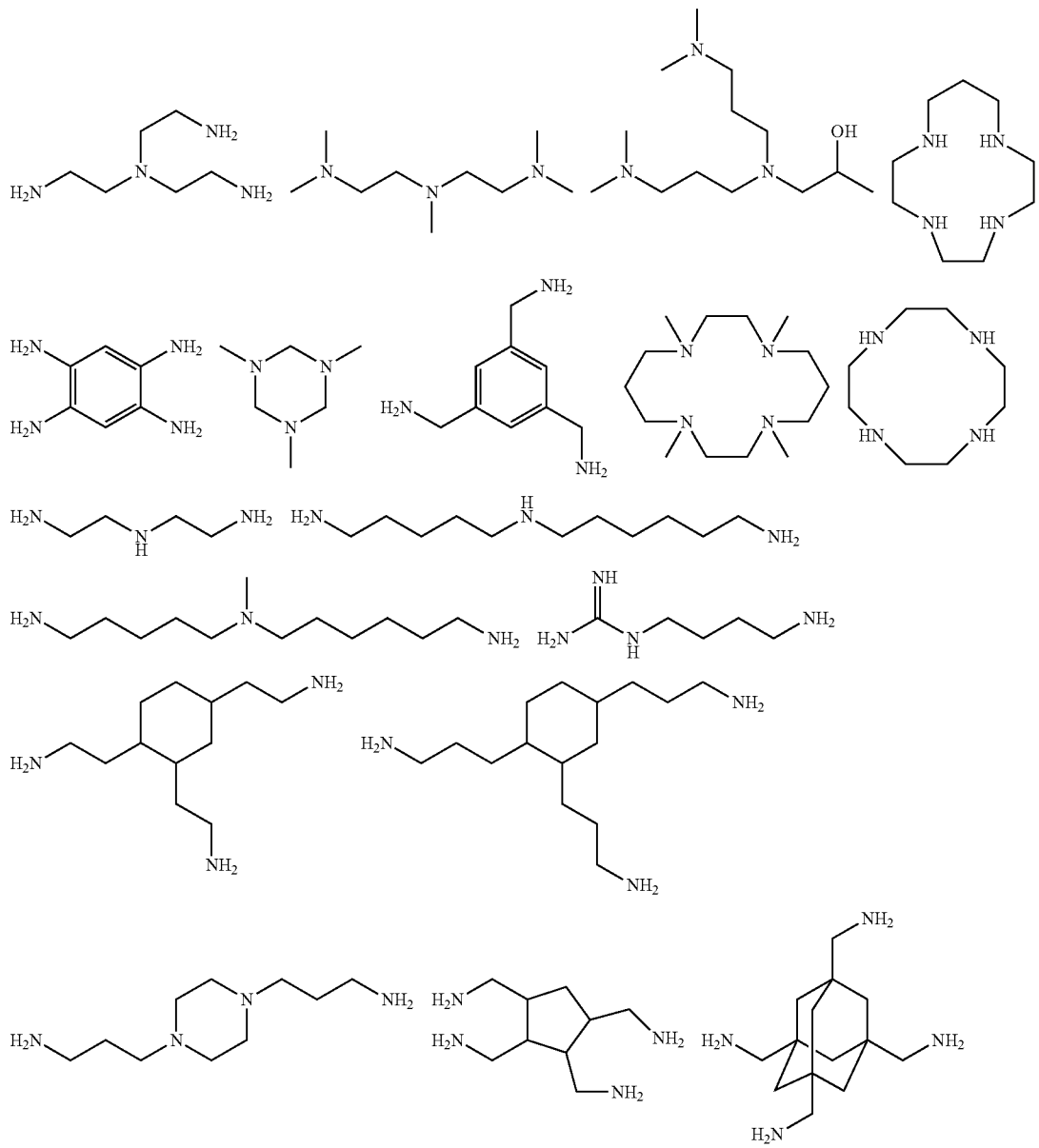

85
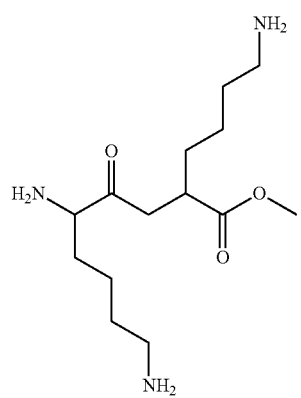
86
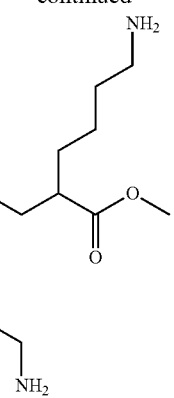
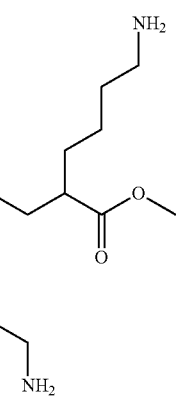
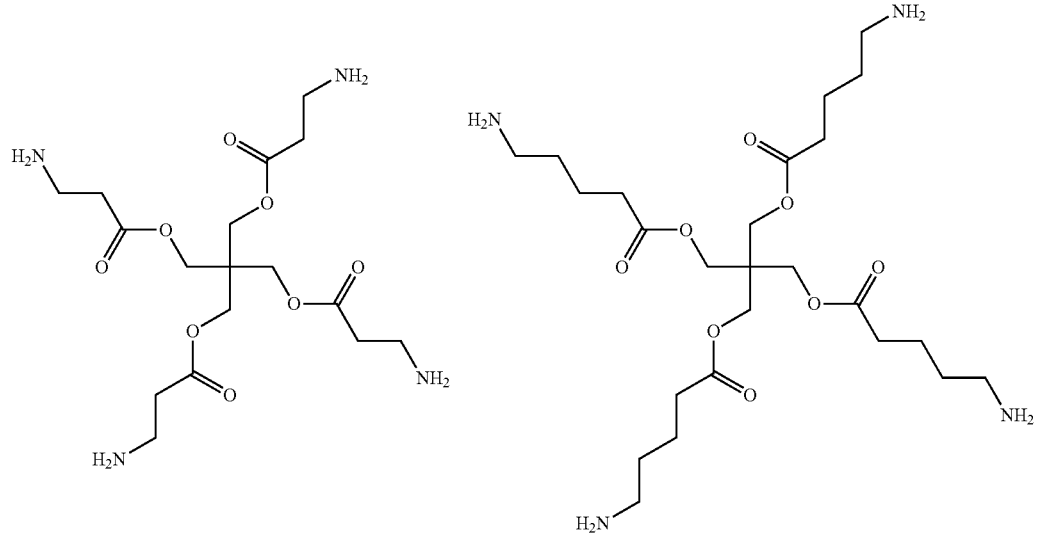
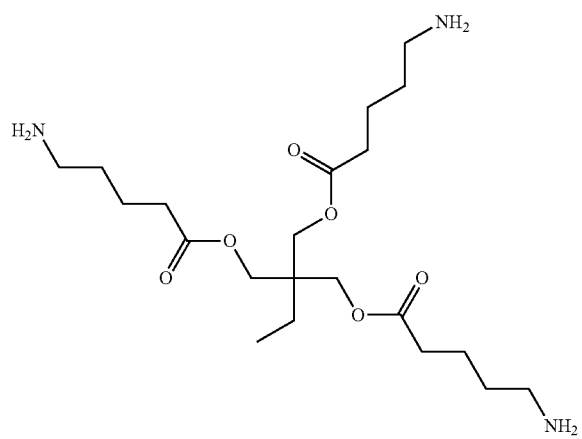

-continued

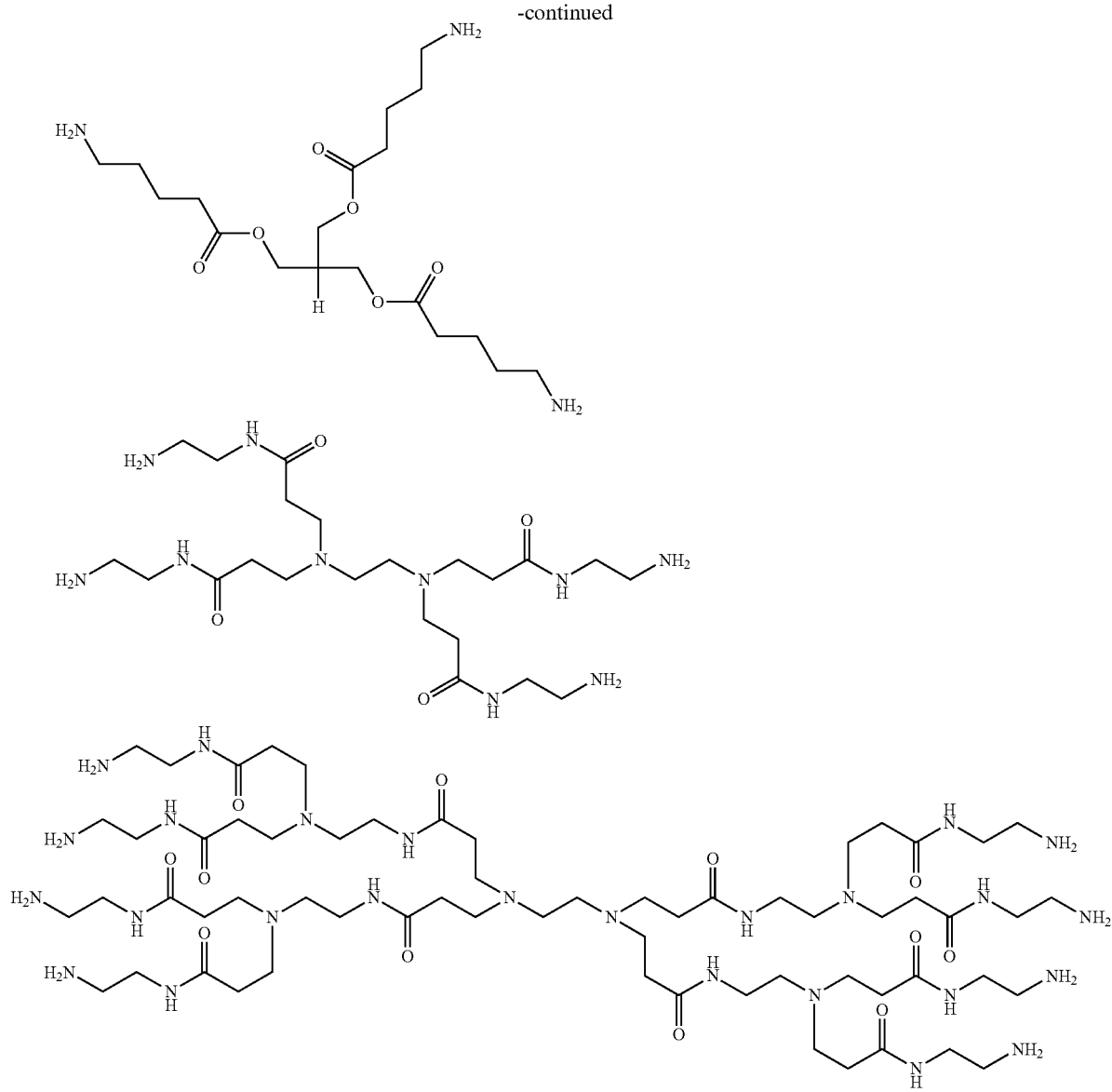

Onium Salt

The onium salt contains an onium cation and an anion. The onium salt can give a hydrogen bond and/or a dipole-dipole interaction with a polar group such as —COOH generated in the polymer (A).

The onium salt is exemplified by an ammonium salt, a phosphonium salt, an oxonium salt, a sulfonium salt, a selenonium salt, a carbonium salt, a diazonium salt, an iodonium salt, and the like. Moreover, examples of the cation contained in the onium salt also include heteroaromatic ring-containing cations in which a hetero atom of the heteroaromatic ring has a positive charge. Such an onium salt is exemplified by a pyridinium salt, an imidazolium salt, and the like.

Alternatively, the onium salt may be a polyvalent onium salt having at least two onium ion atoms in a single molecule. Among such polyvalent onium salts, compounds in which the at least two cations are linked through a covalent bond are preferred. The polyvalent onium salt is exemplified by a diazonium salt, an iodonium salt, a sulfonium salt, an ammonium salt, a phosphonium salt, and the like.

The anion contained in the onium salt may be monovalent or polyvalent. The monovalent anion is exemplified by a sulfonic acid anion, a formic acid anion, a carboxylic acid anion, a sulfinic acid anion, a boron anion, a halide ion, a phenol anion, an alkoxy anion, a hydroxide ion, and the like. The divalent anion is exemplified by an oxalic acid ion, a phthalic acid ion, a maleic acid ion, a fumaric acid ion, a tartaric acid ion, a malic acid ion, a lactic acid ion, a sulfuric acid ion, a diglycolic acid ion, a 2, 5-furandicarboxylic acid ion, and the like.

Examples of the monovalent anion include $Cl^-$, $Br^-$, $I^-$, $AlCl_4^-$, $Al_2Cl_4^-$, $BF_4^-$, $PF_6^-$, $ClO_4^-$, $NO_3^-$, $CH_3COO—$, $CF_3COO$, $CH_3SO_3—$, $CF_3SO_3^-$, $(CF_3SO_2)_2N^-$, $(CF_3SO_2)_3C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2N^-$, $C_3F_7COO^-$, $(CF_3SO_2)(CF_3CO)N^-$, $C_9H_{19}COO^-$, $(CH_3)_2PO_4$, $(C_2H_5)_2PO_4^-$, $C_2H_5OSO_3^-$, $C_6H_{17}OSO_3$, $C_8H_{17}OSO_3^-$, $CH_3(OC_2H_4)_2OSO_3^-$, $C_6H_4(CH_3)SO_3^-$, $(C_2F_5)_3PF_3^-$, $CH_3CH(OH)COO^-$, $B(C_6F_5)_4^-$, $FSO_3^-$, $C_6H_5O^-$, $(CF_3)_2CHO^-$, $(CF_3)_3CHO^-$, $C_6H_3(CH_3)_2O^-$, $C_2H_5OC_6H_4COO^-$, and the like.

Examples of the onium cation contained in the onium salt include cations represented by the following formulae, and the like.
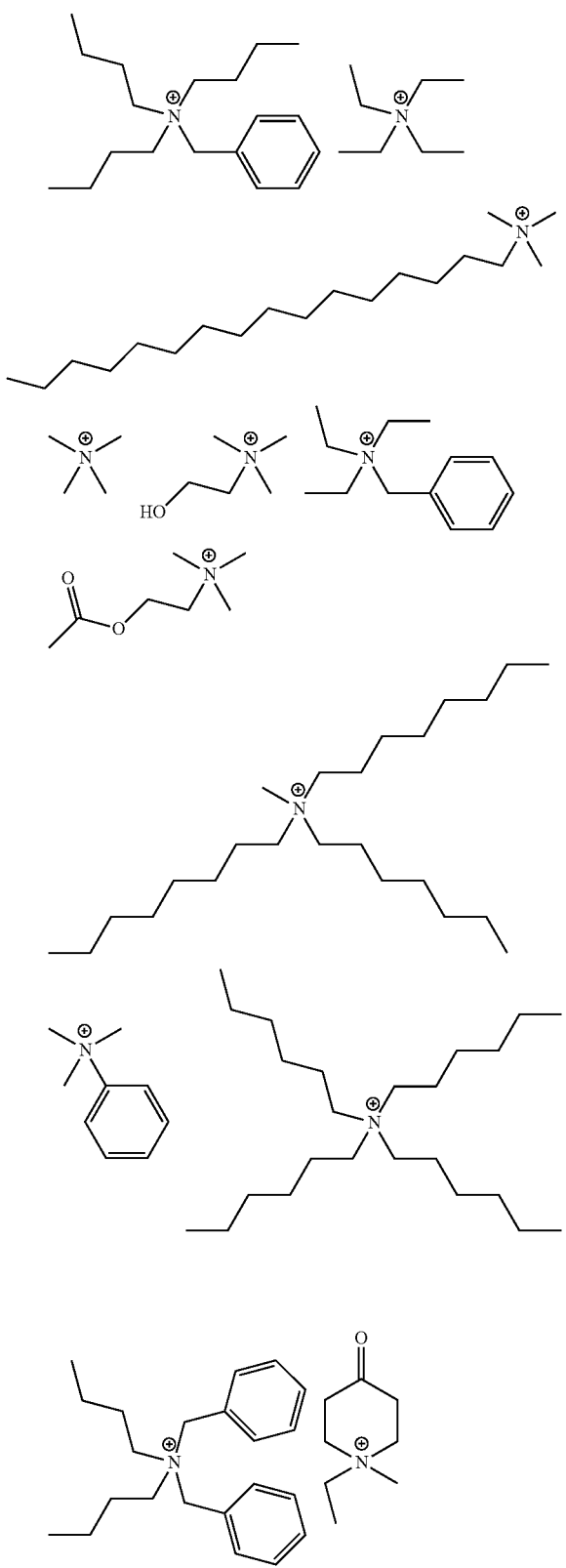
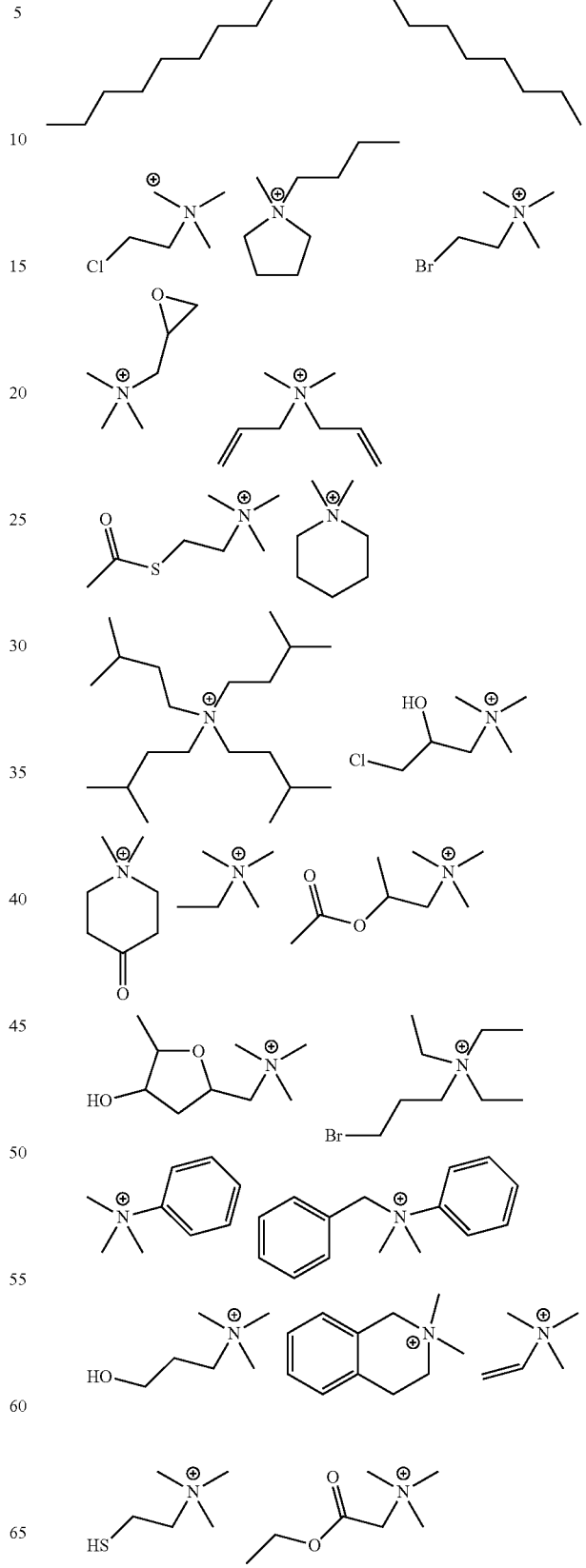

91
-continued
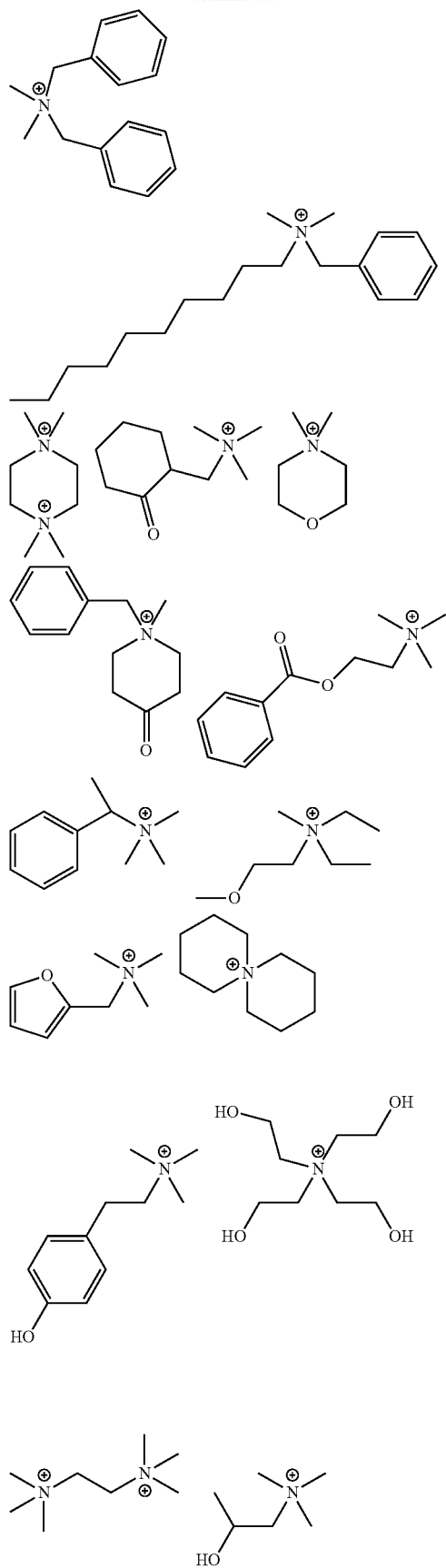
92
-continued
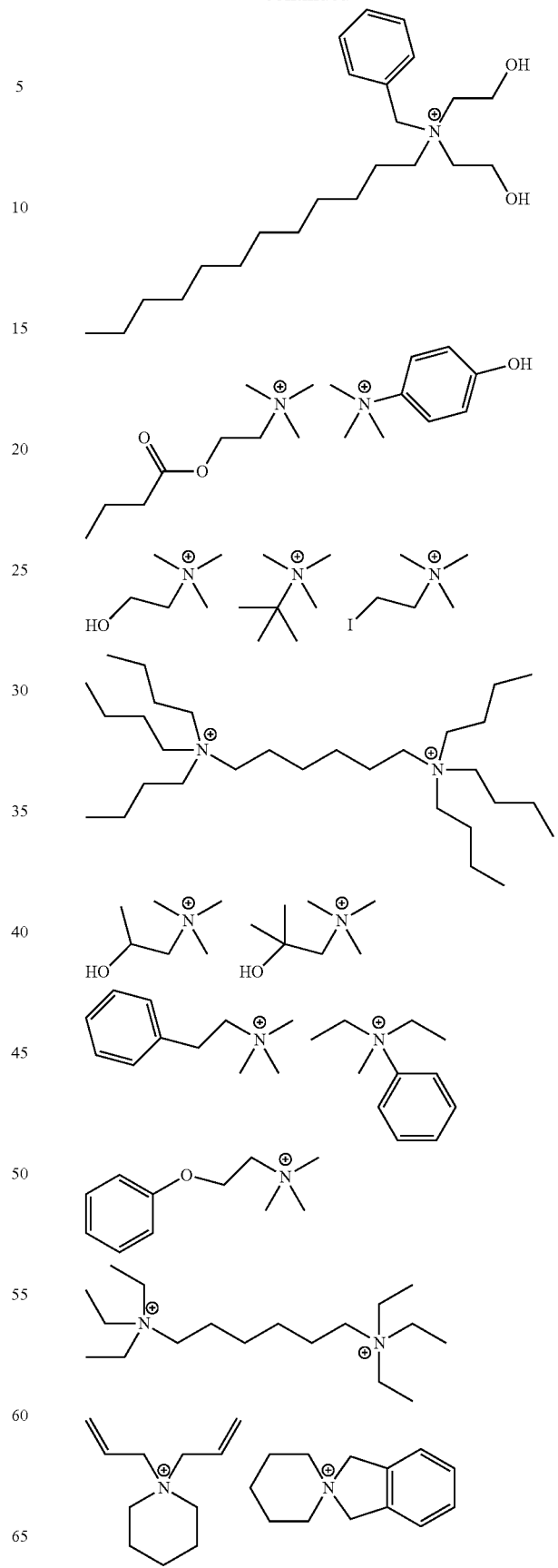

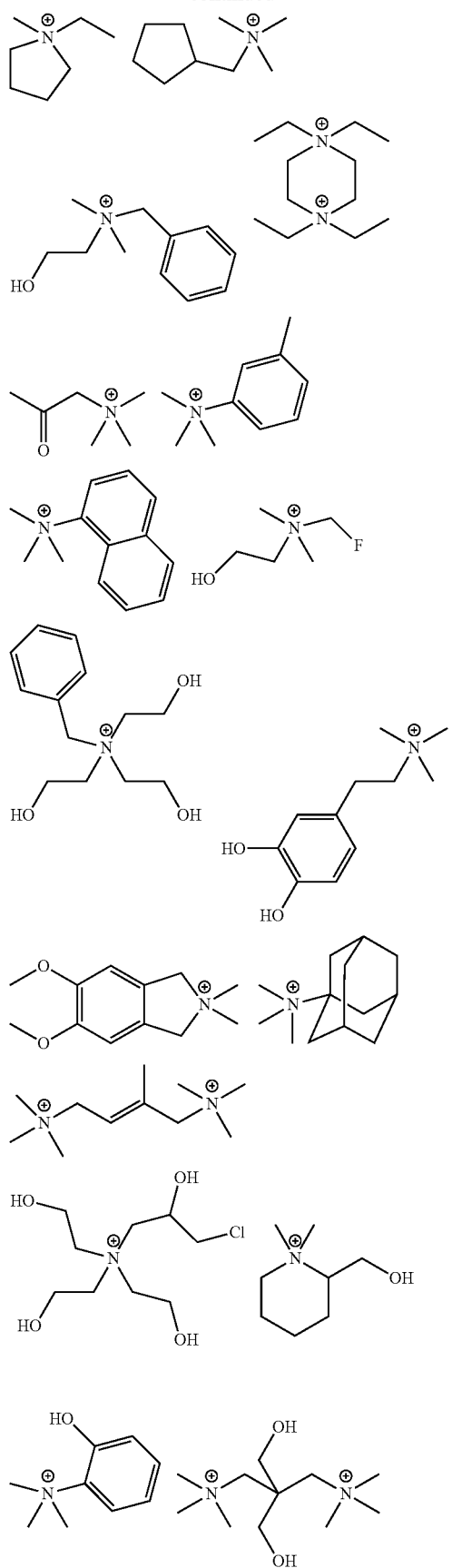
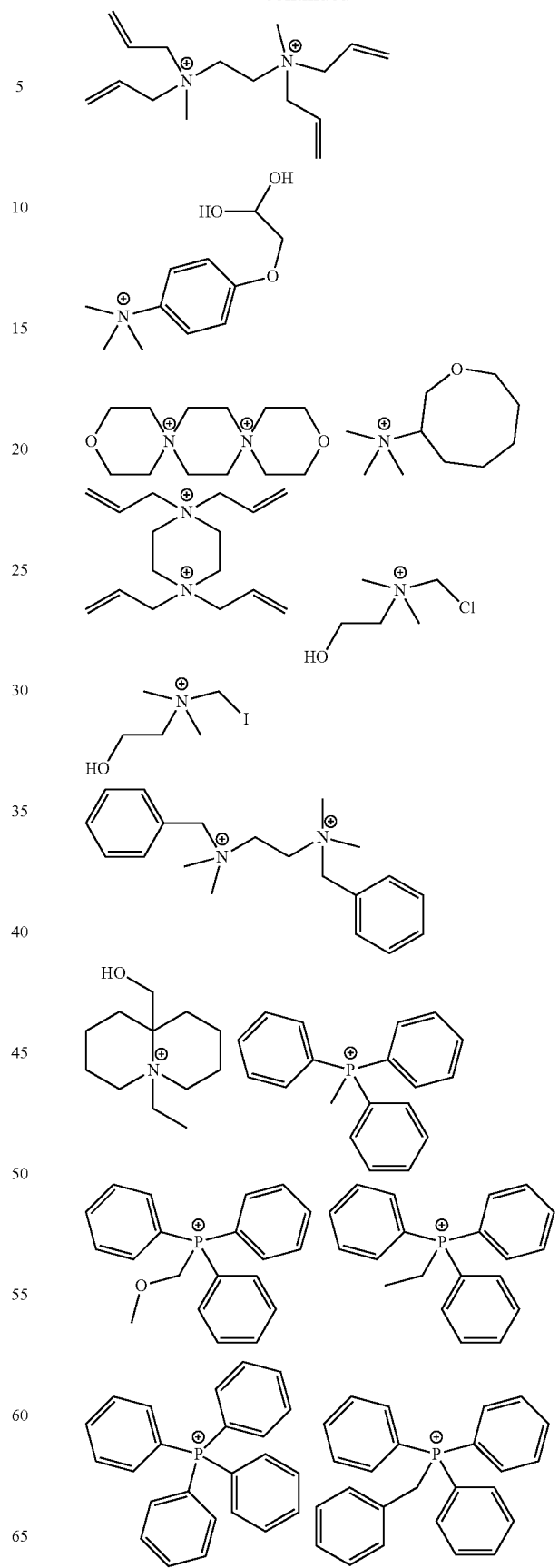

95
-continued
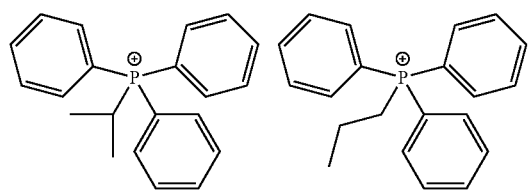
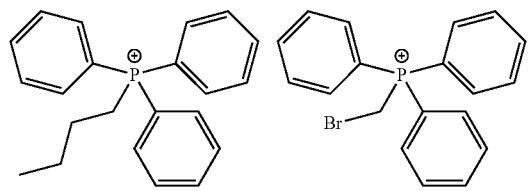
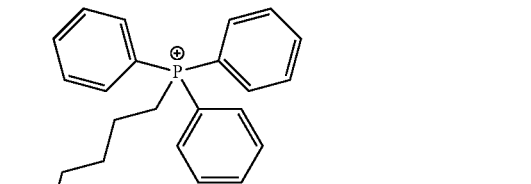
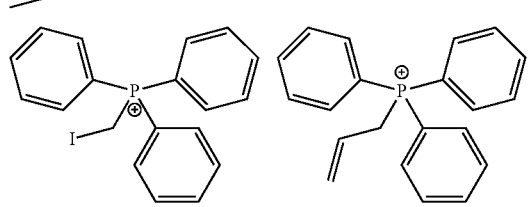
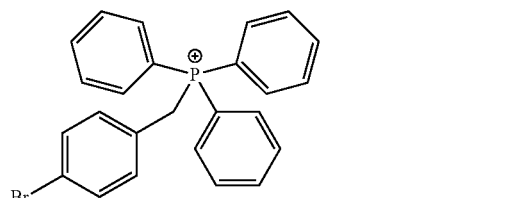
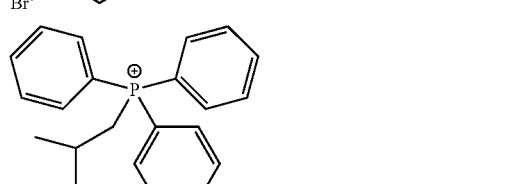
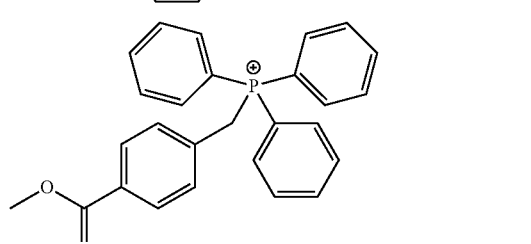
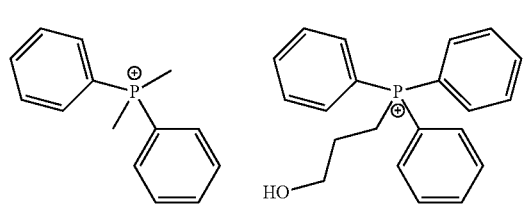
96
-continued
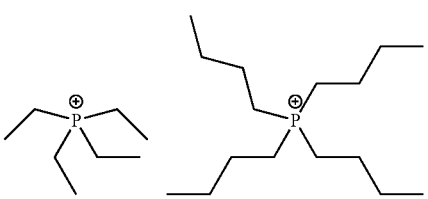
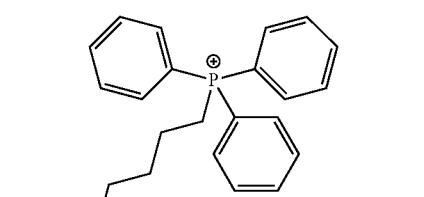
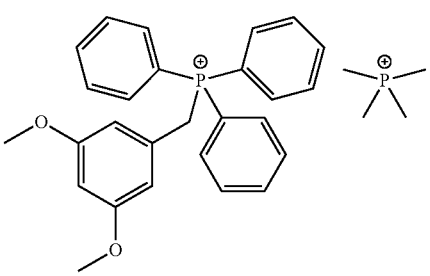
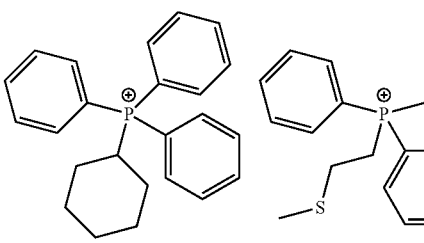
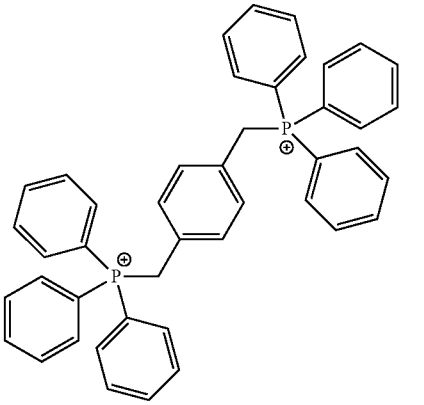
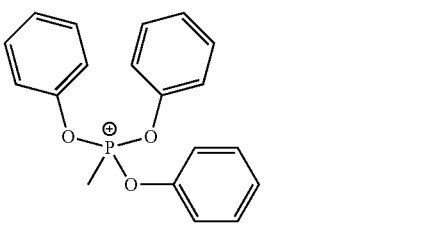

97
-continued
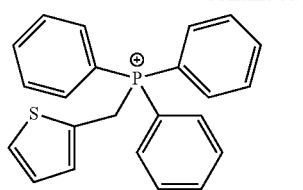
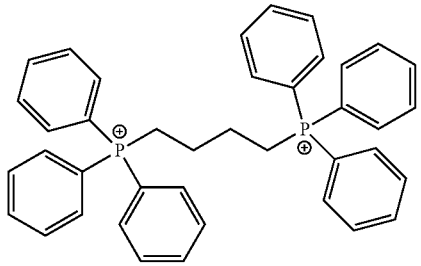
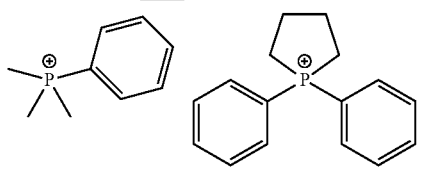
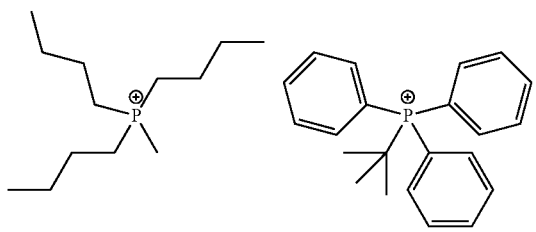
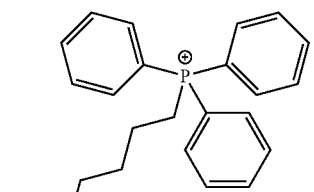
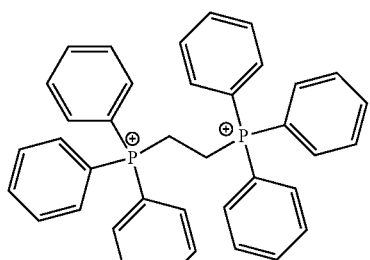
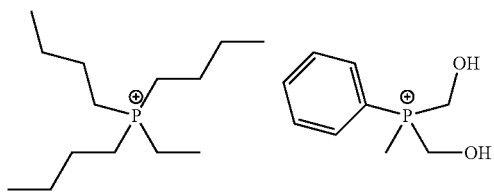
98
-continued
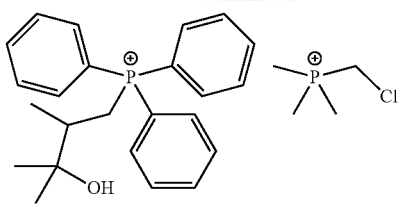
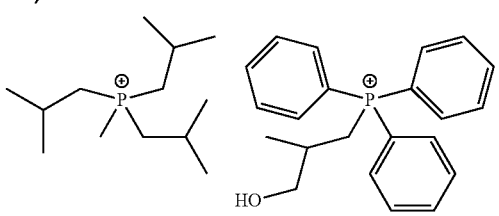
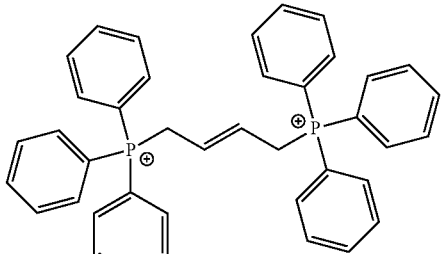
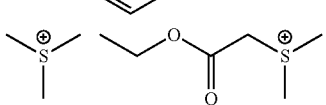
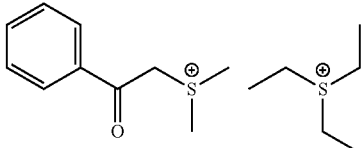
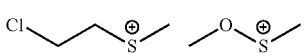
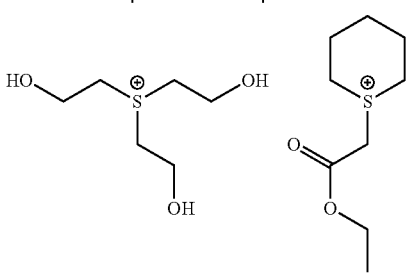
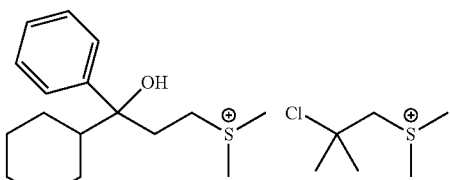
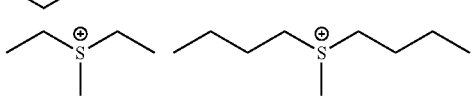
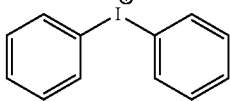

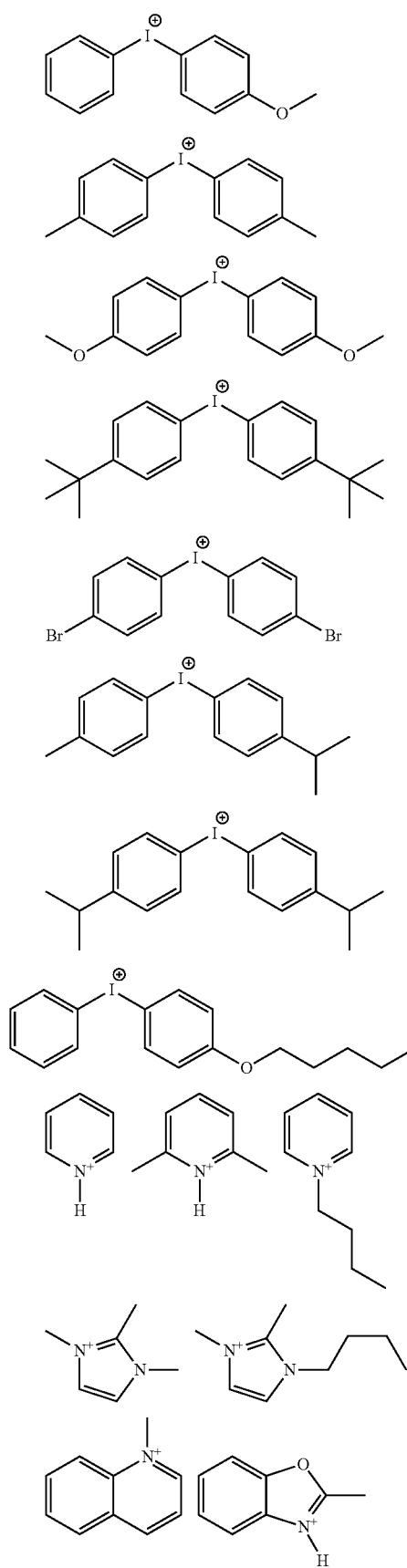
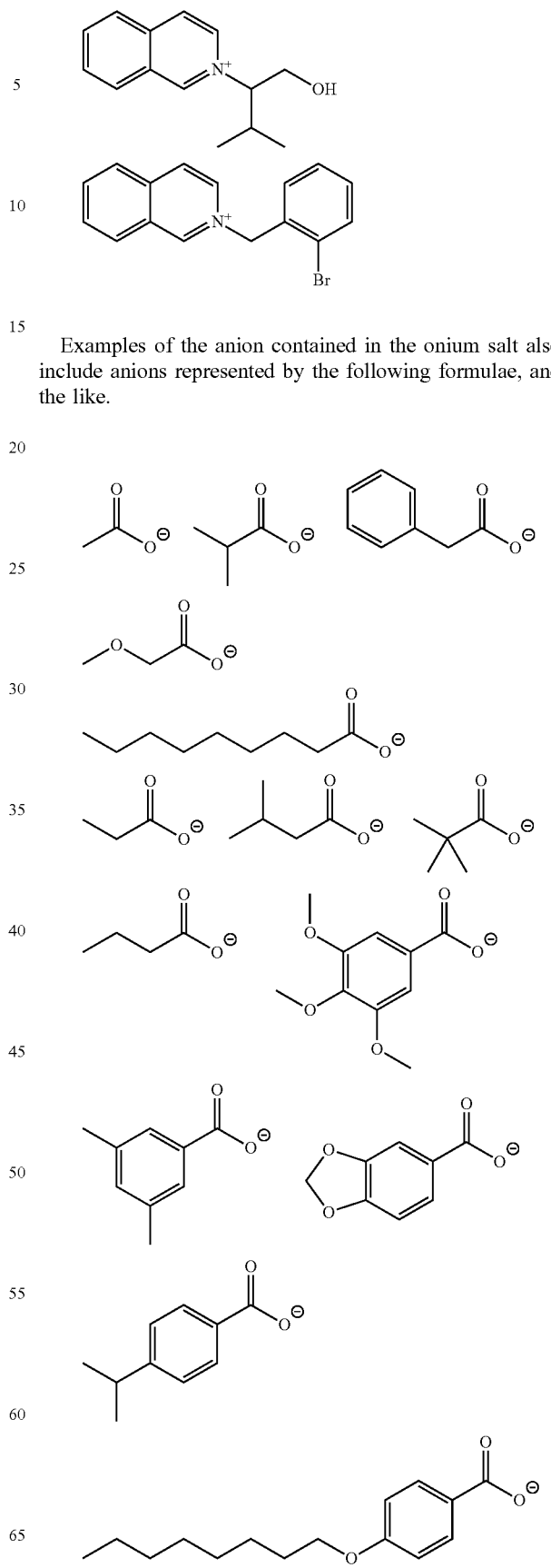
Examples of the anion contained in the onium salt also include anions represented by the following formulae, and the like.

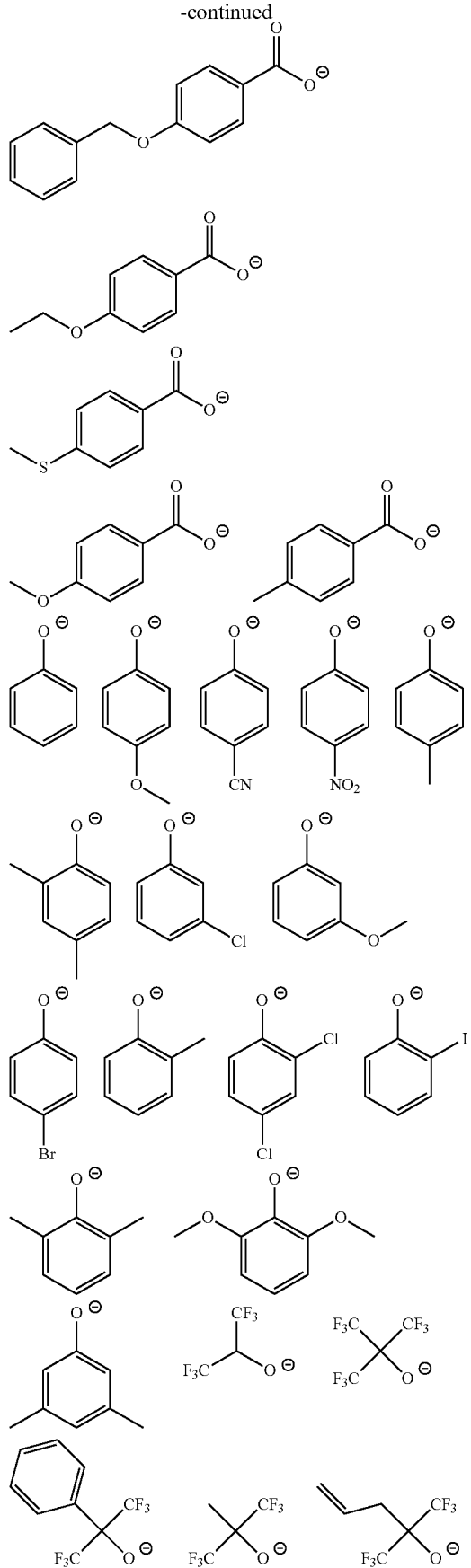
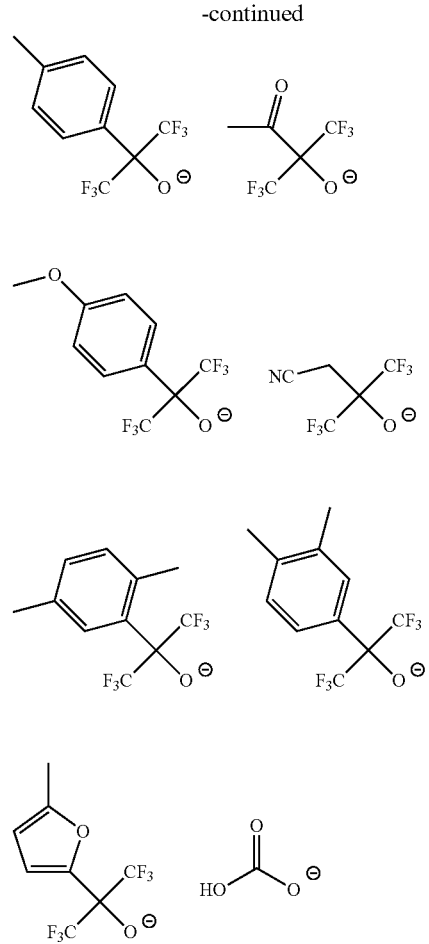
Examples of the onium salt include compounds represented by the following formulae, and the like.
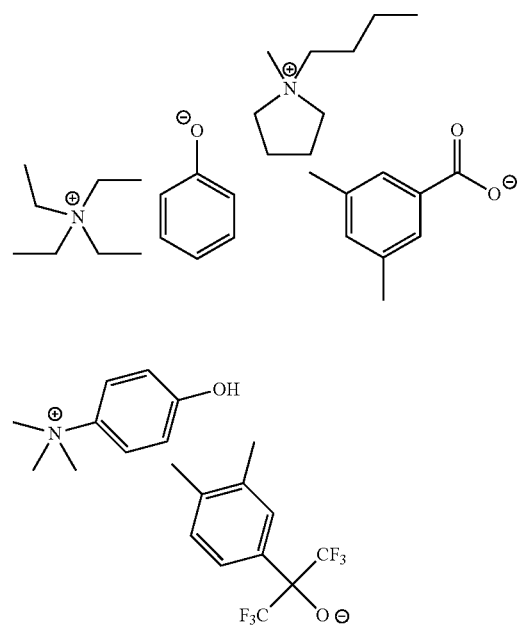

103
-continued
104
-continued
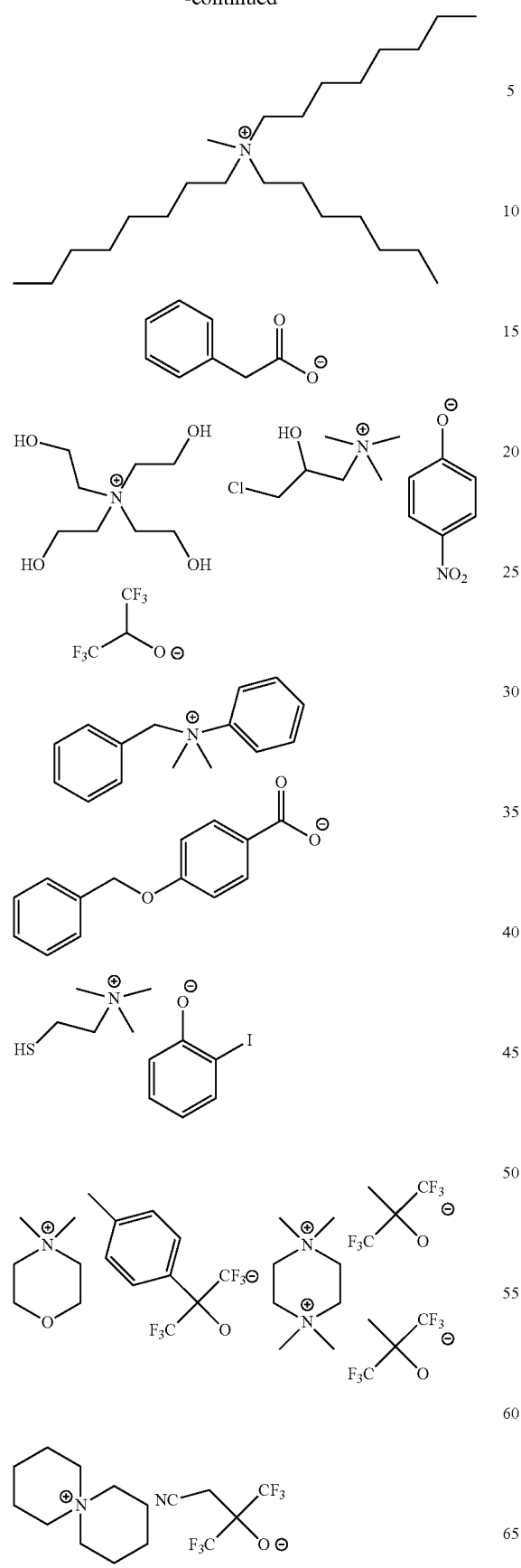
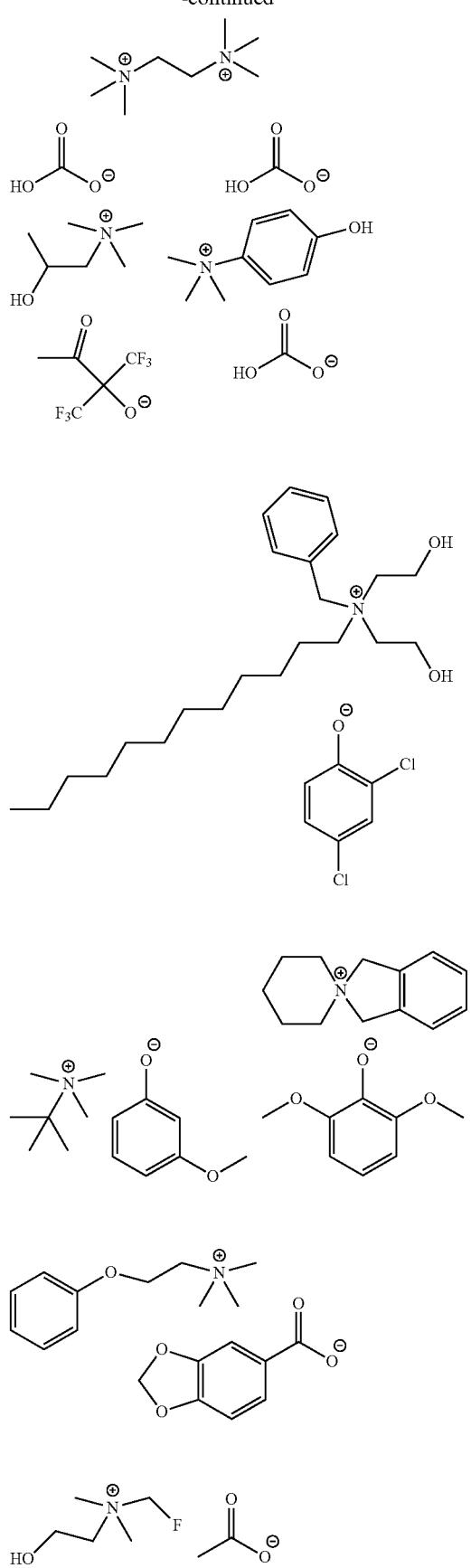

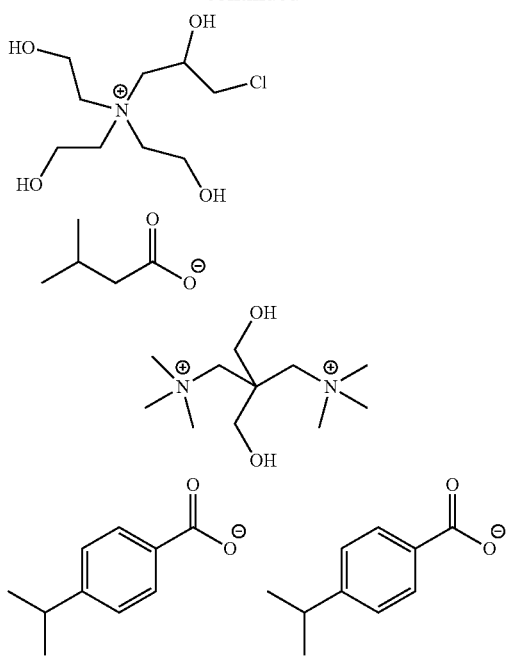
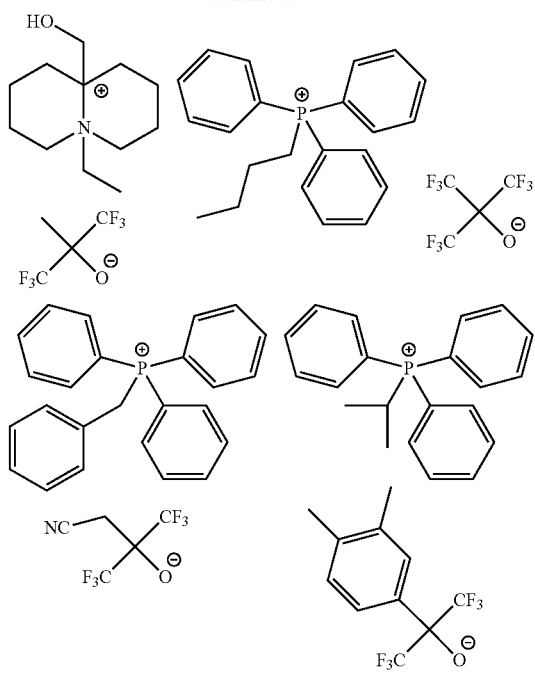
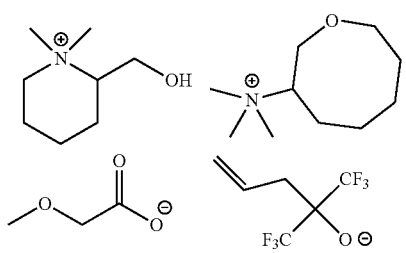
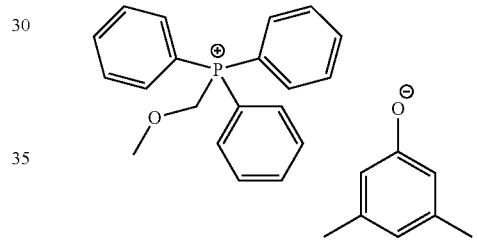
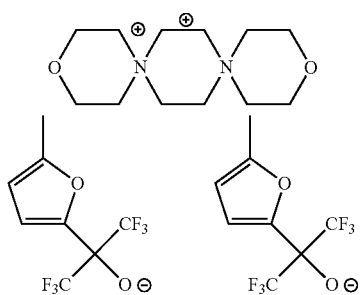
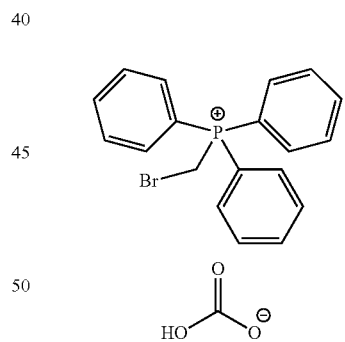
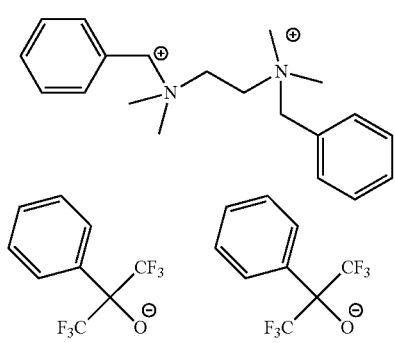
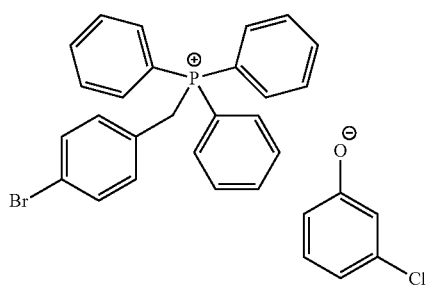

107
-continued
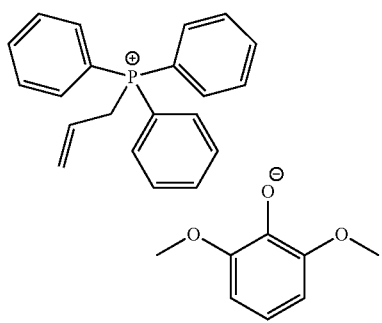
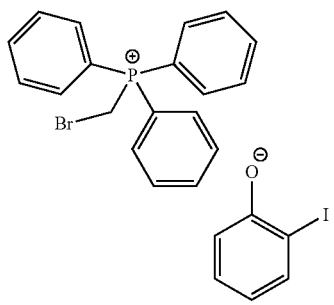
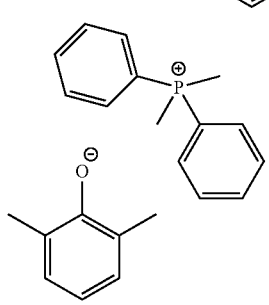
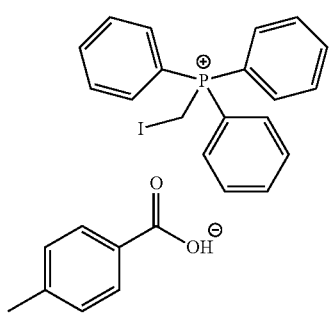
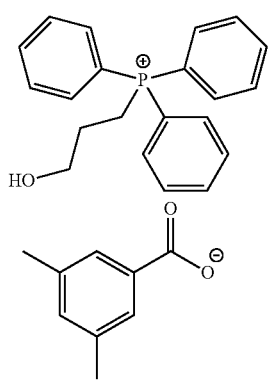
108
-continued
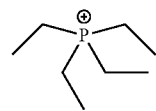
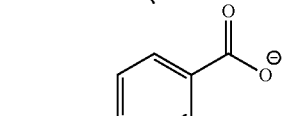
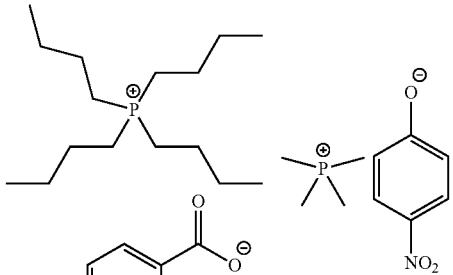
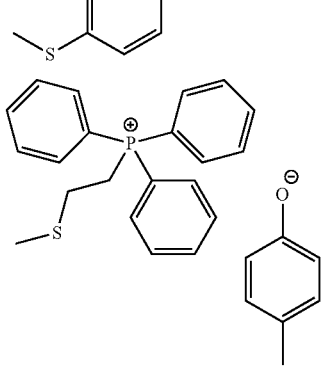
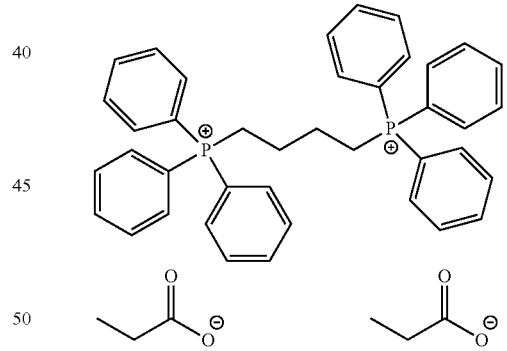
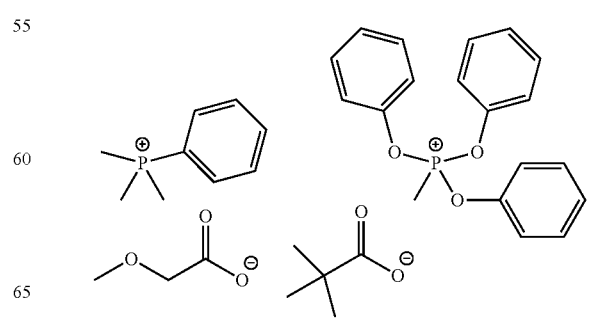

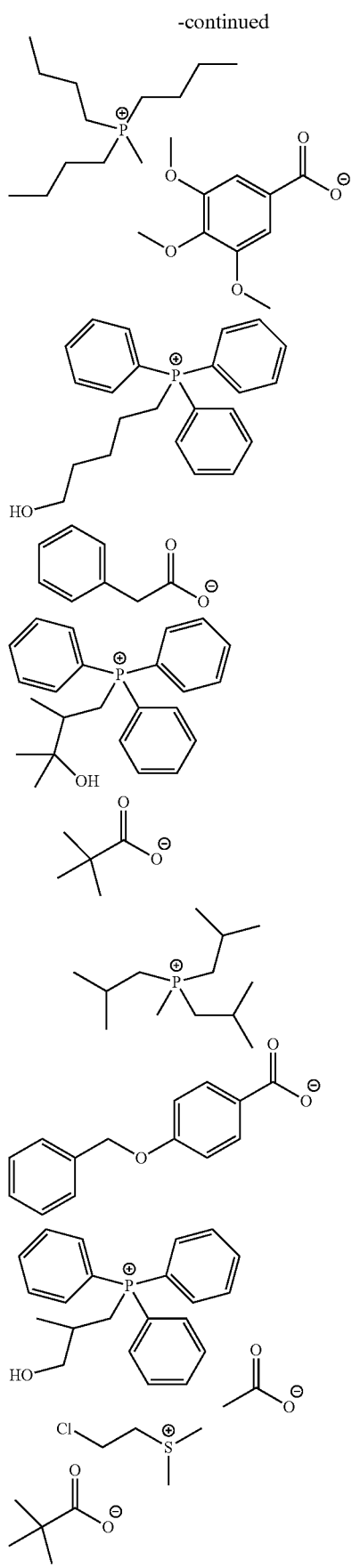
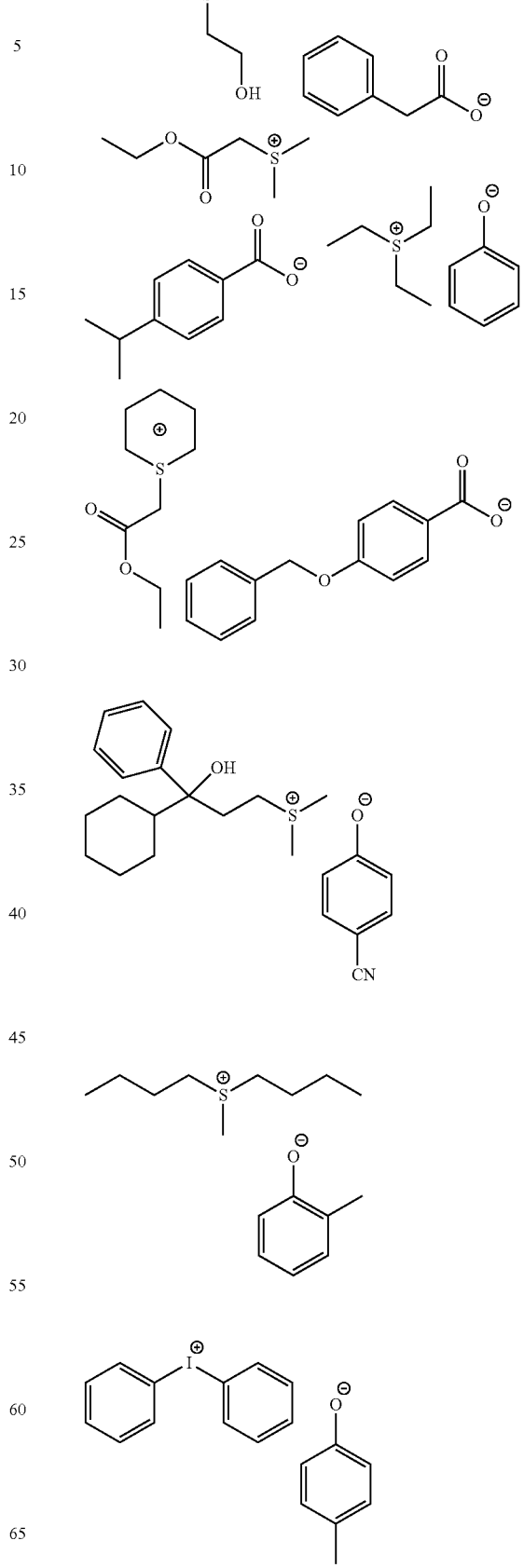

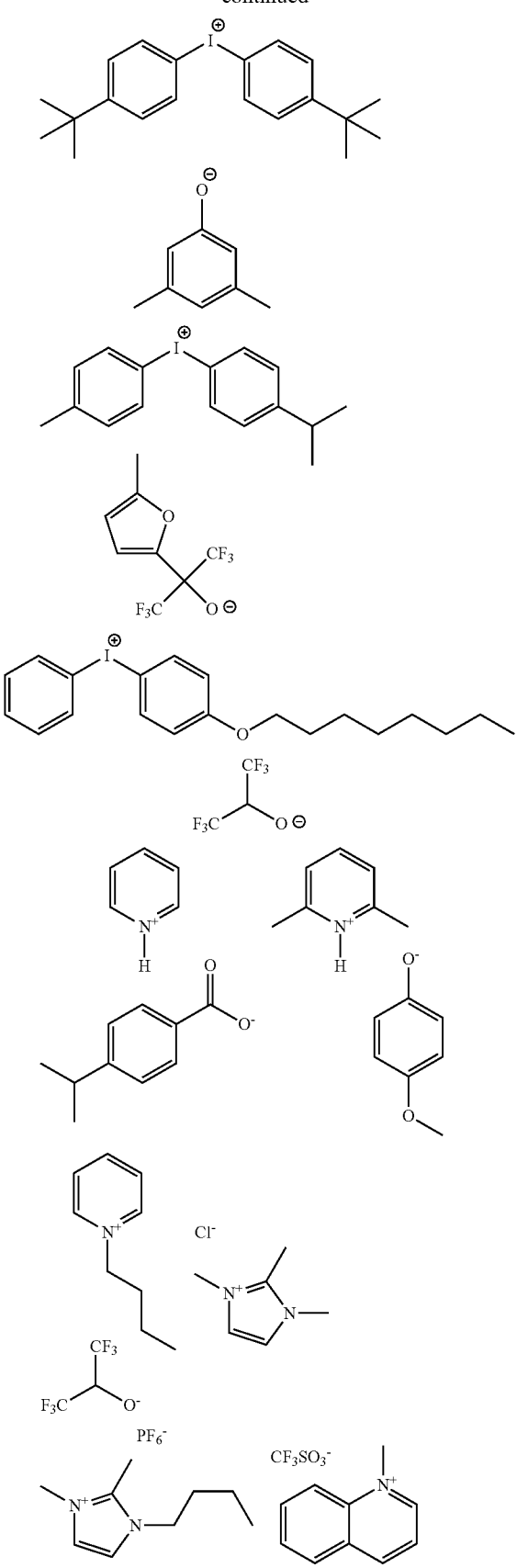

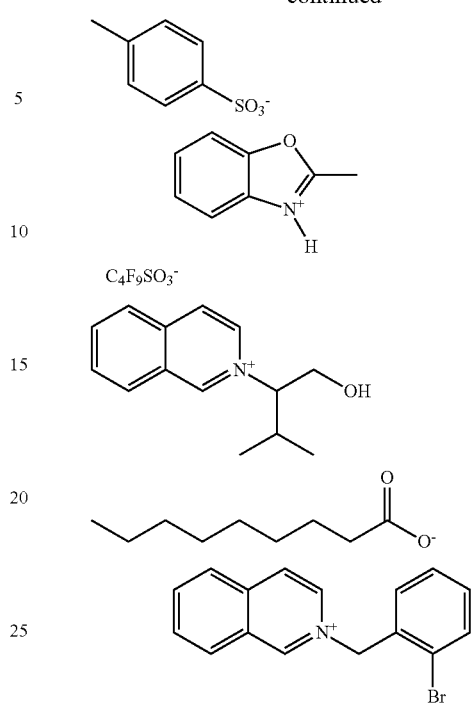

The lower limit of the pKa of a conjugate acid of the anion contained in the onium salt is preferably 4.0, and more preferably 5.0. The upper limit of the pKa is preferably 11.0, and more preferably 10.5. When the pKa of the conjugate acid of the anion falls within the above range, pattern collapse of the resist pattern can be inhibited more favorably. It is to be noted that the pKa is a value calculated using ACD/ChemSketch (ACD/Labs 8.00 Release Product Version: 8.08).

The pKa values of the conjugate acids of the anions are shown below.

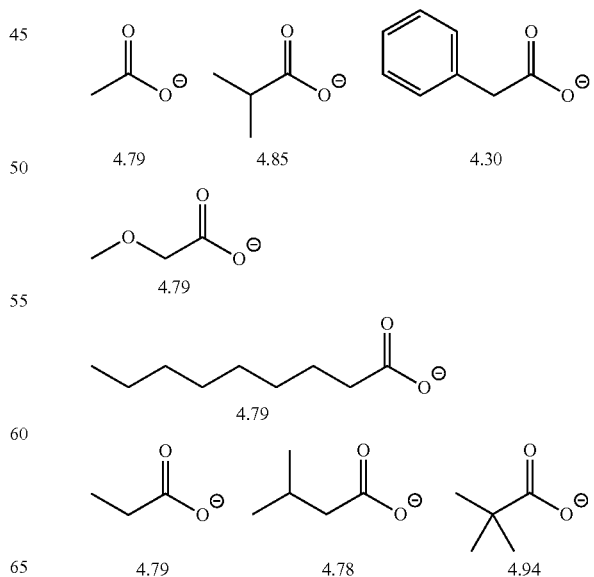

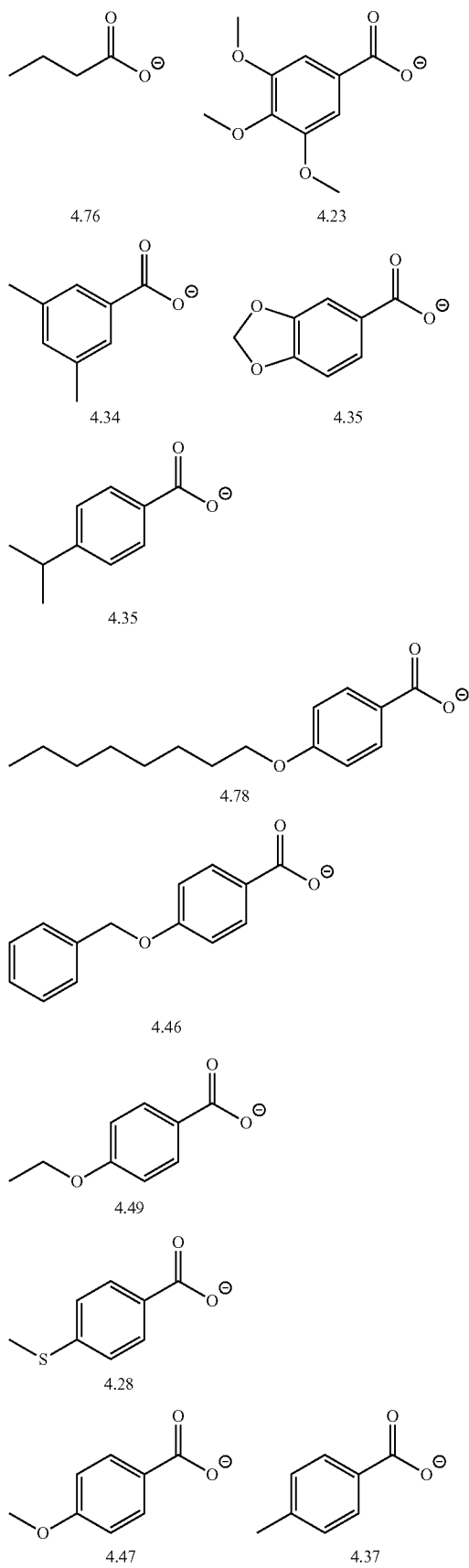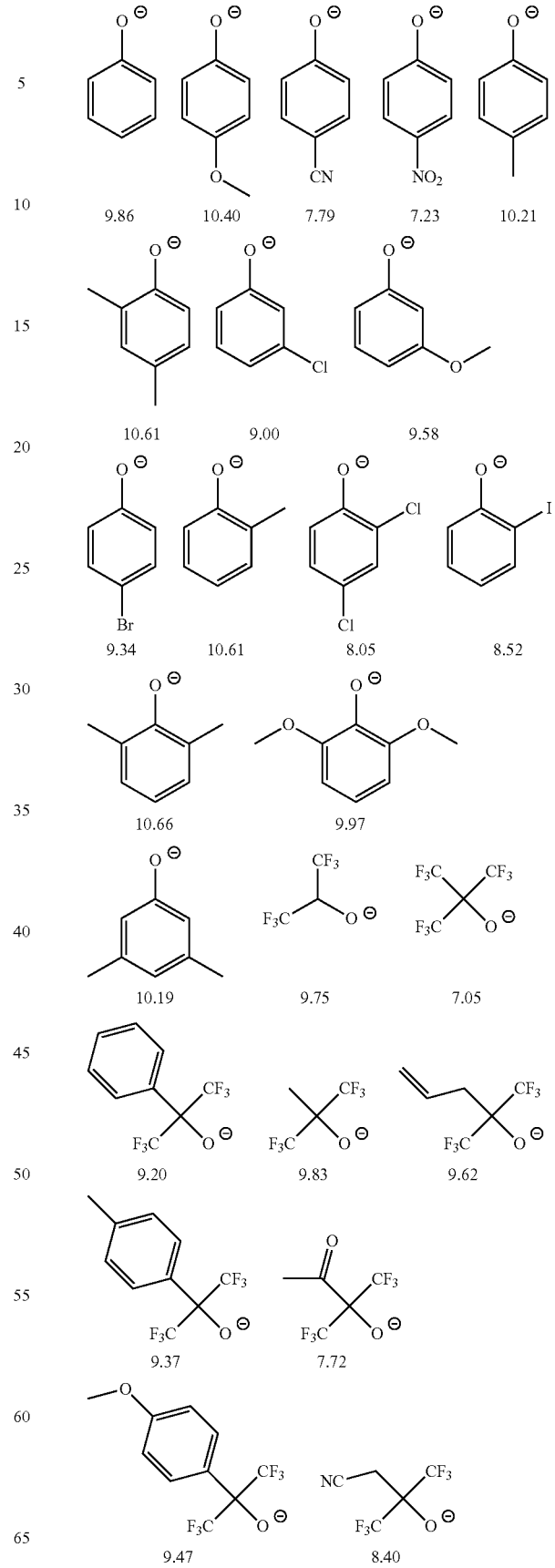

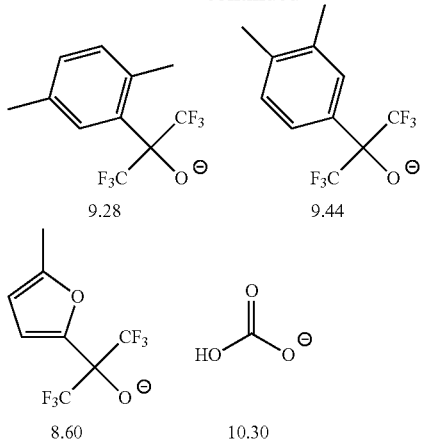

The lower limit of the ratio of the sum of the atomic masses of all the carbon atoms contained in the cation of the onium salt to the sum of the atomic masses of all the atoms constituting the cation of the onium salt ([(the number of carbon atoms)×12]/(the sum of the atomic masses of all the atoms constituting the cation)) is preferably 0.4, and more preferably 0.5. The upper limit of the ratio is preferably 0.75, and more preferably 0.65.

As the onium salt, a compound represented by the following formula (B-1) and a compound represented by the following formula (B-2) are preferred.

  (B-1)

  (B-2)

In the above formulae (B-1) and (B-2), $M^+$s each independently represent a nitrogen cation, a phosphorus cation, a sulfur cation or an iodine cation; $R^C$s each independently represent a hydrogen atom or a monovalent organic group; m1 is an integer of 2 to 4; m2 is 3 in a case where $M^+$ represents the nitrogen cation or the phosphorus cation, m2 is 2 in a case where $M^+$ represents the sulfur cation, and m2 is 1 in a case where $M^+$ represents the iodine cation, wherein in a case where $R^C$ is present in a plurality of number, a plurality of $R^C$s may be identical or different, and may taken together represent a ring structure together with the $M^+$ to which the plurality of $R^C$s bond; $L^A$ represents a divalent linking group; and $Y^-$s each independently represent a monovalent anion.

$M^+$ preferably represents a nitrogen cation.

The monovalent organic group which may be represented by $R^C$ is exemplified by a monovalent hydrocarbon group, a group obtained by incorporating a hetero atom-containing group between two adjacent carbon atoms of the hydrocarbon group, a group obtained by substituting with a substituent, a part or all of hydrogen atoms included in the hydrocarbon group or the group obtained by incorporating a hetero atom-containing group between two adjacent carbon atoms of the hydrocarbon group, and the like.

Examples of the hydrocarbon group include: chain hydrocarbon groups such as alkyl groups, alkenyl groups and alkynyl groups; alicyclic hydrocarbon groups such as cycloalkyl groups and cycloalkenyl groups; aromatic hydrocarbon groups such as aryl groups and aralkyl groups; and the like. The lower limit of the number of carbon atoms of the chain hydrocarbon group is preferably 1. On the other hand, the upper limit of the number of carbon atoms of the chain hydrocarbon group is preferably 20, more preferably 15, and still more preferably 5. The lower limit of the number of carbon atoms of the alicyclic hydrocarbon group is preferably 3, and more preferably 5. On the other hand, the upper limit of the number of carbon atoms of the alicyclic hydrocarbon group is preferably 20, and more preferably 15. The lower limit of the number of carbon atoms of the aromatic hydrocarbon group is preferably 6. On the other hand, the upper limit of the number of carbon atoms of the aromatic hydrocarbon group is preferably 20, and more preferably 10.

Examples of the hetero atom of the hetero atom-containing group include halogen atoms, an oxygen atom, a nitrogen atom, a sulfur atom, a selenium atom, a tellurium atom, and the like. Examples of the hetero atom-containing group include $-Y_1-$, $-N(R^a)-$, $-C(=Y_2)-$, $-CON(R^b)-$, $-C(=Y_3)Y_4-$, $-SO_t-$, $-SO_2N(R^C)-$, halogen atoms, a combination of at least two of these groups, and the like, wherein $Y_1$ to $Y_4$ each independently represent an oxygen atom, a sulfur atom, a selenium atom or a tellurium atom. Of these, $Y_1$ to $Y_4$ each independently represent preferably an oxygen atom or a sulfur atom in light of greater ease of handling. $R^a$, $R^b$ and $R^C$ each independently represent a hydrogen atom or a hydrocarbon group having 1 to 20 carbon atoms, and t is an integer of 1 to 3. In a case where the hetero atom-containing group is included between two adjacent carbon atoms of the aromatic hydrocarbon group, an aromatic heterocyclic group is formed.

$R^C$ preferably represents an alkyl group, an alkenyl group, a cycloalkyl group, an aryl group, or a group obtained by incorporating a hetero atom-containing group between two adjacent carbon atoms of these groups.

In a case where the ring structure taken together represented by the plurality of $R^C$s has aromaticity, the cation of the onium salt is exemplified by a pyridinium cation represented by the following formula (C-1), and the like. In addition, in a case where $R^C$ has an additional hetero atom, the cation of the onium salt is exemplified by an imidazolium cation represented by the following formula (C-2), and the like.

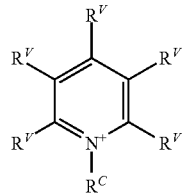  (C-1)

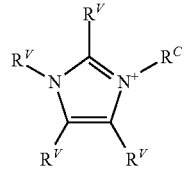  (C-2)

In the above formulae (C-1) and (C-2), $R^V$s each independently represent a hydrogen atom or an alkyl group, wherein the plurality of $R^V$s may taken together represent a ring together with the carbon chain to which the plurality of $R^V$s bond; and $R^C$ is as defined in the above formula (B-1).

Examples of the divalent linking group represented by $L^A$ include substituted or unsubstituted divalent hydrocarbon groups, $-O-$, $-S-$, $-SO_2-$, $-NR-$, $-CO-$, $-NH-$, $-COO-$, $-CONH-$, or a combination of at least two of these groups, and the like, wherein R represents an alkyl group. Of these, substituted or unsubstituted divalent hydrocarbon groups are preferred, substituted or unsubstituted divalent chain hydrocarbon groups having 1 to 8 carbon atoms, substituted or unsubstituted divalent alicyclic hydrocarbon groups having 3 to 10 carbon atoms and substituted or unsubstituted divalent aromatic hydrocarbon groups having 6 to 12 carbon atoms are more preferred, and a methylene group, an ethylene group, a propylene group and a phenylene group are still more preferred.

Onium Salt-Containing Polymer

The onium salt-containing polymer has an onium salt structure in a side chain or main chain thereof. The onium salt-containing polymer can give a hydrogen bond and/or a dipole-dipole interaction with a polar group such as —COOH generated in the polymer (A). The definition of the onium salt in this section is the same as the definition of the aforementioned onium salt. The onium salt-containing polymer is exemplified by a polymer having a structural unit that includes an onium salt structure, and the like.

Examples of the onium salt-containing polymer include a polymer that has a structural unit represented by the following formula (D-1), and the like.

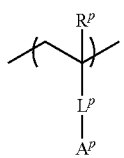

(D-1)

In the above formula (D-1), $R^p$ represents a hydrogen atom or an alkyl group; L' represents a divalent linking group; and $A^p$ represents a group obtained by eliminating one hydrogen atom from the onium salt represented by either the formula (B-1) or the formula (B-2).

The number of carbon atoms of the alkyl group which may be represented by $R^p$ is preferably 1 to 20, and more preferably 1 to 10.

Examples of the divalent linking group represented by $L^p$ include divalent linking groups similar to those exemplified in connection with the divalent linking group represented by $L^A$, and the like. Of these, alkylene groups, arylene groups, —COO— and a combination of at least two of these groups are preferred, and alkylene groups are more preferred.

The lower limit of the proportion of the structural unit represented by the above formula (D-1) contained with respect to the total structural units constituting the polymer having a structural unit that includes an onium salt is preferably 30 mol %, and more preferably 50 mol %. The upper limit of the proportion of the structural unit represented by the above formula (D-1) contained is preferably 100 mol %, and more preferably 90 mol %.

The lower limit of the Mw of the onium salt-containing polymer is preferably 1,000, and more preferably 2,000. The upper limit of the Mw is preferably 30,000, and more preferably 10,000.

As the structural unit represented by the above formula (D-1), a structural unit represented by the following formula (D-2) is preferred.

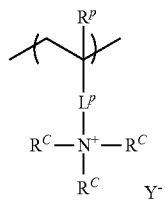

(D-2)

In the above formula (D-2), $R^C$s each independently represent a hydrogen atom or a monovalent organic group; $R^p$ and $L^p$ are as defined in the above formula (D-1); and $Y^-$ is as defined in the above formulae (B-1) and (B-2).

As the structural unit represented by the above formula (D-2), structural units represented by the following formulae (D-3) to (D-5) are preferred.

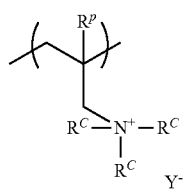

(D-3)

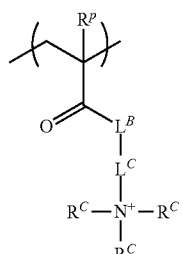

(D-4)

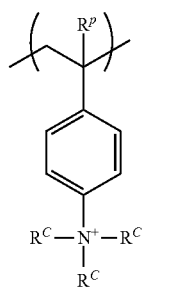

(D-5)

In the above formulae (D-3) to (D-5), $R^C$, $R^p$ and $Y^-$ are as defined in the above formula (D-2).

In the above formula (D-4), $L^B$ represents —O—, —NH— or —NR—; and $L^C$ represents an alkylene group.

Basic Polymer

The basic polymer includes a proton-accepting group. The basic polymer can give a hydrogen bond, a covalent bond, a coordinate bond and/or a dipole-dipole interaction by means of the proton-accepting group with a polar group, which will be described later, generated in the polymer (A). The proton-accepting group may be included in any of the main chain and a side chain of the basic polymer.

The basic polymer typically has a structural unit that includes a proton-accepting group. This basic polymer may further have a structural unit that does not include a proton-accepting group.

Examples of the proton-accepting group include an amino group, a phosphino group, and the like. The "amino group" as referred to encompasses a primary amino group, a secondary amino group and a tertiary amino group. It is to be noted that the secondary amino group also encompasses cyclic secondary amino groups such as a pyrrolidino group, a piperidino group, a piperazino group and a hexahydrotriazino group. The "phosphino group" as referred to encompasses a primary phosphino group, a secondary phosphino group and a tertiary phosphino group. The proton-accepting group is preferably the amino group.

The side chain that includes the amino group is exemplified by structures represented by the following formulae, and the like.

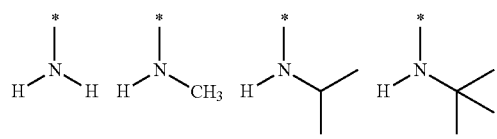

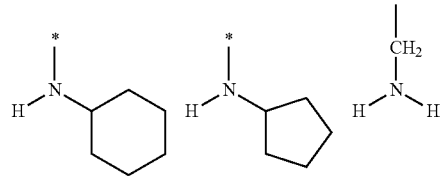

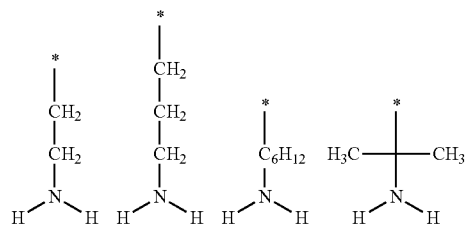

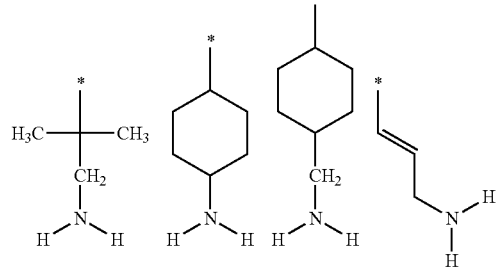

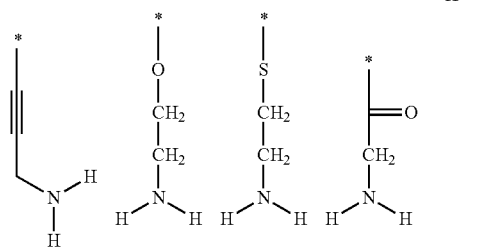

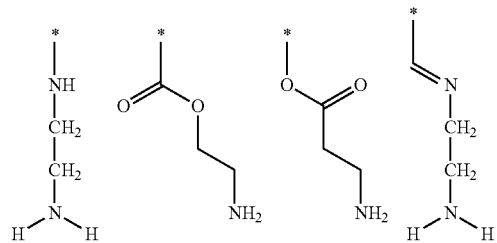

-continued

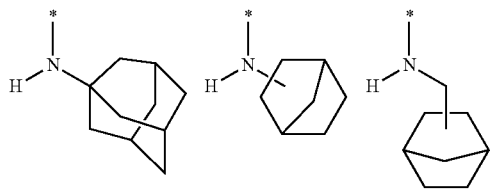

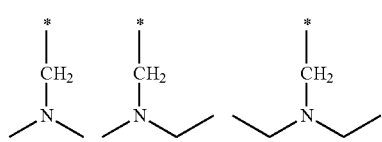

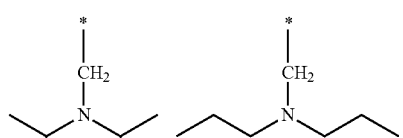

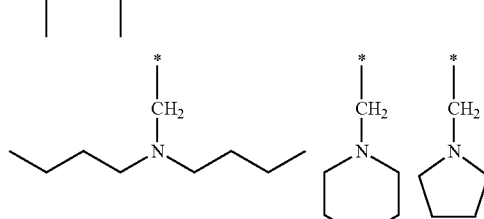

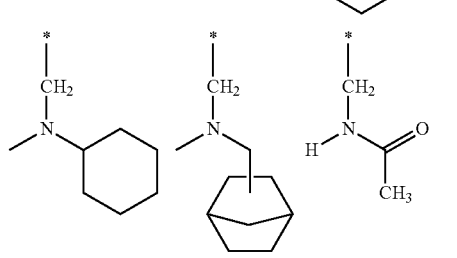

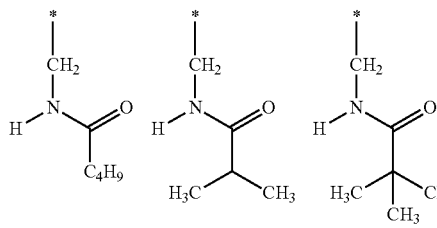

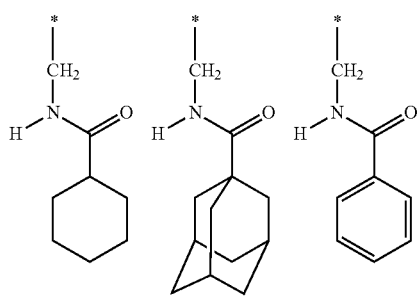

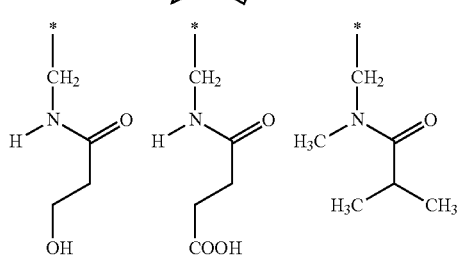

-continued

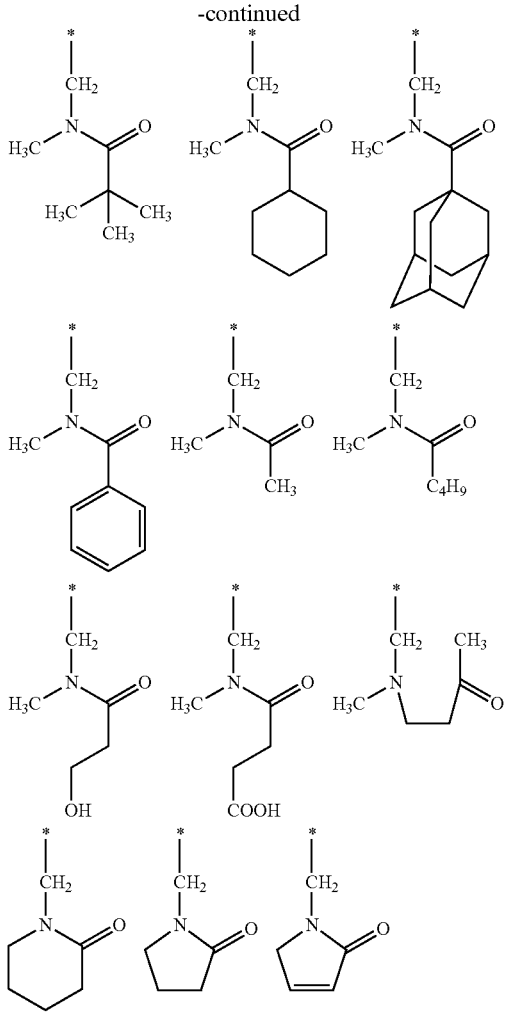

In the above formula, * denotes a binding site to the main chain of the basic polymer.

Examples of the basic polymer that includes the amino group include polyallylamine, polyethyleneimine, polyvinylpyridine, polyvinylimidazole, polypyrimidine, polytriazole, polyquinoline, polyindole, polypurine, polyvinylpyrrolidone, polybenzimidazole, and the like.

The structural unit that includes the proton-accepting group is exemplified by a structural unit represented by the following formula (E), and the like.

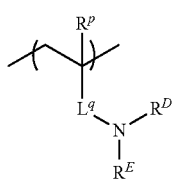

(E)

In the above formula (E), $R^q$ represents a hydrogen atom or an alkyl group; $R^D$ and $R^E$ each independently represent a hydrogen atom or a monovalent organic group; and $L^q$ represents a divalent linking group.

The number of carbon atoms of the alkyl group which may be represented by $R^q$ is preferably no less than 1 and no greater than 4, and more preferably 1 or 2.

Examples of the monovalent organic group which may be represented by $R^D$ or $R^E$ include organic groups similar to those exemplified in connection with the organic group represented by $R^C$, and the like.

Examples of the divalent linking group represented by $L^q$ include divalent linking groups similar to those exemplified in connection with the divalent linking group represented by $L^A$, and the like. Of these, alkylene groups, arylene groups, —COO— and a combination of at least two of these groups are preferred, and alkylene groups are more preferred.

Examples of the structural unit represented by the above formula (E) include structural units represented by the following formulae, and the like.

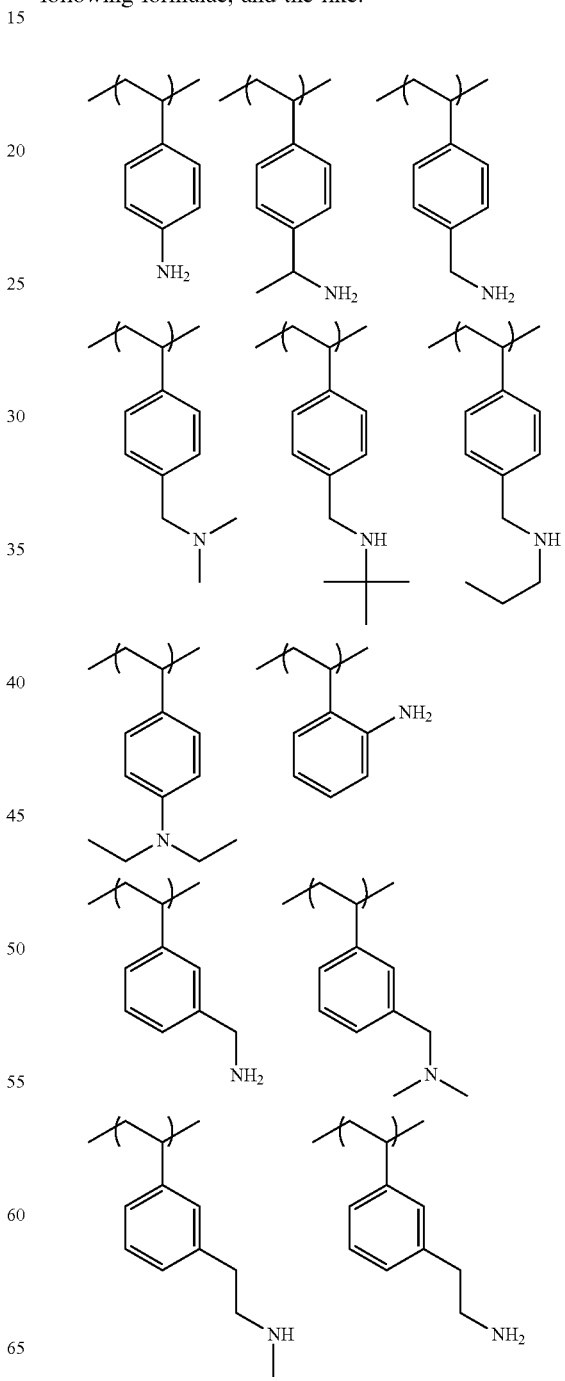

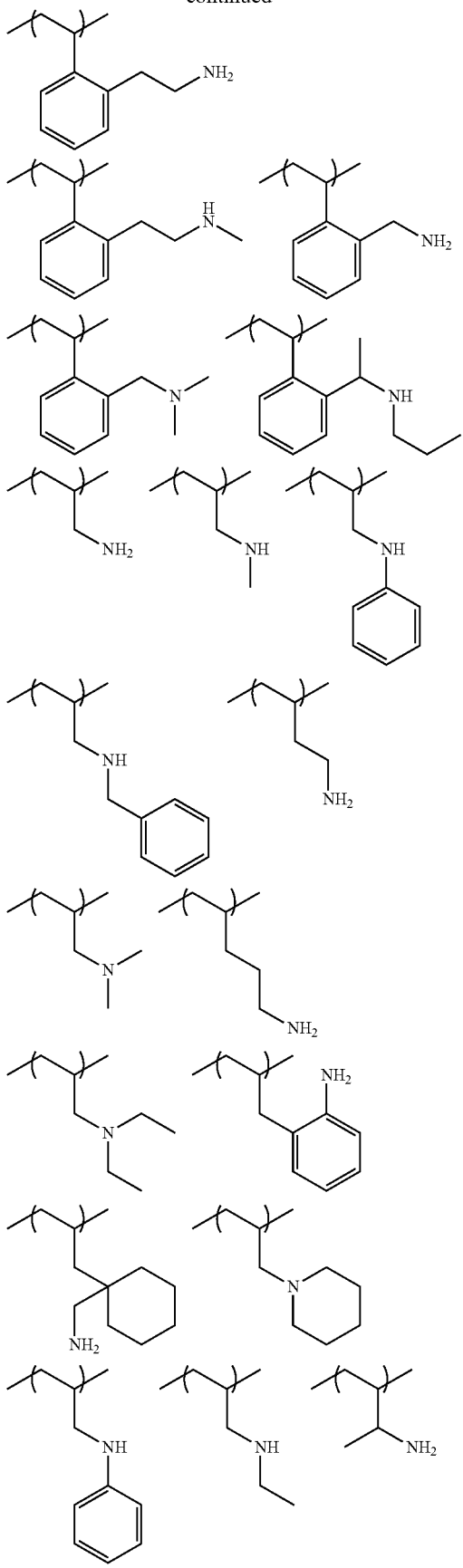

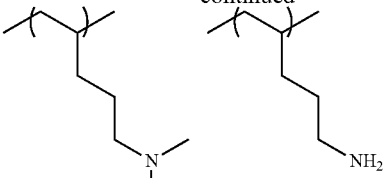

The lower limit of the proportion of the structural unit represented by the above formula (E) contained with respect to the total structural units constituting the polymer having the structural unit that includes the proton-accepting group is preferably 40 mol %, and more preferably 70 mol %. The upper limit of the proportion of the structural unit represented by the above formula (E) contained is preferably 100 mol %, and more preferably 90 mol %.

The lower limit of the Mw of the basic polymer is preferably 1,000, and more preferably 2,000. The upper limit of the Mw is preferably 30,000, and more preferably 10,000.

Phosphorus Compound

The phosphorus compound contains at least one trivalent phosphorus atom. The lower limit of the molecular weight of the phosphorus compound is preferably 70, and more preferably 100. The upper limit of the molecular weight is preferably 500, and more preferably 300.

The phosphorus compound is preferably a compound represented by the following formula (F-1) or a compound represented by the following formula (F-2).

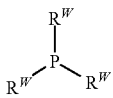
(F-1)

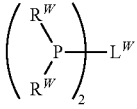
(F-2)

In the above formulae (F-1) and (F-2), $R^W$s each independently represent a monovalent organic group; and $L^W$ represents a divalent linking group.

Examples of the monovalent organic group represented by $R^W$ include organic groups similar to those exemplified in connection with the organic group represented by $R^C$, and the like.

Examples of the divalent linking group represented by $L^W$ include divalent linking groups similar to those exemplified in connection with the divalent linking group represented by $L^A$, and the like. Of these, divalent hydrocarbon groups are preferred.

Examples of the phosphorus compound include compounds represented by the following formulae, and the like.

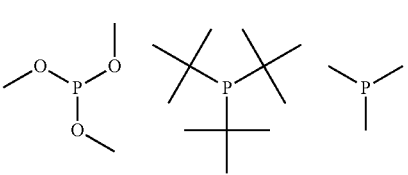

-continued

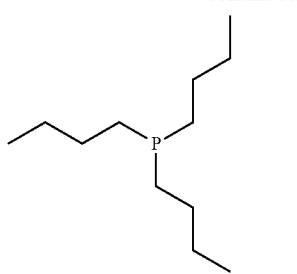
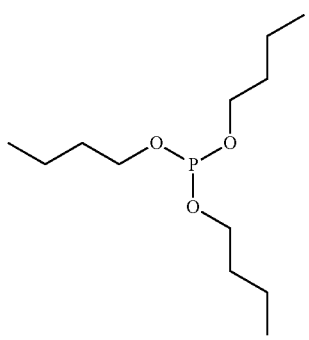
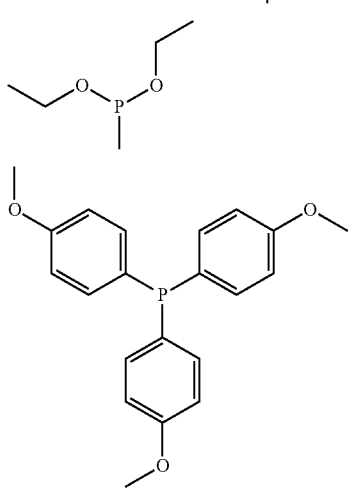
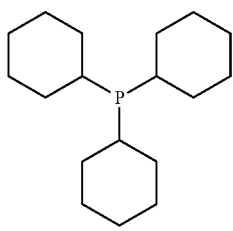
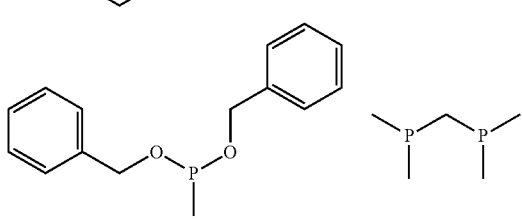
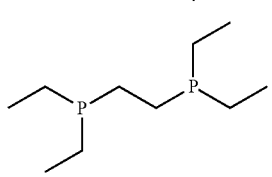

-continued

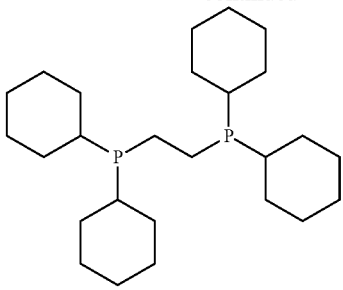
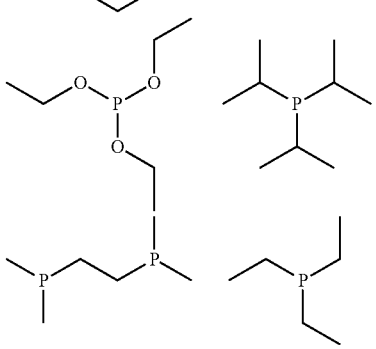

The development procedure is exemplified by: a procedure in which the substrate is immersed for a given time period in the developer solution charged in a container (dip procedure); a procedure in which the developer solution is placed to form a dome-shaped bead by way of the surface tension on the surface of the substrate for a given time period to conduct a development (puddle procedure); a procedure in which the developer solution is sprayed onto the surface of the substrate (spray procedure); a procedure in which the developer solution is continuously applied onto the substrate that is rotated at a constant speed while scanning with a developer solution-application nozzle at a constant speed (dynamic dispensing procedure); and the like.

Substrate Pattern-Forming Step

In the substrate pattern-forming step, the substrate is etched, for example, by using, as a mask, the resist pattern formed in the development step such that the substrate has a pattern. The etching may be dry etching under an atmosphere such as plasma excitation, or wet etching in which the substrate is immersed in a chemical liquid. After subjecting the substrate to the pattern formation, the resist pattern is normally eliminated.

EXAMPLES

Hereinafter, the present invention is explained in detail by way of Examples, but the present invention is not in any way limited to these Examples. Measuring methods for various types of physical properties are shown below.

Weight Average Molecular Weight (Mw) and Number Average Molecular Weight (Mn)

The Mw and the Mn of the polymer were determined by gel permeation chromatography (GPC) under the following conditions:

columns: "G2000 HXL"×2, "G3000 HXL"×1 and "G4000 HXL"×1 available from Tosoh Corporation;

eluent: tetrahydrofuran (available from Wako Pure Chemical Industries, Ltd.);

flow rate: 1.0 mL/min;

sample concentration: 1.0% by mass;

amount of injected sample: 100 µL;

detector: differential refractometer; and standard substance: mono-dispersed polystyrene.

Content of Low Molecular Weight Component

The content (% by mass) of a low molecular weight component (a component having a molecular weight of no greater than 1,000) in the polymer was determined by high performance liquid chromatography (HPLC) under the following conditions:

column: "Inertsil ODS-25 μm column" (4.6 mmφ×250 mm) available from GL Sciences, Inc.;

eluent: acrylonitrile/0.1% by mass aqueous phosphoric acid solution;

flow rate: 1.0 mL/min;

sample concentration: 1.0% by mass;

amount of injected sample: 100 μL; and detector: differential refractometer.

Proportion of Structural Unit

The proportion of the structural unit in the polymer was determined by $^{13}$C-NMR analysis using a nuclear magnetic resonance apparatus ("JNM-EX400" available from JEOL, Ltd.) and DMSO-$d_6$ as a solvent for measurement.

Syntheses of Polymer (A) and Polymer (F)

Monomers used in the syntheses of the polymer (A) and the polymer (F) are shown below.

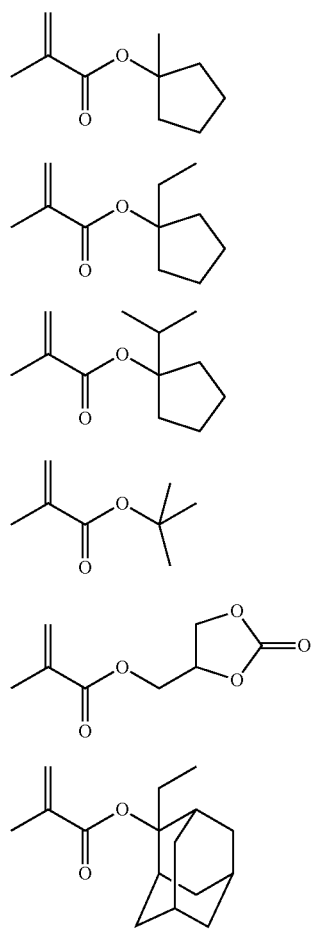

(M-1)

(M-2)

(M-3)

(M-4)

(M-5)

(M-6)

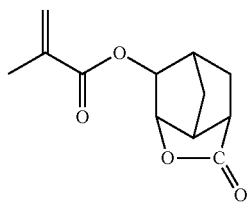

(M-7)

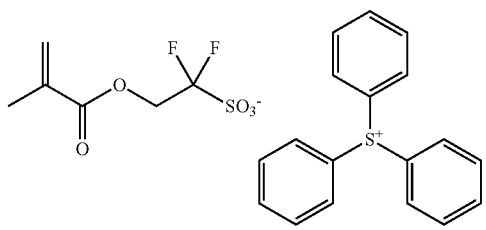

(M-8)

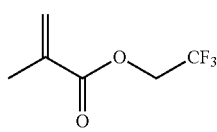

(M-9)

Synthesis of Polymer (A)

Synthesis Example 1

A monomer solution was prepared by dissolving 43.08 g (50 mol %) of the monomer (M-1) and 56.92 g (50 mol %) of the monomer (M-7) in 200 g of 2-butanone, and adding thereto 4.21 g (5 mol % with respect to the total amount of the monomers) of AIBN as a radical polymerization initiator. Into a 1,000 mL three-neck flask was charged 100 g of 2-butanone, followed by nitrogen-purging for 30 min. Then, the flask was heated to 80° C. with stirring, and the monomer solution was added thereto dropwise over 3 hrs using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. The cooled polymerization reaction mixture was charged into 2,000 g of methanol, and the precipitated white powder was filtered off. The collected white powder was washed twice with 400 g of methanol and filtered off, followed by drying at 50° C. for 17 hrs to obtain a polymer (A-1) as a white powder (73 g, 73% yield). The polymer (A-1) had the Mw of 7,730 and the Mw/Mn of 1.51, and the content of the low molecular weight component was 0.05% by mass. In addition, the result of $^{13}$C-NMR analysis indicated that the proportions of the structural unit derived from (M-1) and the structural unit derived from (M-7) were 47.3 mol % and 52.7 mol %, respectively.

Synthesis Examples 2 to 10

Polymers (A-2) to (A-10) were synthesized by a similar operation to that for Synthesis Example 1 except that the type and the amount of the monomer used, and the amount (mol % with respect to the total amount of the monomers) of AIBN charged were as shown in Table 1. The monomer (M-8) gives a structural unit of the polymer (A) in which the structure of a radiation-sensitive acid generating agent was incorporated. Proportions (mol %) of the structural units, the Mw, the Mw/Mn and the content (% by mass) of the low molecular weight component are shown together in Table 1.

TABLE 1

| (A) Polymer | | Monomer giving structural unit(I) | | | Monomer giving structural unit(II) or other structural unit | | | Amount of AIBN (mol %) | Mw | Mw/Mn | Content of low molecular weight component (% by mass) |
|---|---|---|---|---|---|---|---|---|---|---|---|
| | | type | amount (mol %) | proportion of structural unit (mol %) | type | amount (mol %) | proportion of structural unit (mol %) | | | | |
| Synthesis Example 1 | A-1 | M-1 | 50 | 47.3 | M-7 | 50 | 52.7 | 5.0 | 7,730 | 1.51 | 0.05 |
| Synthesis Example 2 | A-2 | M-1 | 50 | 50.1 | M-7 | 50 | 49.9 | 2.0 | 13,020 | 1.56 | 0.04 |
| Synthesis Example 3 | A-3 | M-1 | 50 | 50.3 | M-7 | 50 | 49.7 | 1.0 | 20,890 | 1.61 | 0.03 |
| Synthesis Example 4 | A-4 | M-2 | 50 | 49.4 | M-7 | 50 | 50.6 | 1.5 | 16,580 | 1.59 | 0.05 |
| Synthesis Example 5 | A-5 | M-3 | 50 | 48.1 | M-7 | 50 | 51.9 | 3.0 | 9,860 | 1.48 | 0.04 |
| Synthesis Example 6 | A-6 | M-4 | 50 | 46.9 | M-7 | 50 | 53.1 | 2.0 | 13,460 | 1.53 | 0.05 |
| Synthesis Example 7 | A-7 | M-1 | 40 | 38.1 | M-5 | 10 | 9 | 3.5 | 8,790 | 1.49 | 0.05 |
| | | | | | M-7 | 50 | 52.9 | | | | |
| Synthesis Example 8 | A-8 | M-1 | 35 | 33.0 | M-7 | 50 | 54.1 | 5.0 | 7,020 | 1.50 | 0.03 |
| | | M-6 | 15 | 12.9 | | | | | | | |
| Synthesis Example 9 | A-9 | M-1 | 45 | 42.1 | M-7 | 45 | 50.9 | 5.0 | 7,240 | 1.54 | 0.05 |
| | | | | | M-8 | 10 | 7 | | | | |
| Synthesis Example 10 | A-10 | M-1 | 50 | 46.2 | M-7 | 50 | 53.8 | 10.0 | 4,700 | 1.41 | 0.07 |

Synthesis of Polymer (F)

Synthesis Example 11

A monomer solution was prepared by dissolving 71.67 g (70 mol %) of the monomer (M-2) and 28.33 g (30 mol %) of the monomer (M-9) in 100 g of 2-butanone, and adding thereto 10.35 g of dimethyl 2,2'-azobisisobutyrate as a radical polymerization initiator. Into a 1,000 mL three-neck flask was charged 100 g of 2-butanone, followed by nitrogen-purging for 30 min. Then, the flask was heated to 80° C. with stirring, and the monomer solution was added thereto dropwise over 3 hrs using a dropping funnel. The time of the start of the dropwise addition was regarded as the time of the start of the polymerization reaction, and the polymerization reaction was allowed to proceed for 6 hrs. After the completion of the polymerization reaction, the polymerization reaction mixture was water-cooled to 30° C. or below. The cooled polymerization reaction mixture was transferred to a 4 L separatory funnel, then homogeneously diluted with 300 g of n-hexane, and 1,200 g of methanol was charged thereinto followed by mixing. To this mixed liquid was further charged 60 g of distilled water, and the mixture was further stirred and left to stand for 30 min. Thereafter, the lower layer was recovered, and the lower layer was subjected to solvent substitution to obtain a propylene glycol monomethyl ether acetate solution of a polymer (F-1) (60% yield). The polymer (F-1) had the Mw of 7,200 and the Mw/Mn of 2.00, and the content of the low molecular weight component was 0.07% by mass. In addition, the result of $^{13}$C-NMR analysis indicated that the proportions of the structural unit derived from (M-2) and the structural unit derived from (M-9) were 71.1 mol % and 28.9 mol %, respectively.

Preparation of Chemically Amplified Resist Material

Components which were used in the preparation of the chemically amplified resist material and were other than the polymer (A) and the polymer (F) are shown below.

(b) Radiation-Sensitive Sensitizer Generating Agent b-1: bis(4-methoxyphenyl)ketone dimethyl acetal
  b-2: bis(4-methoxyphenyl)methanol The radiation-sensitive sensitizer generating agents (b-1) and (b-2) are to be converted to a radiation-sensitive sensitizer, 4,4'-dimethoxybenzophenone (hereinafter, may be also referred to as "sensitizer (b-1')"), by an action of an acid.

With respect to each of the radiation-sensitive sensitizer generating agents (b-1) and (b-2), and the sensitizer (b-1'), a 0.0001% by mass cyclohexane solution thereof was prepared, and the absorbance of each solution was measured using cyclohexane as a reference solvent and a spectrophotometer ("V-670" available from JASCO Corporation). The absorbance of the reference solvent at the wavelength of 320 nm was subtracted from the absorbance of the solution to be measured at the wavelength of 320 nm, whereby the absorbance attributed to each of the radiation-sensitive sensitizer generating agents (b-1) and (b-2) and the sensitizer (b-1') was determined. Consequently, the absorbance of the sensitizer (b-1') was ascertained to be at least 5 times greater than the absorbance of the radiation-sensitive sensitizer generating agents (b-1) and (b-2). It is to be noted that the transmittance of the cyclohexane solvent used in the measurement of the absorbance was confirmed to be no less than 95% at the wavelength of 320 nm.

(c) Radiation-Sensitive Acid Generating Agent c-1: diphenyliodonium nonafluoro-n-butanesulfonate (a compound represented by the following formula (c-1))

c-2: 4-cyclohexylsulfonylphenyldiphenylsulfonium 4-[2-(norbornanelacton-2-yloxycarbonyl)cyclohexan-1-ylcarbonyloxy]-1,1,2-trifluorobutane-1-sulfonate (a compound represented by the following formula (c-2))

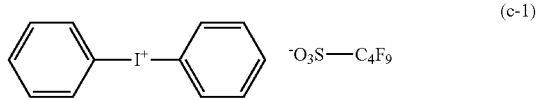

(c-1)

(c-2)

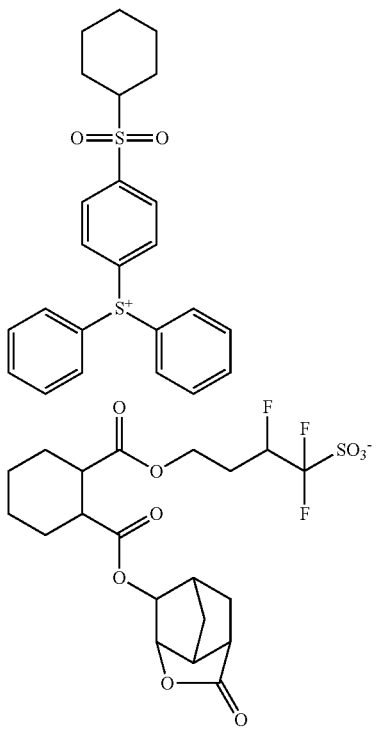

Acid Diffusion Control Agent

D-1: 4-hydroxy-N-t-amyloxycarbonylpiperidine (a compound represented by the following formula (D-1))

D-2: triphenylsulfonium salicylate (a compound represented by the following formula (D-2))

D-3: triphenylsulfonium 10-camphorsulfonate (a compound represented by the following formula (D-3))

D-4: triphenylsulfonium N-n-butyltrifluoromethylsulfonamide (a compound represented by the following formula (D-4))

D-5: 4-cyclohexylsulfonylphenyldiphenylsulfonium 1,2-di(cyclohexyloxycarbonyl)ethane-1-sulfonate (a compound represented by the following formula (D-5))

D-6: 4-cyclohexylsulfonylphenyldiphenylsulfonium 1,2-di(norbornanelacton-2-yloxycarbonyl)ethane-1-sulfonate (a compound represented by the following formula (D-6))

(D-1)

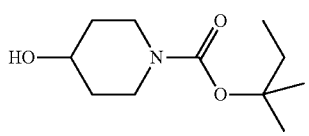

(D-2)

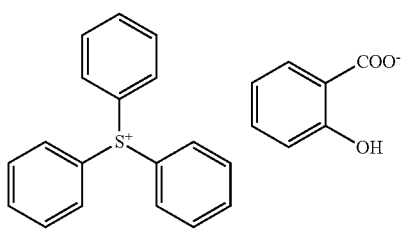

(D-3)

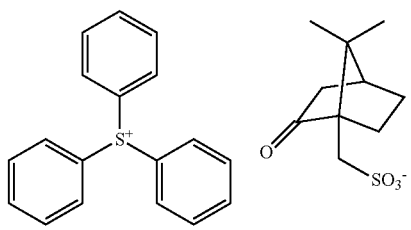

(D-4)

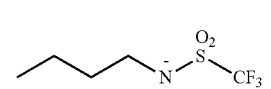

(D-5)

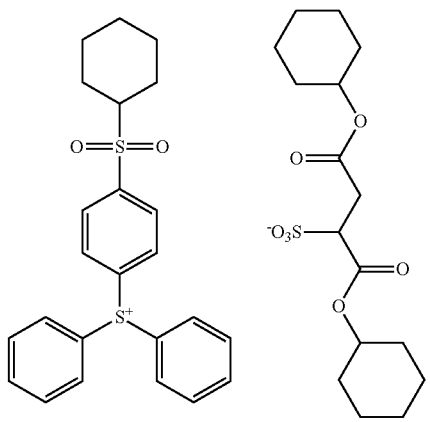

(D-6)

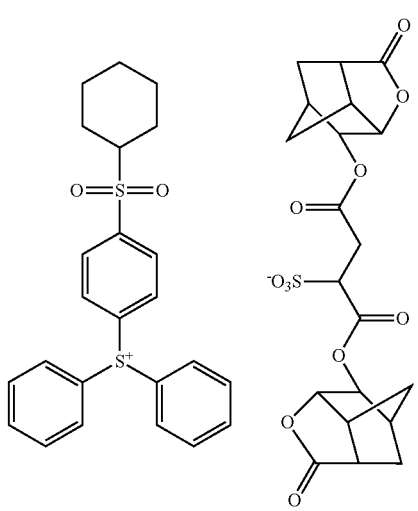

Solvent
E-1: propylene glycol monomethyl ether acetate
E-2: cyclohexanone
E-3: γ-butyrolactone Preparation Example 1

A chemically amplified resist material (J-1) was prepared by mixing 100 parts by mass of (A-1) as the polymer (A), 5 parts by mass of (b-1) as the radiation-sensitive sensitizer generating agent (b), 11 parts by mass of (c-1) as the radiation-sensitive acid generating agent (c), 4.5 parts by mass of (D-2) as the acid diffusion control agent, 3,240 parts by mass of (E-1), 1,400 parts by mass of (E-2) and 30 parts by mass of (E-3) as the solvent, and 3 parts by mass of (F-1) as the polymer (F), and filtering the resulting mixed solution through a membrane filter having a pore size of 0.20 μm.

Preparation Examples 2 to 16 and Comparative Preparation Examples 1 to 18

Chemically amplified resist materials (J-2) to (J-16) and (CJ-1) to (CJ-18) were prepared in a similar manner to Preparation Example 1 except that the type and the amount of each component used were as shown in Tables 2 and 3.

TABLE 2

| | | (1) Polymer component | | | | (2) Component | | | | | | |
| | | (A) polymer | | (F) polymer | | (b) radiation-sensitive sensitizer generating agent | | (c) radiation-sensitive acid generating agent | | Acid diffusion control agent | | Solvent | |
| | Chemically amplified resist material | type | amount (parts by mass) | type | amount (parts by mass) | type | amount (parts by mass) | type | amount (parts by mass) | type | amount (parts by mass) | type | amount (parts by mass) |
|---|---|---|---|---|---|---|---|---|---|---|---|---|---|
| Preparation Example 1 | J-1 | A-1 | 100 | F-1 | 3 | b-1 | 5 | c-1 | 11 | D-2 | 4.5 | E-1/E-2/E-3 | 3,240/1,400/30 |
| Comparative Preparation Example 1 | CJ-1 | A-1 | 100 | F-1 | 3 | b-2 | 5 | c-1 | 11 | D-2 | 4.5 | E-1/E-2/E-3 | 3,240/1,400/30 |
| Comparative Preparation Example 2 | CJ-2 | A-1 | 100 | F-1 | 3 | — | — | c-1 | 11 | D-2 | 4.5 | E-1/E-2/E-3 | 3,240/1,400/30 |
| Preparation Example 2 | J-2 | A-1 | 100 | — | — | b-1 | 5 | c-2 | 20 | D-1 | 1.5 | E-1/E-2/E-3 | 3,240/1,400/30 |
| Comparative Preparation Example 3 | CJ-3 | A-1 | 100 | — | — | b-2 | 5 | c-2 | 20 | D-1 | 1.5 | E-1/E-2/E-3 | 3,240/1,400/30 |
| Comparative Preparation Example 4 | CJ-4 | A-1 | 100 | — | — | — | — | c-2 | 20 | D-1 | 1.5 | E-1/E-2/E-3 | 3,240/1,400/30 |
| Preparation Example 3 | J-3 | A-2 | 100 | F-1 | 3 | b-1 | 2.5 | c-1 | 30 | D-3 | 7 | E-1/E-2/E-3 | 3,240/1,400/30 |
| Comparative Preparation Example 5 | CJ-5 | A-2 | 100 | F-1 | 3 | — | — | c-1 | 30 | D-3 | 7 | E-1/E-2/E-3 | 3,240/1,400/30 |
| Preparation Example 4 | J-4 | A-2 | 100 | F-1 | 3 | b-1 | 2.5 | c-2 | 35 | D-2 | 4.5 | E-1/E-2/E-3 | 3,240/1,400/30 |
| Comparative Preparation Example 6 | CJ-6 | A-2 | 100 | F-1 | 3 | — | — | c-2 | 35 | D-2 | 4.5 | E-1/E-2/E-3 | 3,240/1,400/30 |
| Preparation Example 5 | J-5 | A-3 | 100 | F-1 | 3 | b-1 | 10 | c-1 | 40 | D-1 | 1.5 | E-1/E-2/E-3 | 3,240/1,400/30 |
| Comparative Preparation Example 7 | CJ-7 | A-3 | 100 | F-1 | 3 | — | — | c-1 | 40 | D-1 | 1.5 | E-1/E-2/E-3 | 3,240/1,400/30 |
| Preparation Example 6 | J-6 | A-4 | 100 | F-1 | 3 | b-1 | 5 | c-1 | 35 | D-2 | 4.5 | E-1/E-2/E-3 | 3,240/1,400/30 |
| Comparative Preparation Example 8 | CJ-8 | A-4 | 100 | F-1 | 3 | — | — | c-1 | 35 | D-2 | 4.5 | E-1/E-2/E-3 | 3,240/1,400/30 |
| Preparation Example 7 | J-7 | A-5 | 100 | F-1 | 3 | b-1 | 4.5 | c-2 | 8.5 | D-2 | 4.5 | E-1/E-2/E-3 | 3,240/1,400/30 |
| Comparative Preparation Example 9 | CJ-9 | A-5 | 100 | F-1 | 3 | — | — | c-2 | 8.5 | D-2 | 4.5 | E-1/E-2/E-3 | 3,240/1,400/30 |
| Preparation Example 8 | J-8 | A-6 | 100 | F-1 | 3 | b-1 | 4.5 | c-1 | 15 | D-3 | 5 | E-1/E-2/E-3 | 3,240/1,400/30 |
| Comparative Preparation Example 10 | CJ-10 | A-6 | 100 | F-1 | 3 | — | — | c-1 | 15 | D-3 | 5 | E-1/E-2/E-3 | 3,240/1,400/30 |

TABLE 3

| | | (1) Polymer component | | | | (2) Component | | | | | | |
|---|---|---|---|---|---|---|---|---|---|---|---|---|
| | | (A)polymer | | (F) polymer | | (b) radiation-sensitive sensitizer generating agent | | (c) radiation-sensitive acid generating agent | | Acid diffusion control agent | | Solvent |
| | Chemically amplified resist material | type | amount (parts by mass) | type | amount (parts by mass) | type | amount (parts by mass) | type | amount (parts by mass) | type | amount (parts by mass) | type | amount (parts by mass) |
| Preparation Example 9 | J-9 | A-7 | 100 | F-1 | 3 | b-1 | 7 | c-1 | 17 | D-1 | 1.5 | E-1/E-2/E-3 | 3,240/1,400/30 |
| Comparative Preparation Example 11 | CJ-11 | A-7 | 100 | F-1 | 3 | — | — | c-1 | 17 | D-1 | 1.5 | E-1/E-2/E-3 | 3,240/1,400/30 |
| Preparation Example 10 | J-10 | A-8 | 100 | F-1 | 3 | b-1 | 7 | c-2 | 8.5 | D-2 | 4.5 | E-1/E-2/E-3 | 3,240/1,400/30 |
| Comparative Preparation Example 12 | CJ-12 | A-8 | 100 | F-1 | 3 | — | — | c-2 | 8.5 | D-2 | 4.5 | E-1/E-2/E-3 | 3,240/1,400/30 |
| Preparation Example 11 | J-11 | A-1 | 100 | F-1 | 3 | b-1 | 5 | c-1 | 20 | D-4 | 5 | E-1/E-2/E-3 | 3,240/1,400/30 |
| Comparative Preparation Example 13 | CJ-13 | A-1 | 100 | F-1 | 3 | — | — | c-1 | 20 | D-4 | 5 | E-1/E-2/E-3 | 3,240/1,400/30 |
| Preparation Example 12 | J-12 | A-1 | 100 | F-1 | 3 | b-1 | 5 | c-1 | 11 | D-5 | 8.5 | E-1/E-2/E-3 | 3,240/1,400/30 |
| Comparative Preparation Example 14 | CJ-14 | A-1 | 100 | F-1 | 3 | — | — | c-1 | 11 | D-5 | 8.5 | E-1/E-2/E-3 | 3,240/1,400/30 |
| Preparation Example 13 | J-13 | A-1 | 100 | F-1 | 3 | b-1 | 10 | c-1 | 20 | D-6 | 9.5 | E-1/E-2/E-3 | 3,240/1,400/30 |
| Comparative Preparation Example 15 | CJ-15 | A-1 | 100 | F-1 | 3 | — | — | c-1 | 20 | D-6 | 9.5 | E-1/E-2/E-3 | 3,240/1,400/30 |
| Preparation Example 14 | J-14 | A-5 | 100 | F-1 | 3 | b-1 | 5 | c-2 | 25 | D-4 | 5 | E-1/E-2/E-3 | 3,240/1,400/30 |
| Comparative Preparation Example 16 | CJ-16 | A-5 | 100 | F-1 | 3 | — | — | c-2 | 25 | D-4 | 5 | E-1/E-2/E-3 | 3,240/1,400/30 |
| Preparation Example 15 | J-15 | A-9 | 100 | F-1 | 3 | b-1 | 5 | c-1 | 10 | D-3 | 5.5 | E-1/E-2/E-3 | 3,240/1,400/30 |
| Comparative Preparation Example 17 | CJ-17 | A-9 | 100 | F-1 | 3 | — | — | c-1 | 10 | D-3 | 5.5 | E-1/E-2/E-3 | 3,240/1,400/30 |
| Preparation Example 16 | J-16 | A-10 | 100 | F-1 | 3 | b-1 | 5 | c-1 | 18 | D-2 | 4.5 | E-1/E-2/E-3 | 3,240/1,400/30 |
| Comparative Preparation Example 18 | CJ-18 | A-10 | 100 | F-1 | 3 | — | — | c-1 | 18 | D-2 | 4.5 | E-1/E-2/E-3 | 3,240/1,400/30 |

Formation of Resist Pattern

Example 1

The chemically amplified resist material (J-1) obtained in Preparation Example 1 was spin-coated onto a silicon wafer in "CLEAN TRACK ACT-8" available from Tokyo Electron Limited, and subjected to PB at 100° C. for 60 sec to form a resist film having an average film thickness of 50 nm. Subsequently, the resist film was irradiated with an electron beam using a simplified electron beam writer ("HL800D" available from Hitachi, Ltd., power: 50 KeV, current density: 5.0 ampere/cm$^2$) to permit patterning. After the irradiation with the electron beam for patterning, the following operation (a) or (b) was performed.

The developer solutions used in the development of the resist film in Examples and Comparative Examples are shown below.

P-1: butyl acetate
P-2: iso-propanol
P-3: 3-methylbutyl acetate
P-4: cyclohexanone
P-5: 2-heptanone
P-6: γ-butyrolactone
P-7: dibutyl ether
P-8: N,N-dimethylacetamide
P-9: ethyl lactate
P-10: propylene glycol monomethyl ether
P-11: ethanol
P-12: a mixed liquid of 2-heptanone and trioctylamine (mixture ratio=99: 1 (parts by mass))
P-13: anisole
CP-1: a 2.38% by mass aqueous tetramethylammonium hydroxide solution Operation (a): Without Floodwise Exposure Step Immediately after the irradiation with the electron beam, PEB was carried out at 110° C. for 60 sec in the CLEAN TRACK ACT-8. Then, a development was carried out according to the puddle procedure at 23° C. for 1 min using the (P-1) as the developer solution in the CLEAN TRACK ACT-8. Thereafter, the substrate was dried, whereby a negative resist pattern was formed.

Operation (b): With Floodwise Exposure Step

After the irradiation with the electron beam, the entire face of the resist film was exposed to an ultraviolet ray for 10 min using a black light lamp (Toshiba Corporation, 320 nm) with a light source of 1 mW/h in an ambient air. Immediately after the exposure to the ultraviolet ray, PEB was carried out at 110° C. for 60 sec in the CLEAN TRACK ACT-8. Then, a development was carried out according to the puddle procedure at 23° C. for 1 min using the (P-1) as the developer solution in the CLEAN TRACK ACT-8. Thereafter, the substrate was dried, whereby a negative resist pattern was formed.

Examples 2 to 16 and Comparative Examples 1 to 19

Resist patterns were formed by a similar operation to that for Example 1 except that the type of the chemically amplified resist material and developer solution used were as shown in Tables 4 and 5. Examples 2 to 16 and Comparative Example 1, 2 and 4 to 19 demonstrate the formation of a negative resist pattern, whereas Comparative Example 3 demonstrates the formation of a positive resist pattern.

Evaluations

The resist patterns formed in Examples and Comparative Examples described above were evaluated for the sensitivity, the nanoedge roughness and the film loss-inhibiting property according to the following procedure.

Sensitivity

An exposure dose at which a line and space pattern (1L 1S) configured with a line part having a line width of 150 nm and a space part formed by neighboring line parts with an interval of 150 nm was formed to give a line width of 1:1 was defined as "optimal exposure dose", and the "optimal exposure dose" was defined as "sensitivity" ($\mu C/cm^2$). The sensitivity was evaluated to be: "A (favorable)" in the case of no greater than 35 $\mu C/cm^2$; and "B (unfavorable)" in the case of greater than 35 $\mu C/cm^2$. Values and evaluation results of the sensitivity are shown in Tables 4 and 5.

Nanoedge Roughness

Figure 2:
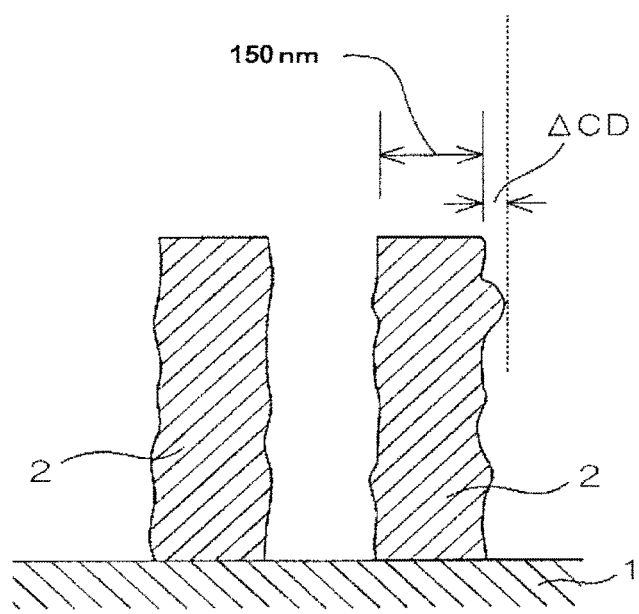
FIG. 2 shows a schematic cross sectional view illustrating the nanoedge roughness of the pattern.

The line patterns of the line and space pattern (1L 1S) were observed using a high-resolution FEB critical dimension measurement device (S-9220, available from Hitachi, Ltd.) at arbitrary twenty points on the line pattern. With respect to the points at which the observation was made, as shown in FIGS. 1 and 2, a difference "ΔCD" between an intended line width of 150 nm and a line width in an area in which irregularities generated along side lateral surface 2a of the line part (resist pattern) 2 of the pattern formed on the substrate (silicon wafer) 1 were most significant was measured. The average value of the ΔCD values of the twenty points was defined as "nanoedge roughness" (nm). The nanoedge roughness was evaluated to be: "AA (extremely favorable)" in the case of less than 13.0 nm; "A (favorable)" in the case of no less than 13.0 nm and no greater than 14.5 nm; and "B (unfavorable)" in the case of greater than 14.5 nm. It is to be noted that the irregularities shown in FIGS. 1 and 2 are exaggerated. Values and evaluation results of the nanoedge roughness are shown in Tables 4 and 5.

Film Loss-Inhibiting Property

A resist film having an average film thickness of 50 nm was formed according to the procedure described in Example 1, and this resist film was exposed in a region corresponding to the central area (2 cm×2 cm) of the silicon wafer using the same apparatus as that in Example 1 under the same conditions as those in Example 1. The exposure dose used was the optimum exposure dose in which the line and space pattern having a line width of 150 nm and an interval of 150 nm was formed as described above. After the exposure, PEB was carried out at 110° C. for 60 sec, and the operation (a) or (b) was further carried out. The film thickness of the remaining coating film on the resist pattern obtained after the completion of the operation (a) or (b) was measured using a spectroscopic film thickness measurement system ("Lambda Ace" available from Dainippon Screen Mfg. Co., Ltd.), and a value obtained by subtract the film thickness of the remaining coating film from the initial film thickness (50 nm) was defined as an amount of the film loss, which was designated as an indicator of the film loss-inhibiting property. The film loss-inhibiting property was evaluated to be: "A (favorable)" in the case of less than 20 nm; and "B (unfavorable)" in the case of no less than 20 nm. Values and evaluation results of the film loss-inhibiting property are shown in Tables 4 and 5. It is to be noted that the film loss-inhibiting property of the pattern of Comparative Example 3, which was a positive resist pattern, was not evaluated, and thus indicated by a symbol "-" in Tables 4 and 5.

TABLE 4

| | Chemically amplified resist material | Developer solution | Results of evaluations of operation (a) | | | | | | Results of evaluations of operation (b) | | | | | |
|---|---|---|---|---|---|---|---|---|---|---|---|---|---|---|
| | | | sensitivity | | nanoedge roughness | | film loss-inhibiting property | | sensitivity | | nanoedge roughness | | film loss-inhibiting property | |
| | | | value ($\mu C/cm^2$) | evaluation | value (nm) | evaluation | value (nm) | evaluation | value ($\mu C/cm^2$) | evaluation | value (nm) | evaluation | value (nm) | evaluation |
| Example 1 | J-1 | P-1 | 59 | B | 14.2 | A | 5 | A | 34 | A | 14.0 | A | 6 | A |
| Comparative Example 1 | CJ-1 | P-1 | 60 | B | 14.3 | A | 5 | A | 42 | B | 14.9 | B | 6 | A |
| Comparative Example 2 | CJ-2 | P-1 | 61 | B | 14.4 | A | 4 | A | 59 | B | 14.5 | A | 4 | A |
| Comparative Example 3 | J-1 | CP-1 | 70 | B | 16.8 | B | — | — | 49 | B | 16.7 | B | — | — |
| Example 2 | J-2 | P-2 | 62 | B | 13.2 | A | 10 | A | 29 | A | 12.9 | AA | 12 | A |
| Comparative Example 4 | CJ-3 | P-2 | 61 | B | 13.2 | A | 10 | A | 38 | B | 13.5 | A | 12 | A |
| Comparative Example 5 | CJ-4 | P-2 | 63 | B | 13.5 | A | 9 | A | 62 | B | 13.2 | A | 11 | A |

TABLE 4-continued

| | Chemically amplified resist material | Developer solution | Results of evaluations of operation (a) | | | | | | Results of evaluations of operation (b) | | | | | |
|---|---|---|---|---|---|---|---|---|---|---|---|---|---|---|
| | | | sensitivity | | nanoedge roughness | | film loss-inhibiting property | | sensitivity | | nanoedge roughness | | film loss-inhibiting property | |
| | | | value (μC/cm²) | evaluation | value (nm) | evaluation | value (nm) | evaluation | value (μC/cm²) | evaluation | value (nm) | evaluation | value (nm) | evaluation |
| Example 3 | J-3 | P-3 | 63 | B | 13.5 | A | 6 | A | 28 | A | 14.1 | A | 7 | A |
| Comparative Example 6 | CJ-5 | P-3 | 63 | B | 13.6 | A | 7 | A | 61 | B | 14.2 | A | 6 | A |
| Example 4 | J-4 | P-4 | 51 | B | 14.4 | A | 7 | A | 23 | A | 14.3 | A | 8 | A |
| Comparative Example 7 | CJ-6 | P-4 | 52 | B | 14.8 | B | 8 | A | 51 | B | 14.7 | B | 9 | A |
| Example 5 | J-5 | P-5 | 65 | B | 14.2 | A | 5 | A | 32 | A | 14.3 | A | 6 | A |
| Comparative Example 8 | CJ-7 | P-5 | 65 | B | 14.3 | A | 4 | A | 63 | B | 14.2 | A | 6 | A |
| Example 6 | J-6 | P-6 | 73 | B | 14.3 | A | 6 | A | 31 | A | 14.4 | A | 5 | A |
| Comparative Example 9 | CJ-8 | P-6 | 72 | B | 14.2 | A | 5 | A | 70 | B | 14.3 | A | 5 | A |
| Example 7 | J-7 | P-7 | 65 | B | 13.2 | A | 12 | A | 34 | A | 13.5 | A | 12 | A |
| Comparative Example 10 | CJ-9 | P-7 | 67 | B | 12.9 | AA | 13 | A | 65 | B | 13.0 | A | 11 | A |
| Example 8 | J-8 | P-8 | 62 | B | 14.3 | A | 9 | A | 32 | A | 14.5 | A | 9 | A |
| Comparative Example 11 | CJ-10 | P-8 | 61 | B | 14.2 | A | 8 | A | 59 | B | 14.5 | A | 10 | A |

TABLE 5

| | Chemically amplified resist material | Developer solution | Results of evaluations of operation (a) | | | | | | Results of evaluations of operation (b) | | | | | |
|---|---|---|---|---|---|---|---|---|---|---|---|---|---|---|
| | | | sensitivity | | nanoedge roughness | | film loss-inhibiting property | | sensitivity | | nanoedge roughness | | film loss-inhibiting property | |
| | | | value (μC/cm²) | evaluation | value (nm) | evaluation | value (nm) | evaluation | value (μC/cm²) | evaluation | value (nm) | evaluation | value (nm) | evaluation |
| Example 9 | J-9 | P-1 | 64 | B | 12.7 | AA | 8 | A | 33 | A | 13.0 | A | 9 | A |
| Comparative Example 12 | CJ-11 | P-1 | 64 | B | 12.9 | AA | 7 | A | 62 | B | 13.3 | A | 9 | A |
| Example 10 | J-10 | P-9 | 72 | B | 12.6 | AA | 17 | A | 35 | A | 13.2 | A | 16 | A |
| Comparative Example 13 | CJ-12 | P-9 | 72 | B | 12.7 | AA | 18 | A | 70 | B | 13.0 | A | 17 | A |
| Example 11 | J-11 | P-10 | 60 | B | 13.5 | A | 7 | A | 32 | A | 13.4 | A | 7 | A |
| Comparative Example 14 | CJ-13 | P-10 | 59 | B | 13.2 | A | 8 | A | 59 | B | 13.0 | A | 7 | A |
| Example 12 | J-12 | P-11 | 65 | B | 13.2 | A | 10 | A | 34 | A | 13.6 | A | 11 | A |
| Comparative Example 15 | CJ-14 | P-11 | 66 | B | 13.3 | A | 11 | A | 64 | B | 13.2 | A | 12 | A |
| Example 13 | J-13 | P-12 | 56 | B | 14.3 | A | 7 | A | 32 | A | 14.4 | A | 8 | A |
| Comparative Example 16 | CJ-15 | P-12 | 56 | B | 14.4 | A | 9 | A | 55 | B | 14.4 | A | 8 | A |
| Example 14 | J-14 | P-13 | 54 | B | 14.4 | A | 6 | A | 31 | A | 14.4 | A | 6 | A |
| Comparative Example 17 | CJ-16 | P-13 | 54 | B | 14.7 | B | 5 | A | 53 | B | 14.5 | A | 7 | A |
| Example 15 | J-15 | P-1 | 79 | B | 12.0 | AA | 17 | A | 35 | A | 12.5 | AA | 16 | A |
| Comparative Example 18 | CJ-17 | P-1 | 78 | B | 11.9 | AA | 16 | A | 77 | B | 12.2 | AA | 15 | A |
| Example 16 | J-16 | P-1 | 55 | B | 13.4 | A | 23 | B | 26 | A | 13.6 | A | 22 | B |
| Comparative Example 19 | CJ-18 | P-1 | 55 | B | 13.5 | A | 24 | B | 54 | B | 13.4 | A | 21 | B |

As shown in Tables 4 and 5, in all Examples in which the radiation-sensitive photosensitizer generating agent (b) contained the compound (B), and the developer solution contained the organic solvent as a principal component, the sensitivity in the operation (b) in which the floodwise exposure step was carried out was improved as compared with the sensitivity in the operation (a) in which the floodwise exposure step was not carried out. In addition, deterioration of the nanoedge roughness and the film loss-inhibiting property attributed to the floodwise exposure step was more insignificant.

On the other hand, in all of Comparative Examples 1, 2 and 4 to 19 in which the radiation-sensitive photosensitizer generating agent (b) did not contain the compound (B), and Comparative Example 3 in which the principal component of the developer solution was not the organic solvent, a significant improvement of the sensitivity in the operation (b) was not attained.

In particular, although the resist film was formed using the same chemically amplified resist material in Example 1 and Comparative Example 3, Example 1 in which the negative resist pattern was formed using the organic solvent achieved a greater degree of increase of the sensitivity in the floodwise exposure step as compared with Comparative Example 3 in which the positive resist pattern was formed by the development with an alkali.

As explained in the foregoing, according to the resist pattern-forming method of the embodiment, high levels of the sensitivity and the lithography performances can be exhibited in a case where a radioactive ray having a wavelength of no greater than 250 nm such as EUV light, an electron beam, an ion beam, a KrF excimer laser beam and an ArF excimer laser beam is used as the patterning exposure light. Thus, the resist pattern-forming method can be suitably used in photoresist processes in which a further progress of microfabrication will be expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A resist pattern-forming method comprising:
applying a chemically amplified resist material on a substrate to form a resist film on the substrate;
patternwise exposing the resist film to a radioactive ray having a wavelength of no greater than 250 nm;
floodwise exposing the resist film patternwise exposed, to a radioactive ray having a wavelength of greater than 250 nm;
baking the resist film floodwise exposed; and
developing the resist film baked with a developer solution comprising an organic solvent as a principal component,
wherein the chemically amplified resist material comprises:
a polymer component that is capable of being made insoluble in the developer solution by an action of an acid; and
a component that is capable of generating a radiation-sensitive sensitizer and an acid upon an exposure,
wherein the component comprises: a radiation-sensitive sensitizer generating agent; and at least one of a radiation-sensitive acid-and-sensitizer generating agent and a radiation-sensitive acid generating agent:
wherein
the radiation-sensitive acid-and-sensitizer generating agent is capable of generating, upon the exposure to the radioactive ray in the patternwise exposing of the resist film, an acid, and a radiation-sensitive sensitizer absorbing the radioactive ray in the floodwise exposing of the resist film, and substantially does not generate the acid and the radiation-sensitive sensitizer in the floodwise exposing of the resist film, in regions light-unexposed in the patternwise exposing of the resist film,
the radiation-sensitive sensitizer generating agent is capable of generating, upon the exposure to the radioactive ray in the patternwise exposing of the resist film, a radiation-sensitive sensitizer absorbing the radioactive ray in the floodwise exposing of the resist film, and substantially does not generate the radiation-sensitive sensitizer in the floodwise exposing of the resist film, in regions light-unexposed in the patternwise exposing of the resist film, and
the radiation-sensitive acid generating agent is capable of generating an acid upon the exposure to the radioactive ray in the patternwise exposing of the resist film, and substantially does not generate the acid in the floodwise exposing of the resist film, in regions light-unexposed in the patternwise exposing of the resist film,
wherein the radiation-sensitive sensitizer generating agent comprises a compound represented by formula (B):

wherein, in the formula (B),
$R^{B1}$ and $R^{B2}$ each independently represent a hydrogen atom, a phenyl group, a naphthyl group, an anthracenyl group, an alkoxy group having 1 to 5 carbon atoms, an alkylthio group having 1 to 5 carbon atoms, a phenoxy group, a naphthoxy group, an anthracenoxy group, an amino group, an amide group, a saturated or unsaturated linear, branched or cyclic hydrocarbon group having 1 to 30 carbon atoms, or a carbonyl group to which an alkyl group having 1 to 12 carbon atoms bonds, wherein a part or all of hydrogen atoms included in the phenyl group, the naphthyl group, the anthracenyl group, the alkoxy group, the alkylthio group, the phenoxy group, the naphthoxy group, the anthracenoxy group or the hydrocarbon group are unsubstituted or substituted, and wherein $R^{B1}$ and $R^{B2}$ optionally taken together represent a ring structure via a single bond or a double bond, or via a bond that includes —CH$_2$—, —O—, —S—, —SO$_2$—, —SO$_2$NH—, —C(=O)—, —C(=O)O—, —NHCO—, —NHC(=O)NH—, —CHR$^g$—, —CR$^g_2$—, —NH— or —NR$^g$— together with the carbon atom to which $R^{B1}$ and $R^{B2}$ bond, wherein R$^g$ represents an alky group having 1 to 5 carbon atoms; and
$R^{B3}$ and $R^{B4}$ represent a substituted or unsubstituted phenyl group, a halogen atom, or a saturated or unsaturated linear, branched or cyclic hydrocarbon group having 1 to 30 carbon atoms, or, optionally, at least two of carbon atoms included in the phenyl group or the hydrocarbon group bond with each other to form a ring structure together with —O—C—O— to which $R^{B3}$ and $R^{B4}$ bond.

2. The resist pattern-forming method according to claim 1, wherein the polymer component comprises a first polymer having a structural unit that comprises a group that is capable of generating a polar group through dissociation of an acid-labile group by an action of the acid.

3. The resist pattern-forming method according to claim 1, wherein the component is different from the polymer component.

4. The resist pattern-forming method according to claim 3, wherein a content of the component with respect to total solid content of the chemically amplified resist material is no less than 10% by mass and no greater than 30% by mass.

5. The resist pattern-forming method according to claim 2, wherein the component is incorporated into a part of the first polymer.

6. The resist pattern-forming method according to claim 2, wherein the developer solution used in the development further comprises a first compound that gives an ionic bond, a hydrogen bond, a covalent bond, a coordinate bond, a dipole-dipole interaction or a combination thereof with a polar group generated in the first polymer.

7. The resist pattern-forming method according to claim 6, wherein the first compound is a nitrogen-containing compound, an onium salt, an onium salt-comprising polymer, a basic polymer, a phosphorus compound or a combination thereof.

8. The resist pattern-forming method according to claim 1, wherein the radioactive ray in the patternwise exposing of the resist film is an extreme ultraviolet ray or an electron beam.

9. The resist pattern-forming method according to claim 1, further comprising, before the forming of the resist film, forming an organic underlayer film directly or indirectly on a face of the substrate on which the resist film is to be formed.

10. The resist pattern-forming method according to claim 9, further comprising, after the forming of the organic underlayer film and before the forming of the resist film, forming a silicon-containing film directly or indirectly on a face of the organic underlayer film on which the resist film is to be formed.

* * * * *